(12) United States Patent
Yokogawa et al.

(10) Patent No.: US 11,101,305 B2
(45) Date of Patent: Aug. 24, 2021

(54) IMAGING ELEMENT AND ELECTRONIC DEVICE

(71) Applicant: Sony Semiconductor Solutions Corporation, Kanagawa (JP)

(72) Inventors: Sozo Yokogawa, Kanagawa (JP); Mikinori Ito, Kanagawa (JP); Itaru Oshiyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 70 days.

(21) Appl. No.: 16/341,974

(22) PCT Filed: Oct. 13, 2017

(86) PCT No.: PCT/JP2017/037119
§ 371 (c)(1),
(2) Date: Apr. 15, 2019

(87) PCT Pub. No.: WO2018/079296
PCT Pub. Date: May 3, 2018

(65) Prior Publication Data
US 2019/0244992 A1 Aug. 8, 2019

(30) Foreign Application Priority Data
Oct. 27, 2016 (JP) .............................. JP2016-210295

(51) Int. Cl.
*H01L 27/146* (2006.01)
*H04N 5/374* (2011.01)
(52) U.S. Cl.
CPC ...... *H01L 27/14612* (2013.01); *H01L 27/146* (2013.01); *H01L 27/1462* (2013.01);
(Continued)
(58) Field of Classification Search
None
See application file for complete search history.

(56) References Cited

U.S. PATENT DOCUMENTS

2006/0086956 A1* 4/2006 Furukawa ......... H01L 27/14629
257/291
2008/0135963 A1* 6/2008 Akiyama .......... H01L 27/14603
257/432
(Continued)

FOREIGN PATENT DOCUMENTS

JP 7-74240 A 3/1995
JP 7-302890 A 11/1995
(Continued)

OTHER PUBLICATIONS

International Search Report and English translation thereof dated Nov. 14, 2017 in connection with International Application No. PCT/JP2017/037119.

*Primary Examiner* — Andres Munoz
(74) *Attorney, Agent, or Firm* — Wolf, Greenfield & Sacks, P.C.

(57) ABSTRACT

The present technology relates to an imaging element and an electronic device capable of improving sensitivity to infrared light in a back side irradiation imaging element.

An imaging element is provided with a semiconductor substrate on which a photoelectric converting unit is formed, a wiring layer arranged on a side opposite to a light receiving surface of the semiconductor substrate, and provided with a wire and a reflective film, and an insulating film stacked between the semiconductor substrate and the wiring layer, in which the reflective film is arranged between the insulating film and the wire and overlaps with at least a part of the photoelectric converting unit of each pixel in a first direction in which the semiconductor substrate and the wiring layer are stacked, and a first interlayer film between the insulating film and the reflective film is thicker than the insulating film. The present technology is applicable to a back side irradiation CMOS image sensor, for example.

18 Claims, 47 Drawing Sheets

(52) U.S. Cl.
CPC ...... *H01L 27/1463* (2013.01); *H01L 27/1464* (2013.01); *H01L 27/14603* (2013.01); *H01L 27/14605* (2013.01); *H01L 27/14621* (2013.01); *H01L 27/14629* (2013.01); *H01L 27/14641* (2013.01); *H04N 5/374* (2013.01); *H01L 27/14627* (2013.01)

(56) References Cited

U.S. PATENT DOCUMENTS

| | | | |
|---|---|---|---|
| 2009/0020842 A1* | 1/2009 | Shiau | H01L 21/76898 257/459 |
| 2009/0200586 A1* | 8/2009 | Mao | H01L 27/14643 257/292 |
| 2010/0096718 A1* | 4/2010 | Hynecek | H01L 27/14685 257/460 |
| 2010/0148290 A1 | 6/2010 | Park | |
| 2011/0049330 A1* | 3/2011 | Adkisson | H01L 27/14683 250/208.1 |
| 2011/0254115 A1* | 10/2011 | Shih | H01L 27/14685 257/432 |
| 2012/0261781 A1* | 10/2012 | Hsu | H01L 27/1464 257/432 |
| 2014/0035086 A1* | 2/2014 | Kato | H01L 27/14629 257/432 |
| 2014/0145287 A1* | 5/2014 | Kato | H01L 27/14625 257/432 |
| 2015/0028405 A1 | 1/2015 | Minami et al. | |
| 2017/0229503 A1 | 8/2017 | Suzuki et al. | |

FOREIGN PATENT DOCUMENTS

| | | |
|---|---|---|
| JP | 2003-152217 A | 5/2003 |
| JP | 2004-047682 A | 2/2004 |
| JP | 2006-261372 A | 9/2006 |
| JP | 2008-147333 A | 6/2008 |
| JP | 2010-118412 A | 5/2010 |
| JP | 2010-147474 A | 7/2010 |
| JP | 2013-062789 A | 4/2013 |
| JP | 2015-023259 A | 2/2015 |
| JP | 2015-026708 A | 2/2015 |
| JP | 2016-082133 A | 5/2016 |

* cited by examiner

FIG. 46
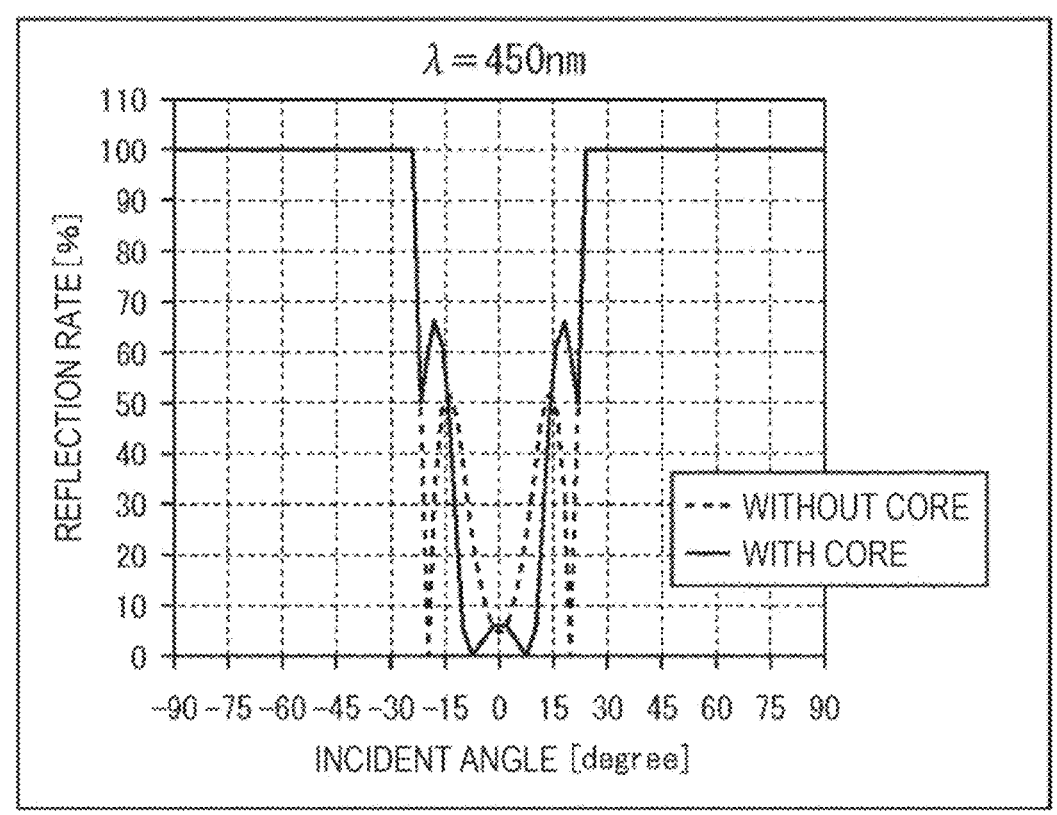
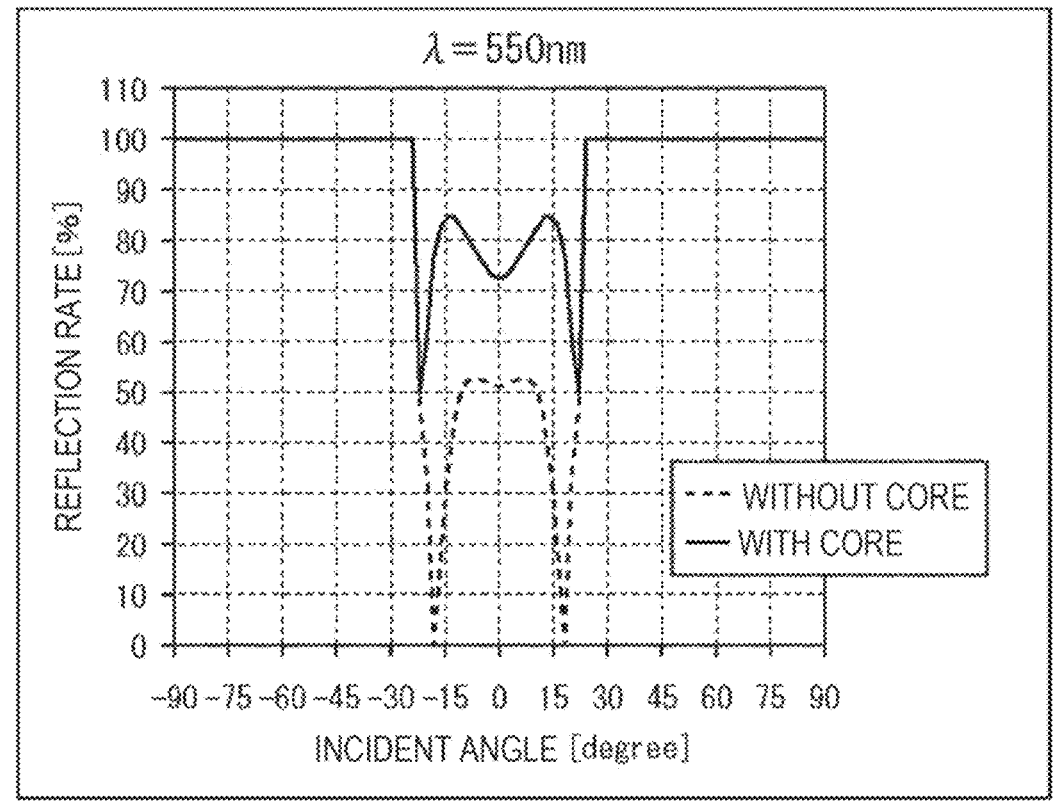

FIG. 47
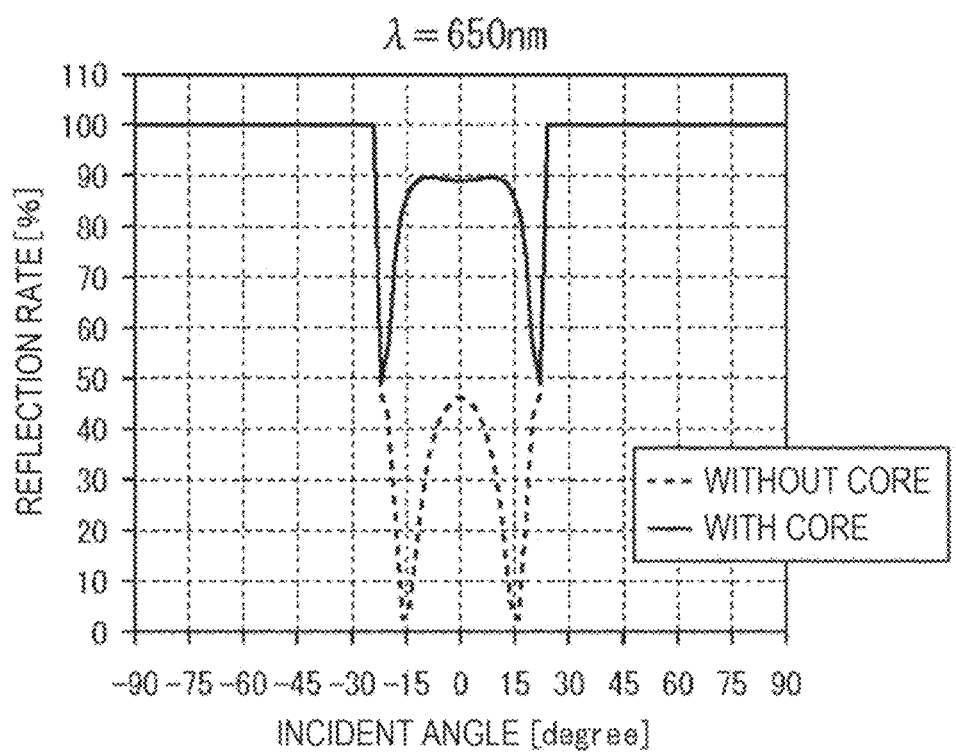
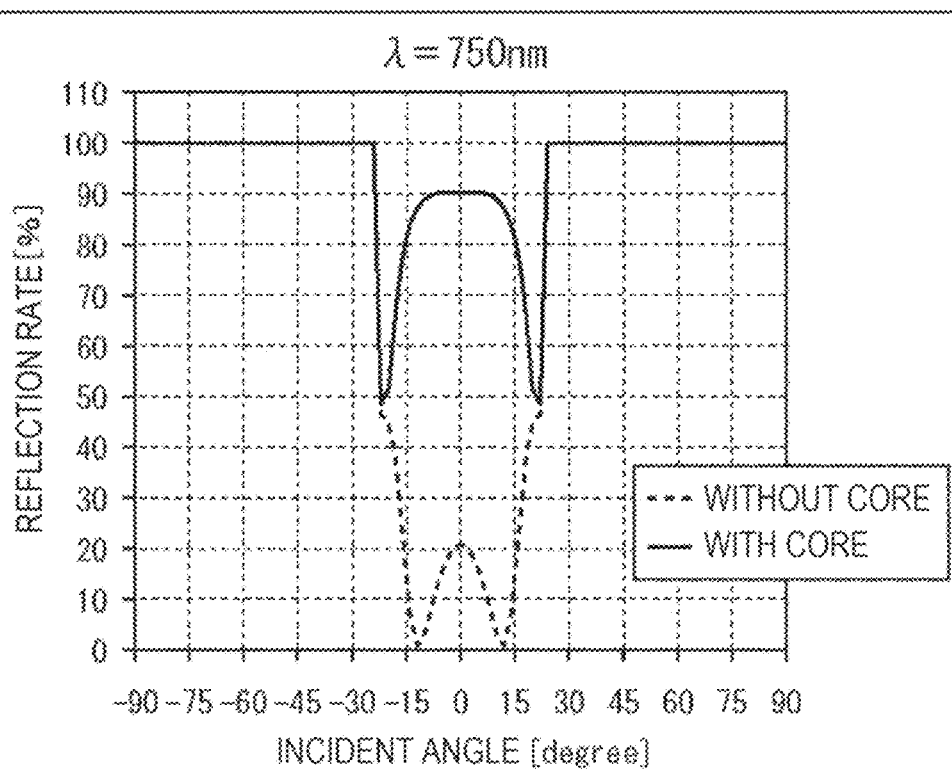

FIG. 48
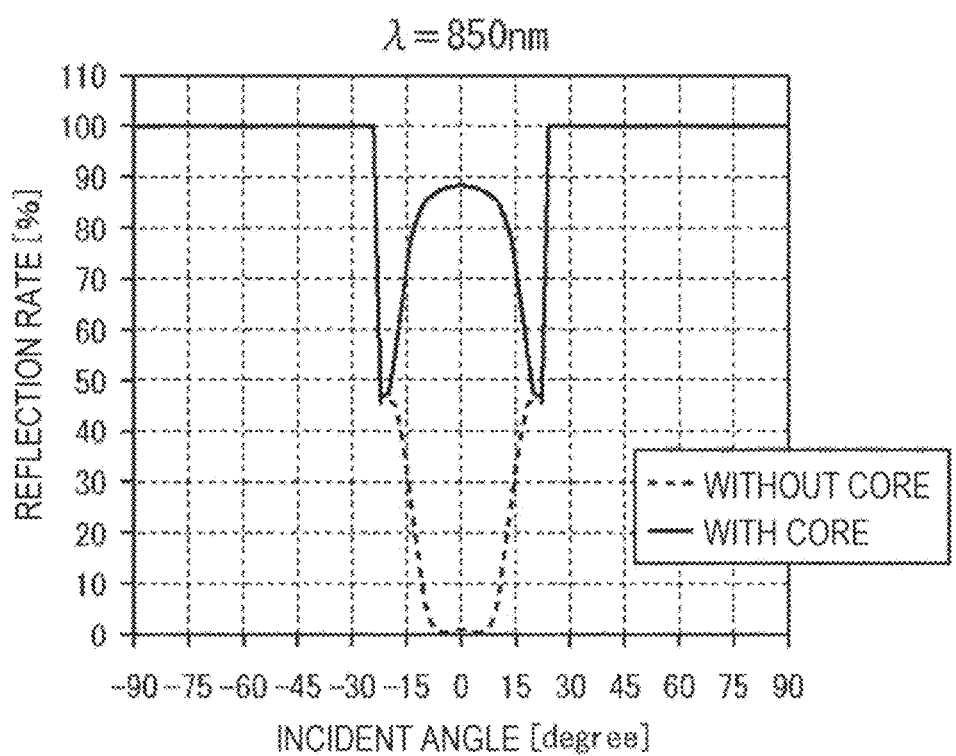
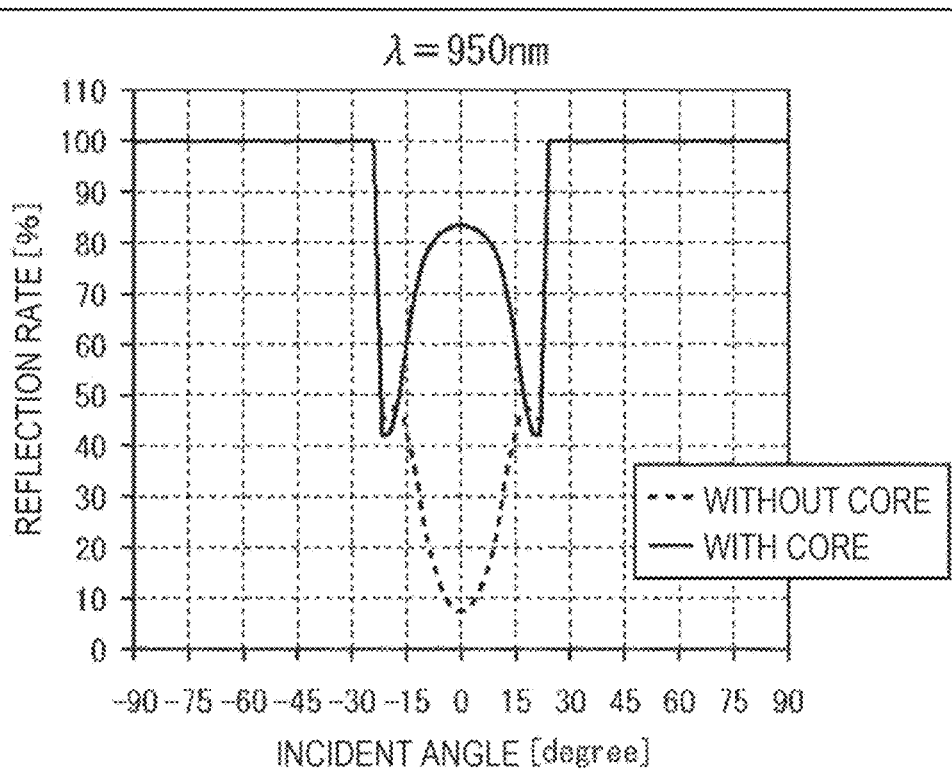

IMAGING ELEMENT AND ELECTRONIC DEVICE

CROSS-REFERENCE TO RELATED APPLICATIONS

This application claims the benefit under 35 U.S.C. § 371 as a U.S. National Stage Entry of International Application No. PCT/JP2017/037119, filed in the Japanese Patent Office as a Receiving Office on Oct. 13, 2017, entitled "IMAGING ELEMENT AND ELECTRONIC DEVICE," which claims priority under 35 U.S.C. § 119(a)-(d) or 35 U.S.C. § 365(b) to Japanese Patent Application Number JP2016-210295, filed in the Japanese Patent Office on Oct. 27, 2016, each of which is hereby incorporated by reference in its entirety.

TECHNICAL FIELD

The present technology relates to an imaging element and an electronic device, and especially relates to a back side irradiation imaging element and an electronic device using the back side irradiation imaging element.

BACKGROUND ART

In recent years, a back side irradiation CMOS image sensor is actively developed (refer to, for example, Patent Document 1).

CITATION LIST

Patent Document

Patent Document 1: Japanese Patent Application Laid-Open No. 2013-62789

SUMMARY OF THE INVENTION

Problems to be Solved by the Invention

However, in the back side irradiation CMOS image sensor, a semiconductor substrate on which a photodiode and the like is formed is thinner as compared with that of a front side irradiation CMOS image sensor. Therefore, while the back side irradiation CMOS image sensor has sufficient sensitivity to visible light, the sensitivity to infrared light longer in wavelength than visible light sometimes decreases.

The present technology is achieved in view of such a situation, and an object thereof is to improve the sensitivity to the infrared light in the back side irradiation imaging element.

Solutions to Problems

An imaging element according to a first aspect of the present technology is provided with a semiconductor substrate on which a photoelectric converting unit is formed, a wiring layer arranged on a side opposite to a light receiving surface of the semiconductor substrate, and provided with a wire and a reflective film, and an insulating film stacked between the semiconductor substrate and the wiring layer, in which the reflective film is arranged between the insulating film and the wire and overlaps with at least a part of the photoelectric converting unit of each pixel in a first direction in which the semiconductor substrate and the wiring layer are stacked, and a first interlayer film between the insulating film and the reflective film is thicker than the insulating film.

A thickness of the first interlayer film may be in a range of 80 nm to 200 nm, and a thickness of the reflective film may be in a range of 40 nm to 80 nm.

When a center wavelength of light reflected by the reflective film is set to $\lambda$, a refractive index of the first interlayer film is set to $n_A$, a refractive index of the reflective film is set to $n_B$, and i and j are integers of 0 or larger, a thickness of the first interlayer film may be set in the vicinity of $(2i+1)\lambda/4n_A$, and a thickness of the reflective film may be set in the vicinity of $(2j+1)\lambda/4n_B$.

The first interlayer film may include a silicon oxide film or a silicon nitride film as a main component, and the reflective film may include polysilicon, amorphous silicon, or single crystal silicon as a main component.

Two or more reflective films may be stacked through a second interlayer film.

A thickness of the first and second interlayer films may be in a range of 100 nm to 200 nm, and a thickness of the reflective film may be in a range of 80 nm to 100 nm.

When a center wavelength of light reflected by the reflective film is set to $\lambda$, a refractive index of the first interlayer film and the second interlayer film is set to $n_A$, a refractive index of the reflective film is set to $n_B$, and i and j are integers of 1 or larger, a thickness of the first and second interlayer films may be set in the vicinity of $(\lambda \times i)/4n_A$, and a thickness of the reflective film may be set in the vicinity of $(\lambda \times j)/4n_B$.

The first and second interlayer films may include silicon oxide, silicon nitride, TiO2, or HfO2 as a main component, and the reflective film may include polysilicon, amorphous silicon, single crystal silicon, TaO, TfO, silicon nitride, Ge, SiC, TiN, Ti, TiO2, or NgF2 as a main component.

The reflective film may be arranged in a position not overlapping with a gate electrode of a transistor formed on a surface on a side opposite to the light receiving surface of the semiconductor substrate in the first direction.

At least one of a shape, a size, or a position of the reflective film may be made different for each pixel.

At least one of the shape, the size, or the position of the reflective film may be adjusted corresponding to pupil correction.

The reflective film may be shared by a plurality of pixels.

Irregularities may be formed on a surface of the reflective film.

A trench-shaped pixel separating unit may be formed between pixels on the semiconductor substrate, and a core may be formed at a center of the pixel separating unit.

The core may include polysilicon, amorphous silicon, or single crystal silicon as a main component, and the core may be covered with a dielectric material including silicon oxide or silicon nitride as a main component.

A thickness of the core in a second direction in which the pixels are adjacent may be in a range of 50 nm to 200 nm, and a thickness of the dielectric material around the core in the second direction may be in a range of 50 nm to 200 nm.

An antireflective film is stacked on the light receiving surface of the semiconductor substrate, and when a center wavelength of light for which a reflection rate of the antireflective film is lowered is set to $\lambda$ and a refractive index of the antireflective film is set to n, a thickness of the antireflective film may be set in the vicinity of $\lambda/4n$.

A diffraction structure may be formed on the light receiving surface of the semiconductor substrate.

A center wavelength of light reflected by the reflective film may be 700 nm or longer.

An electronic device according to a second aspect of the present technology is provided with an imaging element, and a signal processing unit which processes a signal output from the imaging element, the imaging element including a semiconductor substrate on which a photoelectric converting unit is formed, a wiring layer arranged on a side opposite to a light receiving surface of the semiconductor substrate, and provided with a wire and a reflective film, and an insulating film stacked between the semiconductor substrate and the wiring layer, in which the reflective film is arranged between the insulating film and the wire and overlaps with at least a part of the photoelectric converting unit of each pixel in a first direction in which the semiconductor substrate and the wiring layer are stacked, and a first interlayer film between the insulating film and the reflective film is thicker than the insulating film.

In the first or second aspect of the present technology, the light transmitted through the semiconductor substrate is reflected by the reflective film.

Effects of the Invention

According to the first or second aspect of the present technology, the sensitivity to the infrared light is improved.

Note that, the effects herein described are not necessarily limited and may be any of the effects described in the present disclosure.

BRIEF DESCRIPTION OF DRAWINGS

FIG. 46 is a graph comparing the reflection characteristics in a case where the core is provided and in a case where the core is not provided.

FIG. 47 is a graph comparing the reflection characteristics in a case where the core is provided and in a case where the core is not provided.

FIG. 48 is a graph comparing the reflection characteristics in a case where the core is provided and in a case where the core is not provided.

MODE FOR CARRYING OUT THE INVENTION

Hereinafter, a mode for carrying out the invention (hereinafter referred to as an "embodiment") is described in detail with reference to the drawings. Note that, the description is given in the following order.

1. Configuration Example of Imaging Element
2. First Embodiment
3. Second embodiment (Example of Providing Reflective Film)
4. Third Embodiment (Example of Providing Diffraction Structure on Light Receiving Surface)
5. Fourth Embodiment (Example of Providing Diffraction Structure on Light Receiving Surface)
6. Fifth Embodiment (Example in Which Element Separating Unit Penetrates)
7. Sixth Embodiment (Example of Providing Diffraction Structure on Light Receiving Surface in Which Element Separating Unit Penetrates)
8. Seventh Embodiment (Example of Providing Diffraction Structure on Light Receiving Surface in Which Element Separating Unit Penetrates)
9. Eighth Embodiment (Example of Forming Irregularities on Reflective Film)
10. Ninth Embodiment (Example of Forming Irregularities on Reflective Film and Providing Diffraction Structure on Light Receiving Surface)
11. Tenth Embodiment (Example of Forming Irregularities on Reflective Film and Providing Diffraction Structure on Light Receiving Surface)
12. Eleventh embodiment (Example of Making Reflective Film Multilayer-Structure)
13. Twelfth Embodiment (Example of Making Reflective Film Multilayer-Structure and Providing Diffraction Structure on Light Receiving Surface)
14. Thirteenth Embodiment (Example of Making Reflective Film Multilayer-Structure and Providing Diffraction Structure on Light Receiving Surface)
15. Fourteenth Embodiment (Example of Making Reflective Film Multilayer-Structure in Which Element Separating Unit Penetrates)
16. Fifteenth Embodiment (Example of Making Reflective Film Multilayer-Structure and Providing Diffraction Structure on Light Receiving Surface in Which Element Separating Unit Penetrates)
17. Sixteenth Embodiment (Example of Making Reflective Film Multilayer-Structure and Providing Diffraction Structure on Light Receiving Surface in Which Element Separating Unit Penetrates)
18. Seventeenth Embodiment (Example of Providing Core in Element Separating Unit)
19. Eighteenth Embodiment (Example in which Element Separating Unit and Core Penetrate)
20. Variation
21. Usage Example of Solid-State Imaging Element 1. Configuration Example of Imaging Element First, with reference to FIG. 1 to FIG. 3, a configuration example of an imaging element to which the present technology is applied is described.

<System Configuration>

Figure 1:
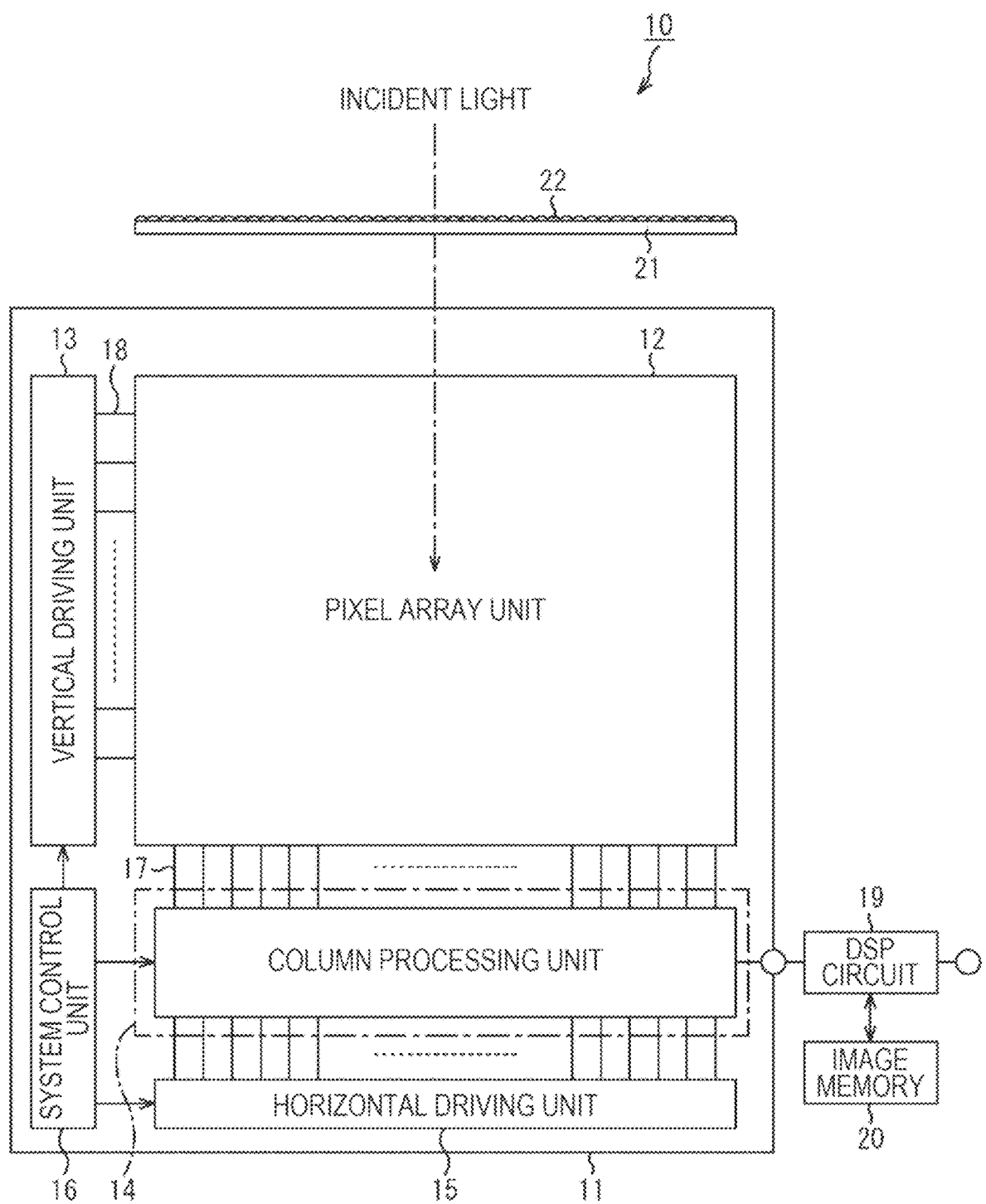
FIG. 1 is a view illustrating a configuration example of a CMOS image sensor to which the present technology is applied.

FIG. 1 is a system configuration diagram schematically illustrating a configuration of the imaging element to which the present technology is applied, for example, a CMOS image sensor being one type of an X-Y address type solid-state imaging element.

A CMOS image sensor 10 includes a pixel array unit 12 formed on a semiconductor substrate 11 and a peripheral circuit unit.

The peripheral circuit unit is provided with, for example, a vertical driving unit 13, a column processing unit 14, a horizontal driving unit 15, and a system control unit 16. Furthermore, the peripheral circuit unit is provided with a digital signal processor (DSP) circuit 19 configuring a signal processing system and an image memory 20. Note that, as described later with reference to FIG. 2, an entire peripheral circuit unit or a part thereof may be arranged on the same semiconductor substrate 11 on which the pixel array unit 12 is arranged, or may be arranged on a semiconductor substrate different from that of the pixel array unit 12.

Unit pixels (hereinafter also simply referred to as pixels) not illustrated each including a photoelectric conversion element which photoelectrically converts incident light to a charge amount corresponding to a light amount thereof are arranged in an array in the pixel array unit 12. Note that, a specific circuit configuration of the unit pixel is described later with reference to FIG. 3. A color filter array 21 is formed on a light receiving surface (light incident surface)

side of the pixel array unit 12, and an on-chip lens array 22 is arranged on the color filter array 21. In the pixel array unit 12, moreover, for a pixel array in matrix, a pixel driving line 18 is arranged in a right and left direction in the drawing (pixel array direction of pixel row/horizontal direction) for each row, and a vertical signal line 17 is formed in a top and bottom direction of the drawing (pixel array direction of pixel column/vertical direction).

One end of the pixel driving line 18 is connected to an output end corresponding to each row of the vertical driving unit 13. In FIG. 1, one pixel driving line 18 is illustrated for each pixel row, but two or more pixel driving lines 18 may be provided in each pixel row.

The vertical driving unit 13 is configured by a shift register, an address decoder and the like. Although a specific configuration is not herein illustrated, the vertical driving unit 13 includes a reading scanning system and a sweeping scanning system.

The reading scanning system sequentially performs selective scanning in units of row for unit pixels from which signals are read. On the other hand, the sweeping scanning system performs, on a read row on which the reading scanning is performed by the reading scanning system, sweeping scanning to sweep (reset) unnecessary charges from the photoelectric conversion elements of the unit pixels in the read row prior to the reading scanning by a time corresponding to a shutter speed. A so-called electronic shutter operation is performed by sweeping (resetting) the unnecessary charges by the sweeping scanning system. Here, the electronic shutter operation is intended to mean an operation of discharging an optical charge of the photoelectric conversion element and newly starting exposing (starting accumulating the optical charge). The signal read by the reading operation by the reading scanning system corresponds to the amount of light incident after the immediately preceding reading operation or the electronic shutter operation. Then, a period from a reading timing by the immediately preceding reading operation or a sweeping timing by the electronic shutter operation to the reading timing by the current reading operation is an optical charge accumulation time (exposure time) in the unit pixel.

Signals output from the unit pixels of the pixel row selectively scanned by the vertical driving unit 13 are supplied to the column processing unit 14 through the vertical signal lines 17.

For each pixel column of the pixel array unit 12, the column processing unit 14 performs signal processing determined in advance on an analog pixel signal output from each pixel of the selected row. The signal processing in the column processing unit 14 may include, for example, correlated double sampling (CDS) processing. The CDS processing is processing of taking in a reset level and a signal level output from each pixel of the selected row, obtaining signals of the pixels of one row by taking a level difference therebetween, and removing fixed pattern noise of the pixel. The column processing unit 14 may have an A/D converting function for digitizing the analog pixel signal.

The horizontal driving unit 15 configured by a shift register, an address decoder and the like sequentially performs selective scanning on a circuit portion corresponding to the pixel column of the column processing unit 14. By the selective scanning by the horizontal driving unit 15, the pixel signals subjected to the signal processing for each pixel column by the column processing unit 14 are sequentially externally output. In other words, the pixel signals corresponding to color coding (color array) of the color filter array 21 are directly output as RAW data (raw data).

The system control unit 16 receives an externally supplied clock, data indicating an operation mode and the like, and outputs data such as internal information of the CMOS image sensor 10. The system control unit 16 including a timing generator which generates various timing signals controls driving of the vertical driving unit 13, the column processing unit 14, the horizontal driving unit 15, and the like on the basis of various timing signals generated by the timing generator.

The DSP circuit 19 temporarily stores image data of one frame, for example, output from the column processing unit 14 in the image memory 20, and executes demosaic processing and the like on the basis of pixel information stored in the image memory 20. The demosaic processing is processing of complementing color information of a signal of each pixel having only monochrome color information by collecting insufficient color information from signals of peripheral pixels to provide to the same, thereby creating a full color image.

<Configuration Example of Chip>

Figure 2:
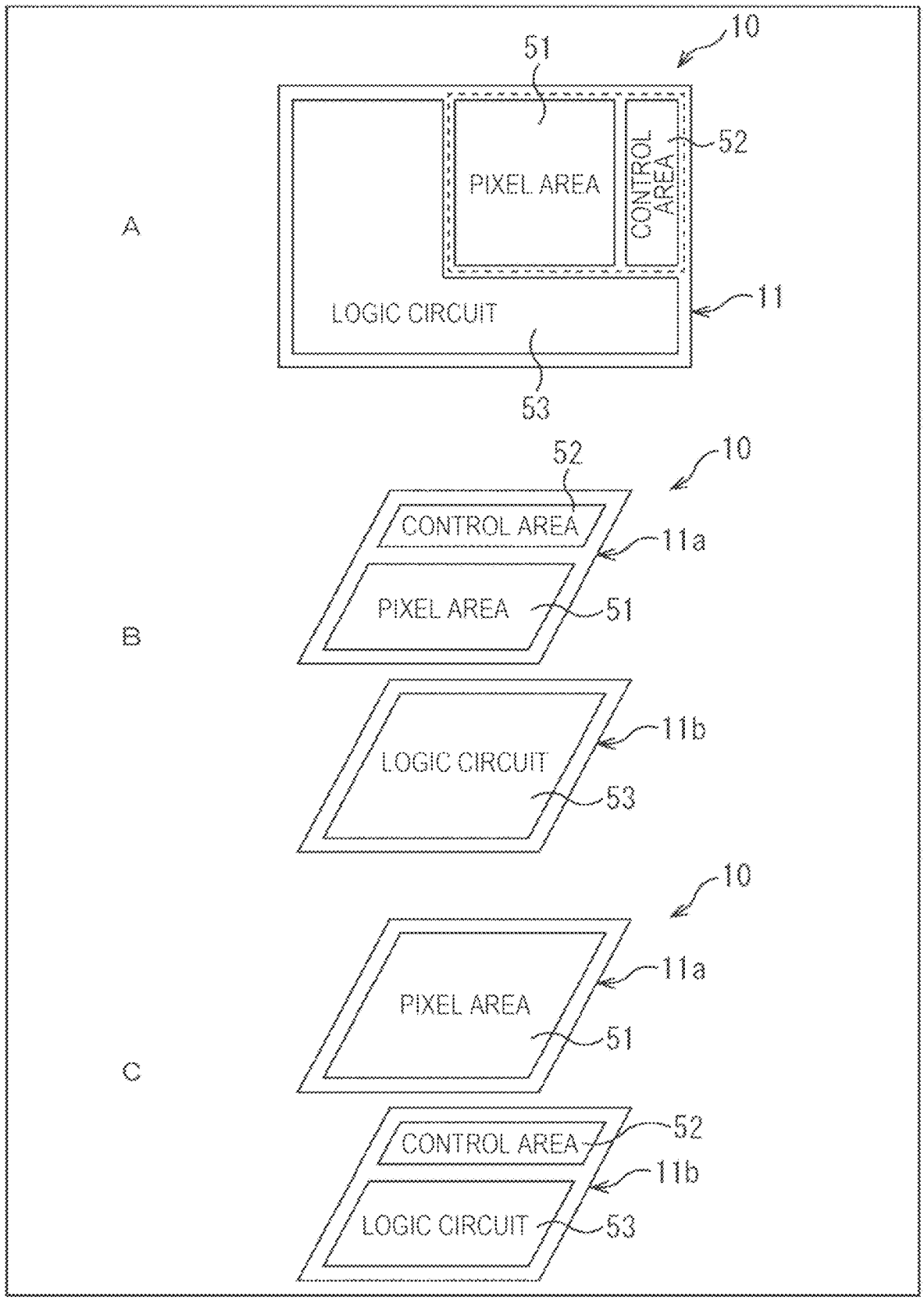
FIG. 2 is a view illustrating a configuration example of a chip on which the CMOS image sensor in FIG. 1 is mounted.

Next, with reference to FIG. 2, a configuration example of a chip on which the CMOS image sensor 10 is mounted is described. Note that a pixel area 51 in FIG. 2 includes, for example, the pixel array unit 12 in FIG. 1. A control area 52 includes, for example, the vertical driving unit 13, the column processing unit 14, the horizontal driving unit 15, and the system control unit 16 in FIG. 1. A logic circuit 53 includes, for example, the DSP circuit 19 and the image memory 20 in FIG. 1.

For example, as illustrated in A of FIG. 2, the CMOS image sensor 10 may be mounted on a semiconductor chip including one semiconductor substrate 11.

Alternatively, for example, as illustrated in B and C of FIG. 2, the CMOS image sensor 10 may be mounted on a semiconductor chip on which electrically connected two semiconductor substrates 11a and 11b are mounted. In the example in B of FIG. 2, the pixel area 51 and the control area 52 are provided in the semiconductor substrate 11a, and the logic circuit 53 is provided in the semiconductor substrate 11b. In the example in C of FIG. 2, the pixel area 51 is provided in the semiconductor substrate 11a, and the control circuit 52 and the logic circuit 53 are provided in the semiconductor substrate 11b.

<Circuit Configuration of Unit Pixel>

Figure 3:
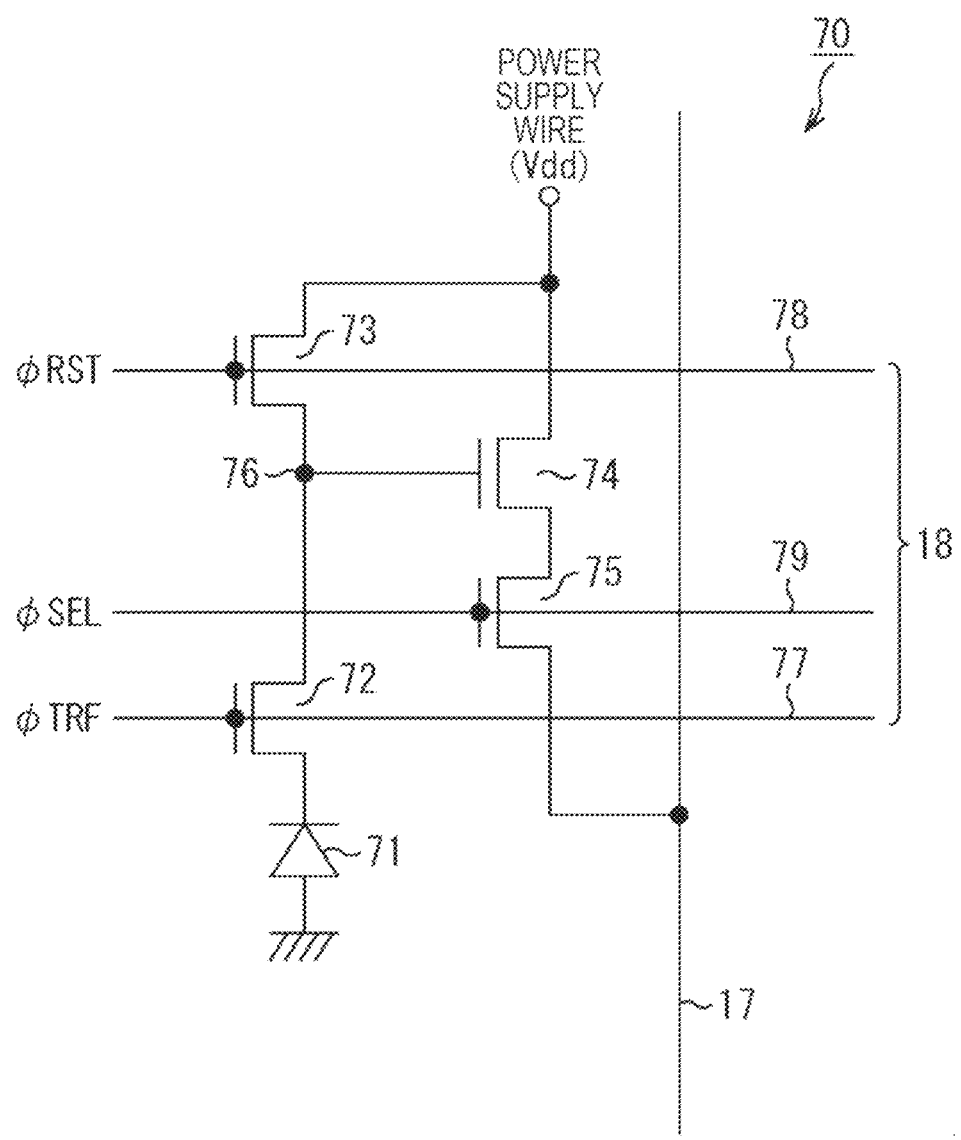
FIG. 3 is a circuit diagram illustrating a configuration example of a unit pixel of the CMOS image sensor in FIG. 1.

FIG. 3 is a circuit diagram illustrating an example of a circuit configuration of a unit pixel 70 arranged in the pixel array unit 12. The unit pixel 70 includes, for example, a photodiode 71 as a photoelectric conversion element, and four transistors including a transfer transistor 72, a reset transistor 73, an amplification transistor 74, and a selection transistor 75.

Here, an example in which N-channel MOS transistors are used as the transfer transistor 72, the reset transistor 73, the amplification transistor 74, and the selection transistor 75 is illustrated. However, a combination of conductivity types of the respective transistors herein exemplified is merely an example, and the combination is not limited thereto.

For this unit pixel 70, three driving wires, for example, a transfer line 77, a reset line 78, and a selection line 79, are commonly provided as the pixel driving line 18 for each pixel of the same pixel row. One end of each of the transfer line 77, the reset line 78, and the selection line 79 is connected to the output end corresponding to each pixel row of the vertical driving unit 13 in units of pixel row.

The photodiode 71 an anode electrode of which is connected to a negative side power supply (for example, ground) photoelectrically converts the received light into the optical charge (herein, photoelectron) of the charge amount corresponding to the amount of light. A cathode electrode of the photodiode 71 is electrically connected to a gate electrode of the amplification transistor 74 via the transfer transistor 72. A node 76 electrically connected to the gate electrode of the amplification transistor 74 is referred to as a floating diffusion (FD) unit.

The transfer transistor 72 is connected between the cathode electrode of the photodiode 71 and the FD unit 76. A transfer pulse φTRF in which a high level (for example, Vdd level) is active (hereinafter referred to as High active) is applied to a gate electrode of the transfer transistor 72 via the transfer line 77. When the transfer pulse φTRF is applied, the transfer transistor 72 is turned on and transfers the optical charge subjected to the photoelectric conversion by the photodiode 71 to the FD unit 76.

A drain electrode and a source electrode of the reset transistor 73 are connected to a pixel power supply Vdd and the FD unit 76, respectively. Prior to the transfer of the signal charge from the photodiode 71 to the FD unit 76, a High active reset pulse φRST is applied to a gate electrode of the reset transistor 73 via the reset line 78. When the reset pulse φRST is applied, the reset transistor 73 is turned on and discharges the charge of the FD unit 76 to the pixel power supply Vdd, thereby resetting the FD unit 76.

The gate electrode and a drain electrode of the amplification transistor 74 are connected to the FD unit 76 and the pixel power supply Vdd, respectively. Then, the amplification transistor 74 outputs potential of the FD unit 76 after being reset by the reset transistor 73 as a reset signal (reset level) Vreset. The amplification transistor 74 further outputs the potential of the FD unit 76 after transferring the signal charge by the transfer transistor 72 as a light accumulation signal (signal level) Vsig.

A drain electrode and a source electrode of the selection transistor 75 are connected to the source electrode of the amplification transistor 74 and the vertical signal line 17, respectively, for example. A High active selection pulse φSEL is applied to a gate electrode of the selection transistor 75 via the selection line 79. When the selection pulse φSEL is applied, the selection transistor 75 is turned on to put the unit pixel 70 into a selected state and relays the signal output from the amplification transistor 74 to the vertical signal line 17.

Note that the selection transistor 75 may also adopt a circuit configuration connected between the pixel power supply Vdd and the drain of the amplification transistor 74.

Furthermore, the unit pixel 70 is not limited to that of the pixel configuration including the four transistors configured as described above. For example, this may have the pixel configuration including three transistors in which the amplification transistor 74 doubles as the selection transistor 75, or the like, and the configuration of the pixel circuit is not limited.

2. First Embodiment

Next, a configuration of a CMOS image sensor 10*a* being a first embodiment of the CMOS image sensor 10 is described with reference to FIGS. 4 to 8.

Figure 4:
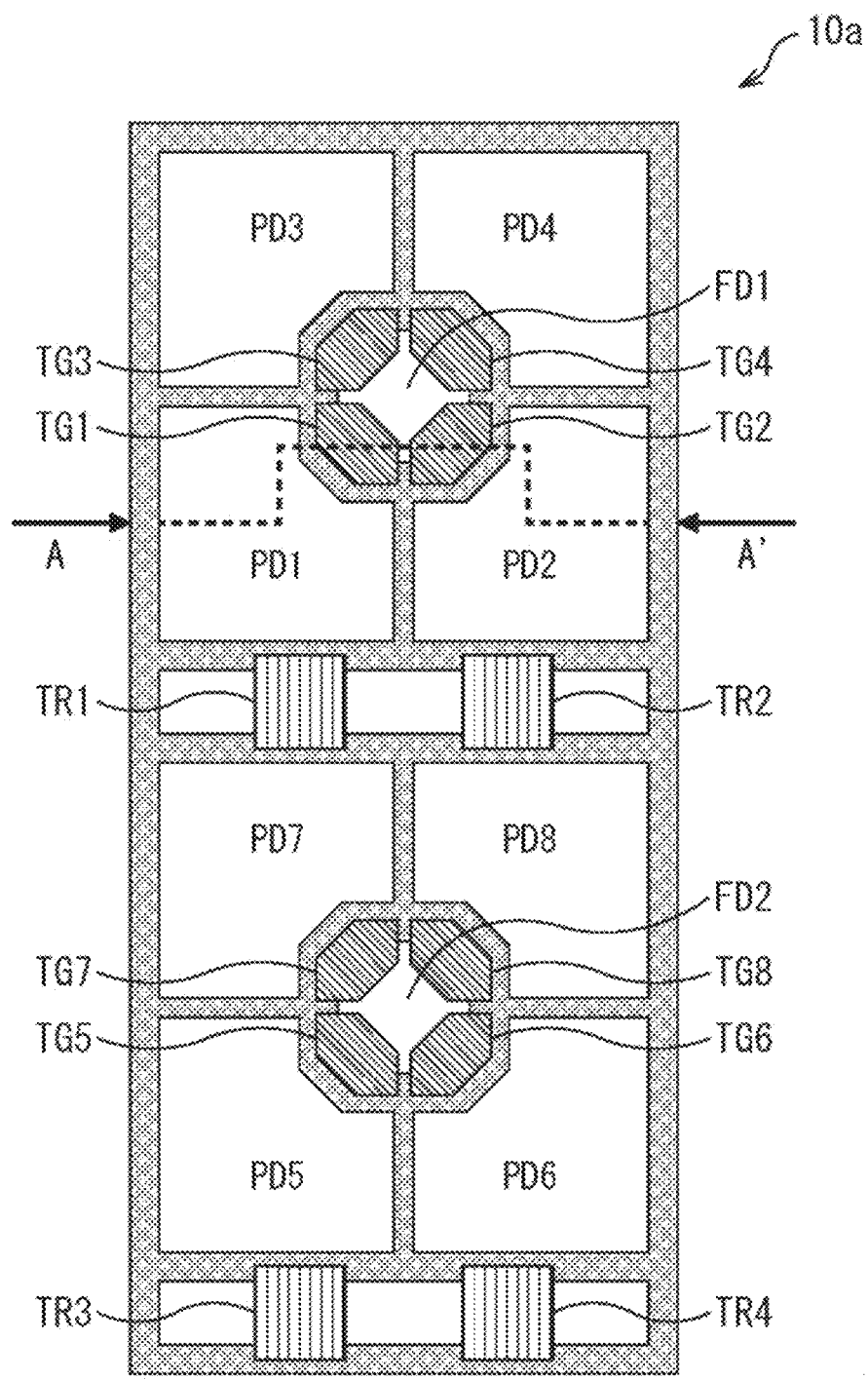
FIG. 4 is a plan view schematically illustrating an arrangement example of pixels of a first embodiment of the CMOS image sensor in FIG. 1.

FIG. 4 is a plan view illustrating an arrangement example of the pixels 70 in the pixel array unit 12 of the CMOS image sensor 10*a*. In this example, 2×4 pixels 70 form one unit (hereinafter referred to as a 2×4 pixel unit). Then, the 2×4 pixel units are two-dimensionally arranged in the pixel array unit 12.

Specifically, at the center of photodiodes PD1 to PD4 arranged in two rows×two columns, corresponding transfer transistors TG1 to TG4 are arranged. Furthermore, a FD unit FD1 is arranged at the center of the transfer transistors TG1 to TG4. Then, the four photodiodes PD1 to PD4 share one FD unit FD1.

Similarly, at the center of photodiodes PD5 to PD8 arranged in two rows×two columns, corresponding transfer transistors TG5 to TG8 are arranged. Furthermore, a FD unit FD2 is arranged at the center of the transfer transistors TG5 to TG8. Then, the four photodiodes PD5 to PD8 share one FD unit FD2.

Note that the photodiodes PD1 to PD8 correspond to the photodiode 71 in FIG. 3. The transfer transistors TG1 to TG8 correspond to the transfer transistor 72 in FIG. 3. The FD units FD1 and FD2 correspond to the FD unit 76 in FIG. 3.

Furthermore, a pixel transistor TR1 is arranged between the photodiode PD1 and the photodiode PD7. A pixel transistor TR2 is arranged between the photodiode PD2 and the photodiode PD8. A pixel transistor TR3 is arranged between the photodiode PD5 and a photodiode of a 2×4 pixel unit not illustrated which is adjacent in a vertical direction. A pixel transistor TR4 is arranged between the photodiode PD5 and a photodiode of a 2×4 pixel unit not illustrated which is adjacent in the vertical direction.

For example, the pixel transistor TR1 corresponds to the amplification transistor 74 in FIG. 3, and the pixel transistor TR2 corresponds to the selection transistor 75 in FIG. 3. Furthermore, for example, one of the pixel transistor TR3 and the pixel transistor TR4 corresponds to the reset transistor 73 in FIG. 3, and the other corresponds to the reset transistor 73 of the 2×4 pixel unit not illustrated adjacent in the vertical direction.

Note that, hereinafter, in a case where it is not necessary to distinguish the photodiodes PD1 to PD8 from one another, they are simply referred to as the photodiodes PD. Hereinafter, in a case where it is not necessary to distinguish the transfer transistors TG1 to TG8 from one another, they are simply referred to as the transfer transistors TG. In a case where it is not necessary to distinguish the pixel transistors TR1 to TR4 from one another, they are simply referred to as the pixel transistors TR.

Figure 5:
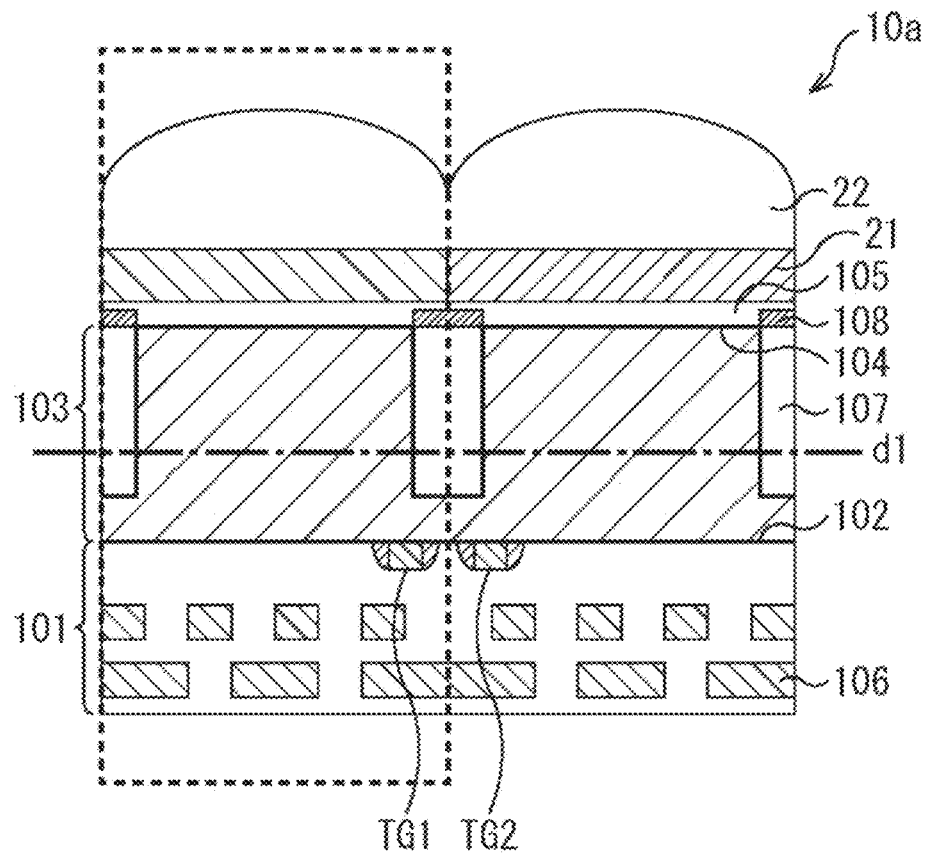
FIG. 5 is a cross-sectional view schematically illustrating a configuration example of the first embodiment of the CMOS image sensor in FIG. 1.

FIG. 5 is a schematic diagram of a cross-section of the CMOS image sensor 10*a* taken along a dotted line A-A' in FIG. 4 (A-A' cross-sectional view). Note that a portion enclosed by a dotted square in FIG. 5 corresponds to one unit pixel 70, and in FIG. 5, a configuration of two adjacent unit pixels 70 is illustrated.

In the CMOS image sensor 10*a*, a wiring layer 101, a gate insulating film 102, a light absorbing layer 103, an antireflective film 104, an interlayer insulating film 105, the color filter array 21, and the on-chip lens array 22 are stacked in this order from a lower side of the drawing. The CMOS image sensor 10*a* has a back side irradiation configuration in which the wiring layer 101 is stacked on a surface (hereinafter referred to as a bottom surface) opposite to a light receiving surface on which light is incident of the light absorbing layer 103.

In an interlayer film of the wiring layer 101, one or more metal wires 106 are provided. The interlayer film includes, for example, a dielectric material containing silicon oxide or silicon nitride as a main component.

The gate insulating film 102 is stacked on the bottom surface of the light absorbing layer 103. The gate insulating film 102 includes, for example, an oxide film, an oxynitride film, or a high-k film. A gate electrode of each transistor of the unit pixel 70 is formed on the bottom surface of the light absorbing layer 103 via the gate insulating film 102. Note that, in FIG. 5, gate electrodes of the transfer transistor TG1 and the transfer transistor TG2 are illustrated.

The light absorbing layer 103 includes a semiconductor substrate (for example, a crystalline silicon substrate). In the light absorbing layer 103, the photodiode 71, the FD unit 76 (not illustrated) and the like are formed.

Furthermore, in the light absorbing layer 103, a trench-shaped element separating unit 107 extending from the light receiving surface is formed. The element separating unit 107 is filled with, for example, a dielectric material containing silicon oxide or silicon nitride as a main component.

Figure 6:
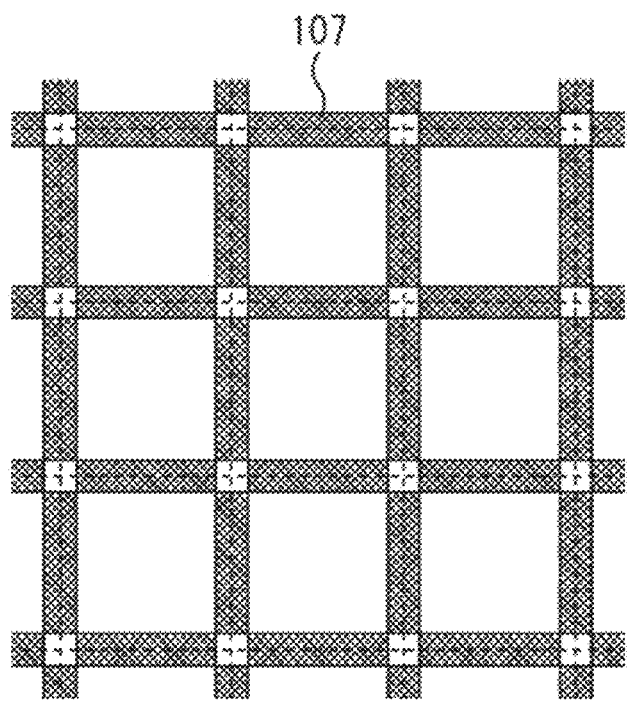
FIG. 6 is a view illustrating a first arrangement example of an element separating unit.
Figure 7:
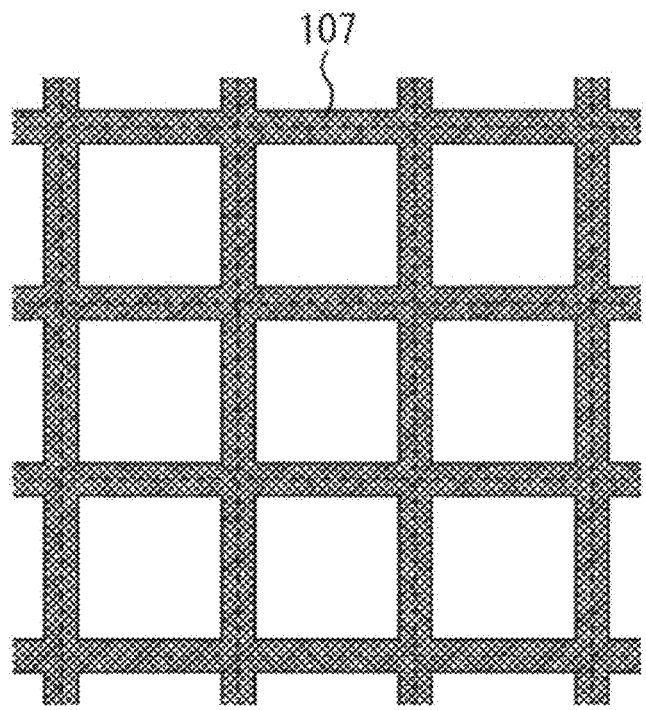
FIG. 7 is a view illustrating a second arrangement example of the element separating unit.

FIGS. 6 and 7 schematically illustrate a cross-section of the CMOS image sensor 10a at a depth dl indicated by a dashed-dotted line in FIG. 5. Note that a rectangular area enclosed by a dotted line in FIGS. 6 and 7 indicates an area of each pixel 70. Furthermore, a hatched portion in FIGS. 6 and 7 indicates a position of the element separating unit 107. As illustrated in these examples, the element separating unit 107 is formed at a boundary between the adjacent pixels 70. Note that, in the example in FIG. 6, the element separating unit 107 is discontinuous at four corners of each pixel 70. On the other hand, in the example in FIG. 7, the element separating unit 107 is continuous at the four corners of each pixel 70 and is formed into a lattice shape.

Furthermore, on the light receiving surface of the light absorbing layer 103, a light shielding film 108 is formed. The light shielding film 108 is, for example, formed into a lattice shape at a boundary between the respective pixels 70 as is the case with the element separating unit 107 in FIG. 7.

The element separating unit 107 and the light shielding film 108 prevent light incident on the light absorbing layer 103 from leaking to the adjacent pixel 70.

The antireflective film 104 includes, for example, a high refractive index dielectric layer. The antireflective film 104 suppresses reduction in amount of the light incident on the light absorbing layer 103 by being reflected by the light receiving surface of the light absorbing layer 103. Furthermore, the antireflective film 104 covers not only the light receiving surface of the light absorbing layer 103 but also an inner wall and a bottom surface of the element separating unit 107, and also serves as a pinning film.

The interlayer insulating film 105 includes, for example, a dielectric layer of the same material as that of the interlayer film forming the wiring layer 101.

Note that, when refractive indices of the light absorbing layer 103, the antireflective film 104, and the interlayer insulating film 105 are set to n1, n2, and n3, respectively, n1>n2>n3 is satisfied.

Then, the light incident from an upper side of FIG. 5 is incident on the light absorbing layer 103 via the on-chip lens array 22, the color filter array 21, the interlayer insulating film 105, and the antireflective film 104. Then, the incident light is photoelectrically converted into the optical charge by the photodiode 71 (not illustrated) formed in the light absorbing layer 103.

Here, in the back side irradiation CMOS image sensor 10a, the light absorbing layer 103 becomes thinner as compared with that of a front side irradiation CMOS image sensor. As a result, as a component of the incident light has a longer wavelength, quantum efficiency of the light absorbing layer 103 decreases; for example, in the light absorbing layer 103, visible light is sufficiently absorbed but a rate of infrared light transmitted without being absorbed increases. As a result, in the CMOS image sensor 10a, although sensitivity to the visible light is sufficient, sensitivity to the infrared light having a longer wavelength than the visible light might decrease.

Furthermore, a part of the transmitted light which passes through the light absorbing layer 103 is reflected by the gate electrode of each transistor of the wiring layer 101, the metal wire 106, a contact (not illustrated) between the gate electrode and the metal wire 106, a via (not illustrated) between the metal wires 106 of the different layers, and the like, to be incident again on the light absorbing layer 103. At that time, since a configuration of a portion where the transmitted light is reflected in the wiring layer 101 is different among the pixels 70, a reflection characteristic with respect to the transmitted light varies among the pixels 70. Therefore, the amount of the reflected light reflected by the wiring layer 101 and is incident again on the light absorbing layer 103 varies among the pixels 70. As a result, since the transmitted light includes a lot of infrared light as described above, the sensitivity especially to the infrared light varies among the pixels 70.

Figure 8:
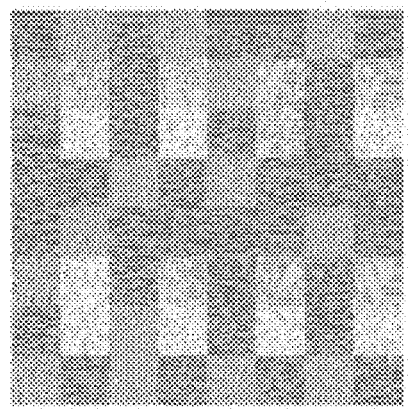
FIG. 8 is a schematic diagram illustrating an example of variation in sensitivity among pixels of the CMOS image sensor in FIG. 5.

For example, FIG. 8 schematically illustrates the variation in sensitivity of the pixels 70 when the infrared light having uniform wavelength and light amount is incident on the CMOS image sensor 10a. Each cell in FIG. 8 indicates the pixel 70, and color density of each cell indicates the light amount (brightness) detected by each pixel 70. Specifically, the lighter the color of the pixel, the larger the detected light amount (brighter), and the darker the color of the pixel, the smaller the detected light amount (darker). As illustrated in this example, even when the infrared light having uniform wavelength and light amount is incident on the CMOS image sensor 10a, unevenness in brightness such as a fixed pattern occurs due to the difference in sensitivity difference among the pixels 70.

3. Second Embodiment

Next, with reference to FIGS. 9 to 18, a CMOS image sensor 10b being a second embodiment of the CMOS image sensor 10 is described.

The CMOS image sensor 10b improves the reduction and variation in sensitivity to the infrared light of the CMOS image sensor 10a described above.

First, a configuration example of the CMOS image sensor 10b is described with reference to FIGS. 9 and 10. Note that, in FIGS. 9 and 10, the same reference sign is assigned to a part corresponding to that in FIGS. 4 and 5 and the description thereof is appropriately omitted.

The CMOS image sensor 10b differs from the CMOS image sensor 10a in that a reflective film is provided below each photodiode PD between a gate insulating film 102 of a wiring layer 101 and a metal wire 106. For example, in an example in FIG. 9, reflective films RM1 to the RM8 are provided for photodiodes PD1 to PD8, respectively.

The reflective films RM1 to RM8 include a thin film containing silicon such as polysilicon, amorphous silicon, or single crystal silicon, for example, as a main component. The reflective films RM1 to RM8 are set with shapes, sizes, and positions suitable for reflecting light transmitted without being absorbed by the photodiodes PD1 to PD8 as much as possible, and allowing the same to be incident again on the photodiodes PD1 to PD8, respectively.

For example, in this example, the reflective films RM1 to RM8 have symmetrical shapes in at least one of up and down or right and left direction, and the same sizes. Furthermore, for example, the reflective films RM1 to RM8 are arranged so as to overlap with at least a part of an opening (area in which a light shielding film 108 is not formed) of each pixel 70 of a light receiving surface of a light absorbing layer 103 and at least a part of a bottom surface of the photodiode PD in the same pixel 70 in a direction in which the wiring layer 101 and the light absorbing layer 103 are stacked (hereinafter, referred to as a depth direction). Moreover, for example, the reflective films RM1 to RM8 are arranged so as not to overlap with a gate electrode of a transistor of each pixel 70 in the depth direction. Furthermore, for example, the reflective films RM1 to RM8 are arranged with a predetermined distance from a bottom surface (more strictly, the gate insulating film 102) of the light absorbing layer 103.

Note that, hereinafter, in a case where it is not necessary to distinguish the reflective films RM1 to RM8 from one another, they are simply referred to as the reflective films RM.

Furthermore, for example, each reflective film RM is electrically connected to a ground.

Alternatively, for example, a negative bias voltage is applied to each reflective film RM for pinning enhancement. With this arrangement, generation of a white spot may be suppressed by increasing saturation electrons of the photodiode PD and enhancing surface pinning.

In this manner, by providing the reflective film RM below the photodiode PD of each pixel 70 in the wiring layer 101, the light transmitted through each photodiode PD is reflected and is incident on each photodiode PD again. As a result, even if the light absorbing layer 103 is not thickened, the sensitivity to the infrared light having a particularly high rate of transmission through the photodiode PD is improved.

Furthermore, by providing the reflective film RM for each pixel 70, a configuration of a portion where the transmitted light is reflected in the wiring layer 101 becomes substantially uniform in each pixel 70, and variation among the pixels 70 in reflection characteristic with respect to the transmitted light is suppressed. As a result, the variation in sensitivity to the infrared light among the pixels 70 is suppressed.

Figure 11:
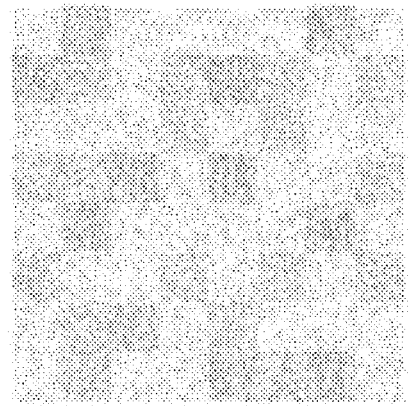
FIG. 11 is a schematic diagram illustrating an example of variation in sensitivity among pixels of the CMOS image sensor in FIG. 10.

FIG. 11 schematically illustrates the variation in sensitivity among the pixels 70 when the infrared light having uniform wavelength and light amount is incident on the CMOS image sensor 10b as in FIG. 8. Comparing FIG. 11 with FIG. 8, the sensitivity of each pixel 70 is improved as a whole, brightness is increased, and variation in brightness among the pixels 70 is suppressed.

Here, a thickness of an interlayer film (hereinafter, also referred to as a spacer) between the bottom surface of the light absorbing layer 103 (more strictly, the gate insulating film 102) and each reflective film RM, and a thickness of each reflective film RM are described. A thickness TA1 of the spacer and a thickness TB1 of each reflective film RM are set, for example, according to following equations (1) and (2).

$$TA1 = (2i+1)\lambda/4n_{A1} \quad (1)$$

$$TB1 = (2j+1)\lambda/4n_{B1} \quad (2)$$

i and j represent integers not smaller than 0.

λ represents a center wavelength of the light (electromagnetic wave) reflected by the reflective film RM. In other words, the center of a wavelength band of the light the sensitivity of which is desired to be improved by the reflective film RM is the center wavelength λ. Therefore, the sensitivity to the light having the wavelength in the vicinity of the center wavelength λ is particularly improved by the reflective film RM. For example, the center wavelength λ is set to 700 nm or longer. Alternatively, for example, the center wavelength λ is set within a range of 700 nm to 1100 nm. Alternatively, for example, the center wavelength λ is set within a range of 800 nm to 950 nm.

$n_{A1}$ represents a real part of a complex refractive index of the spacer. Note that the refractive index $n_{A1}$ is a value smaller than a refractive index of the light absorbing layer 103. For example, in a case where the spacer (interlayer film of the wiring layer 101) includes an insulating film containing silicon oxide or silicon nitride as a main component, the refractive index $n_{A1}$ is approximately 1.4 to 2.0. Then, for example, in a case where i=0 is satisfied in equation (1), the thickness TA1 of the spacer is approximately 80 nm to 200 nm within the range of the center wavelength λ of 700 nm to 1100 nm. Note that the thickness TA1 of the spacer is at least thicker than the gate insulating film 102.

$n_{B1}$ is a real part of a complex refractive index of the reflective film RM. Note that the refractive index $n_{B1}$ is a value larger than the refractive index $n_{A1}$ of the spacer. For example, in a case where the reflective film RM includes a thin film containing silicon as a main component, the refractive index $n_{B1}$ is approximately 3.5 to 4.0. Then, for example, in a case where j=0 is satisfied in equation (2), the thickness TB1 of the reflective film RM is approximately 40 nm to 80 nm within the range of the center wavelength λ of 700 nm to 1100 nm.

Figure 12:
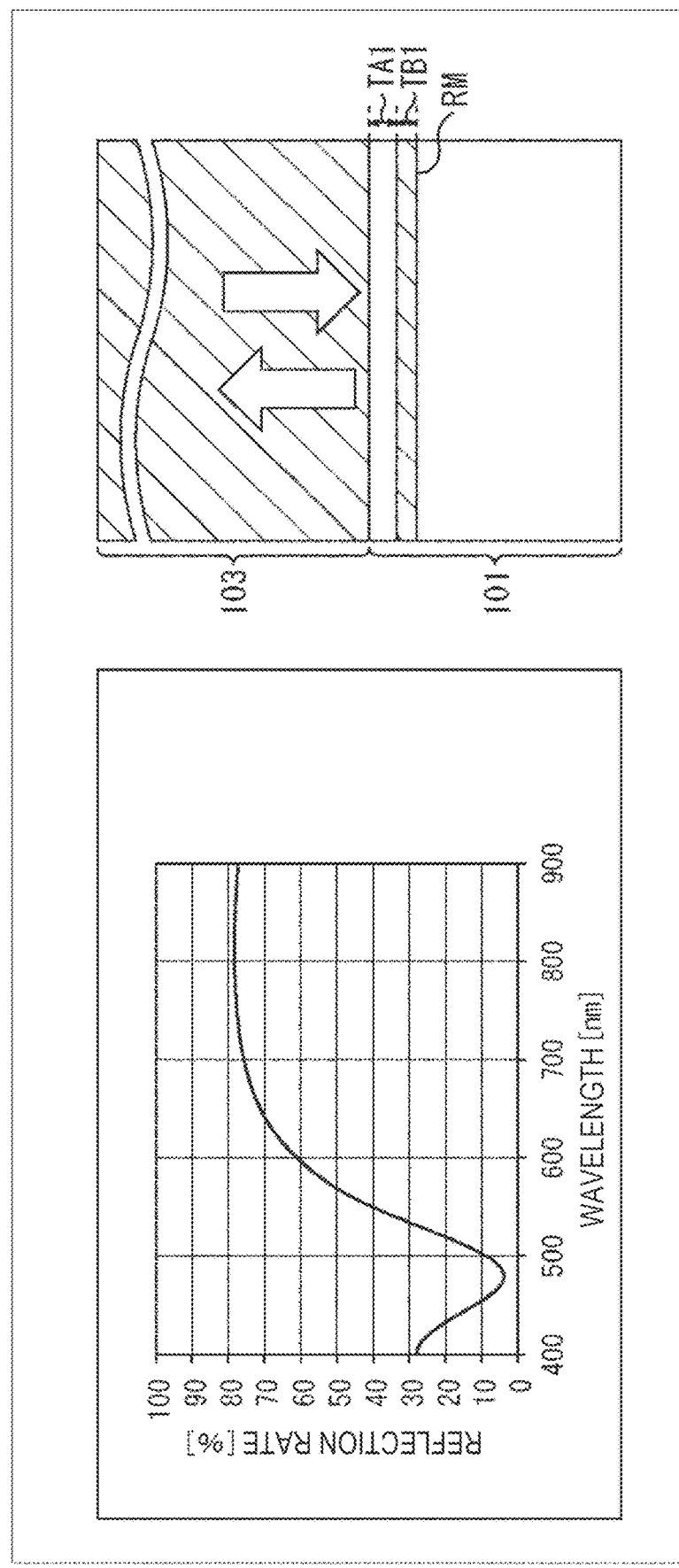
FIG. 12 is a graph illustrating an example of a reflection characteristic of a reflective film.

FIG. 12 illustrates an example of the reflection characteristic of the reflective film RM in a case where the thickness TA1 of the spacer between the reflective film RM and the light absorbing layer 103 is set to 150 nm and the thickness TB1 of the reflective film RM is set to 50 nm. Note that, in examples in FIGS. 12 to 15, the interlayer film of the wiring layer 101 includes silicon oxide and the light absorbing layer 103 and the reflective film RM include silicon.

A wavelength (nm) of the light incident on the reflective film RM is plotted along an abscissa axis of a graph on a left side in FIG. 12, and a reflection rate (%) is plotted along an ordinate axis.

In this example, the reflection rate of the reflective film RM is about 80% which is the maximum in the vicinity of 800 nm which is the wavelength band of the infrared light (near infrared light), and is about 4% which is the minimum in the vicinity of 480 nm which is the wavelength band of blue light.

Figure 13:
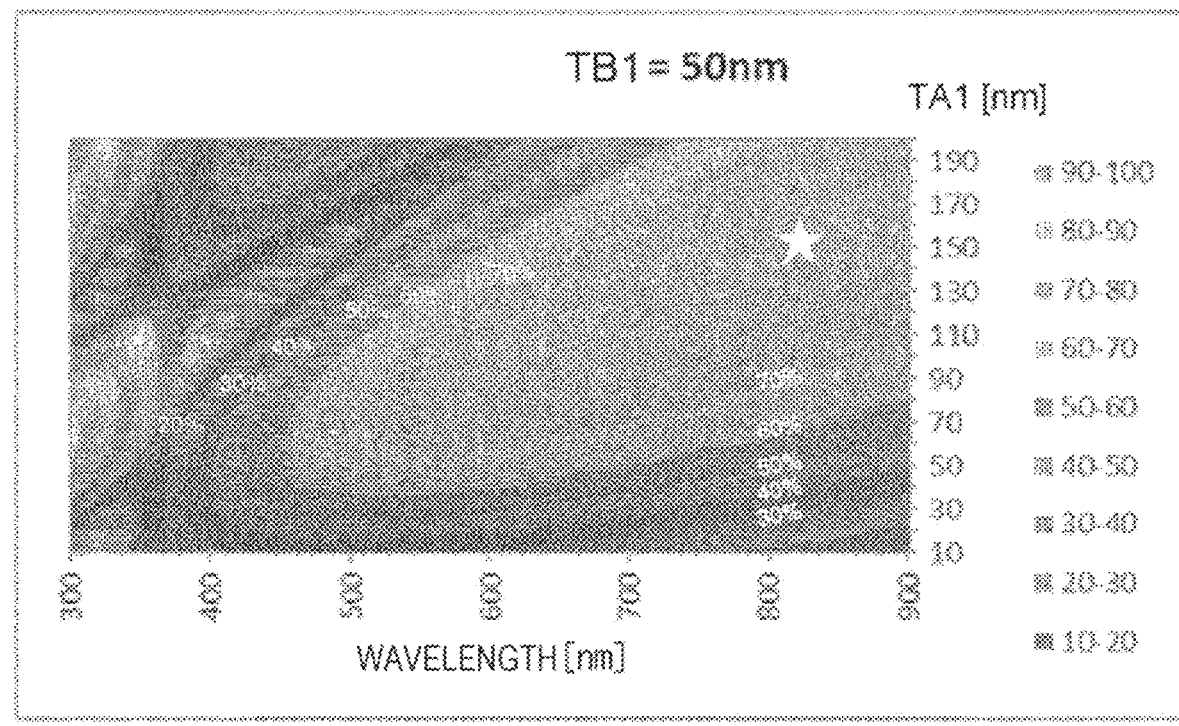
FIG. 13 is a graph illustrating an example of the reflection characteristic of the reflective film.
Figure 14:
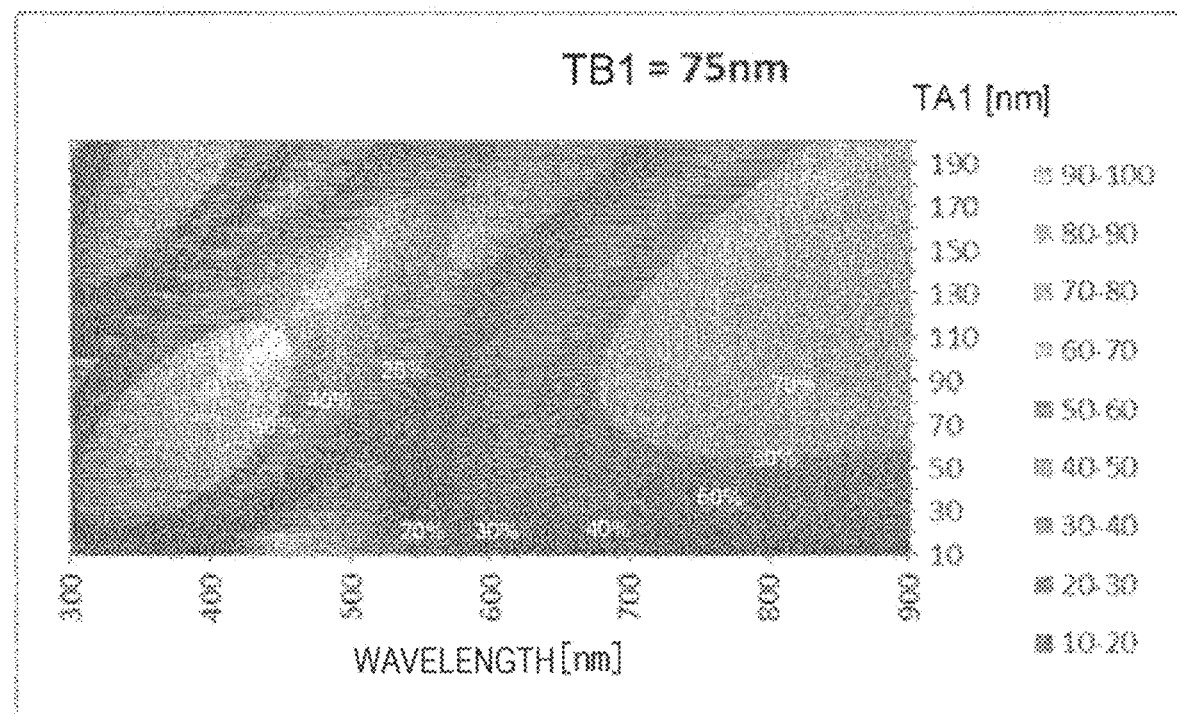
FIG. 14 is a graph illustrating an example of the reflection characteristic of the reflective film.
Figure 15:
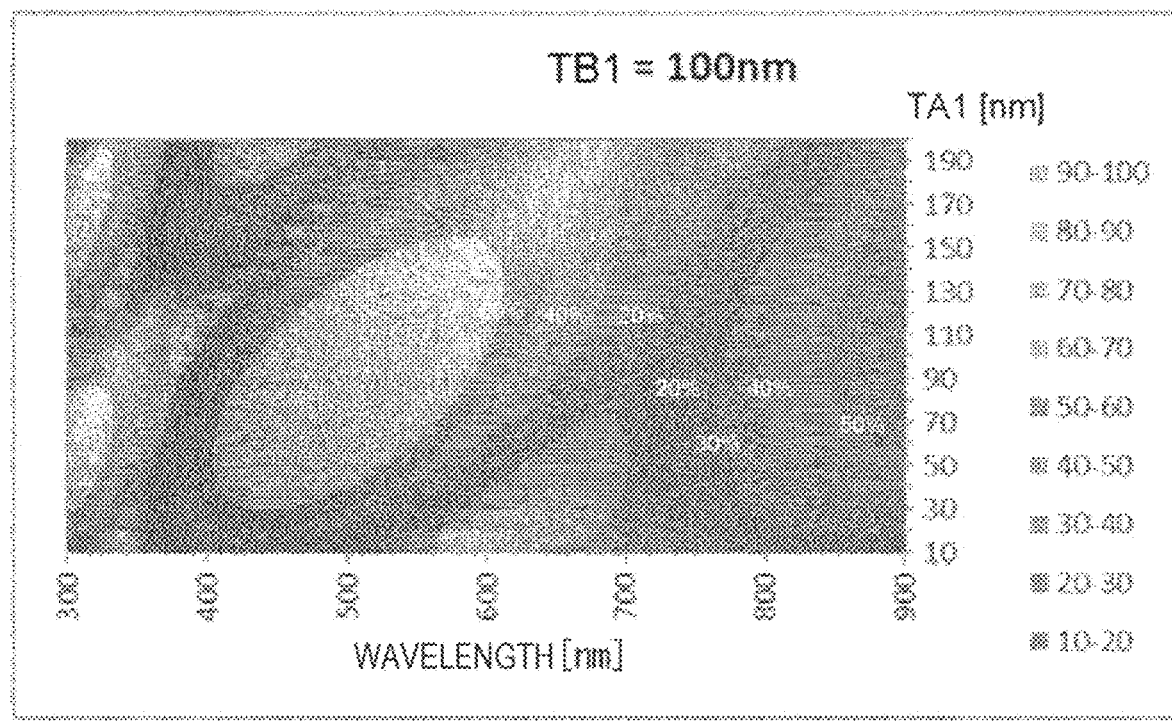
FIG. 15 is a graph illustrating an example of the reflection characteristic of the reflective film.

FIGS. 13 to 15 illustrate the examples of the reflection characteristic of the reflective film RM in a case where the thickness TA1 of the spacer and the thickness TB1 of the reflective film RM are changed. The wavelength (nm) of the light incident on the reflective film RM is plotted along an abscissa axis of each graph in FIGS. 13 to 15, and the thickness TA1 (nm) of the spacer is plotted along an ordinate axis. Furthermore, FIG. 13 illustrates the example of the reflection characteristic in a case where the thickness TB1 of the reflective film RM is 50 nm, FIG. 14 illustrates the example of the reflection characteristic in a case where the thickness TB1 of the reflective film RM is 75 nm, and FIG. 15 illustrates the example of the reflection characteristic in a case where the thickness TB1 of the reflective film RM is 100 nm.

As illustrated in this example, the reflection rate of the reflective film RM changes not only by the wavelength of the light but also by the thickness TA1 of the spacer and the thickness TB1 of the reflective film RM. Moreover, the reflection rate of the reflective film RM does not become high or low when the thickness TA1 of the spacer and the thickness TB1 of the reflective film RM are simply made thicker or thinner, and this periodically changes non linearly according to a relationship of the wavelength of the light, the thickness TA1 of the spacer, and the thickness TB1 of the reflective film RM.

For example, it is understood that the thickness TA1 of the spacer may be set in the vicinity of 150 nm as indicated by an asterisk in FIG. 13 in order to maximize the reflection rate for the light having the wavelength in the vicinity of 800 nm, in a case where the thickness TB1 of the reflective film RM is 50 nm.

In this manner, by appropriately adjusting the thickness TA1 of the spacer and the thickness TB1 of the reflective film RM, it is possible to increase the reflection rate of the reflective film RM for the light of a desired wavelength band and improve the sensitivity.

Figure 16:
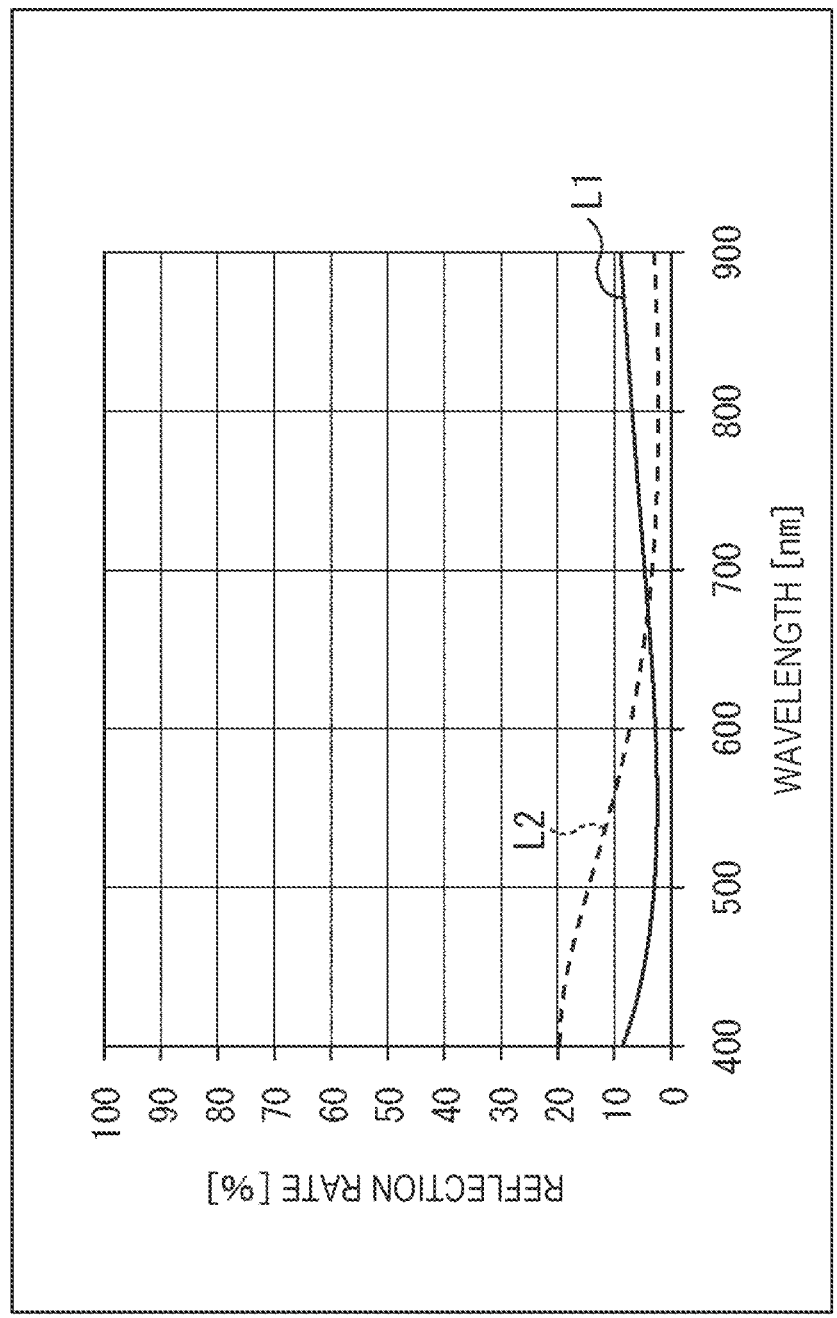
FIG. 16 is a graph illustrating an example of a reflection characteristic of an antireflective film.

FIG. 16 illustrates an example of the reflection characteristic of the antireflective film 104. In FIG. 16, the wavelength is plotted along an abscissa axis and the reflection rate is plotted along an ordinate axis. Furthermore, a solid line L1 indicates the reflection rate of the antireflective film 104 in a case where the thickness is set so that the reflection rate for the light having the wavelength of 550 nm is the lowest. A dotted line L2 indicates the reflection rate of the antireflective film 104 in a case where the thickness is set so that the reflection rate for the light having the wavelength of 800 nm is the lowest.

As illustrated in this example, the reflection rate of the antireflective film 104 changes according to the wavelength of the light. Then, when the center wavelength of the light the reflection rate of which is wanted to be the lowest so that this is incident on the light absorbing layer 103 more is set to λ, and the refractive index of the antireflective film 104 is set to n, the thickness of the antireflective film 104 is desired to be set to approximately λ/4n. With this arrangement, the sensitivity to the light in the vicinity of the center wavelength λ is improved.

For example, when the center wavelength λ is set to 800 nm and the refractive index n is set to 2.15, the thickness of the antireflective film 104 is about 93 nm.

Figure 17:
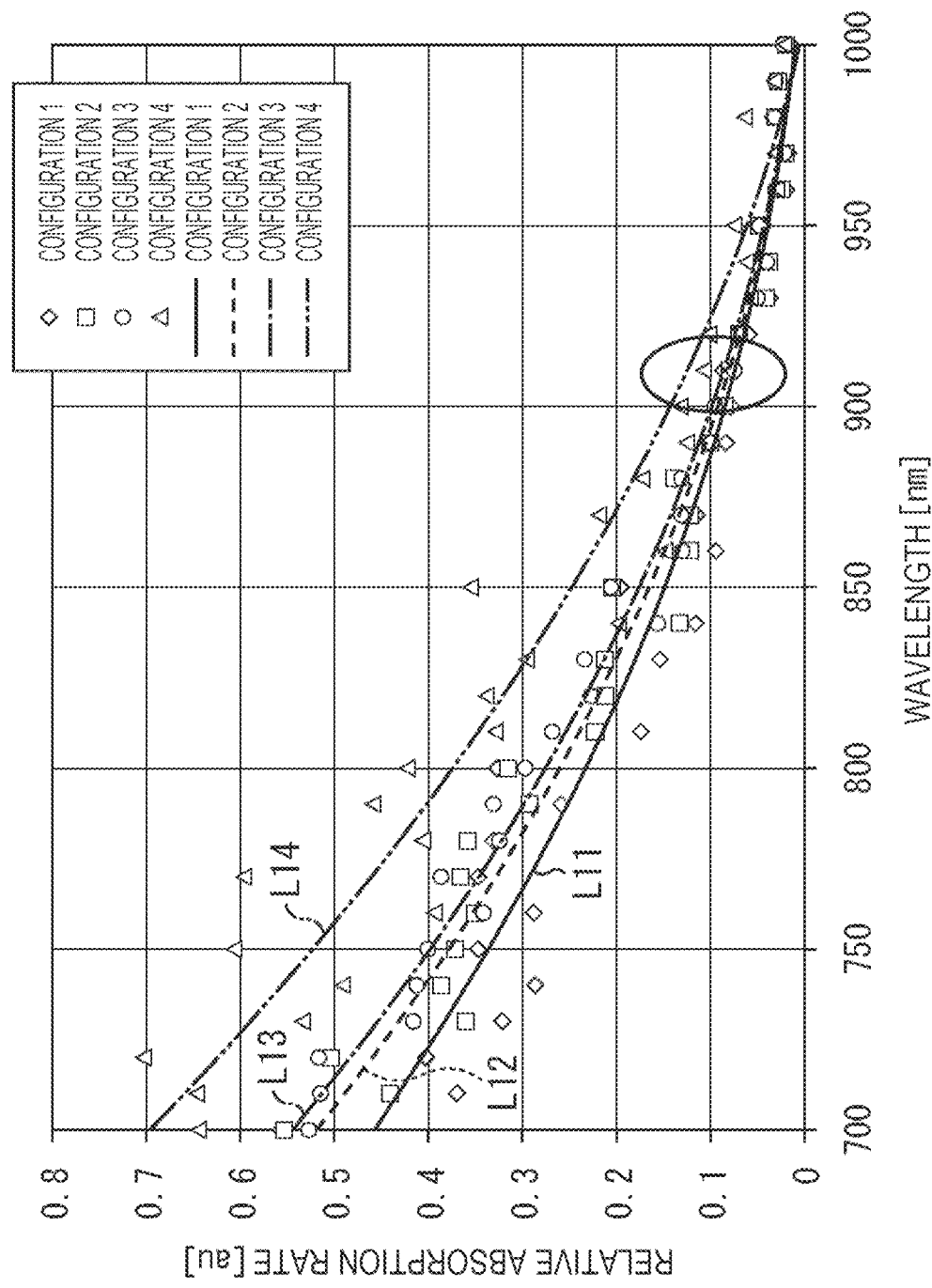
FIG. 17 is a graph illustrating an example of a light absorbing characteristic of a light absorbing layer.
Figure 18:
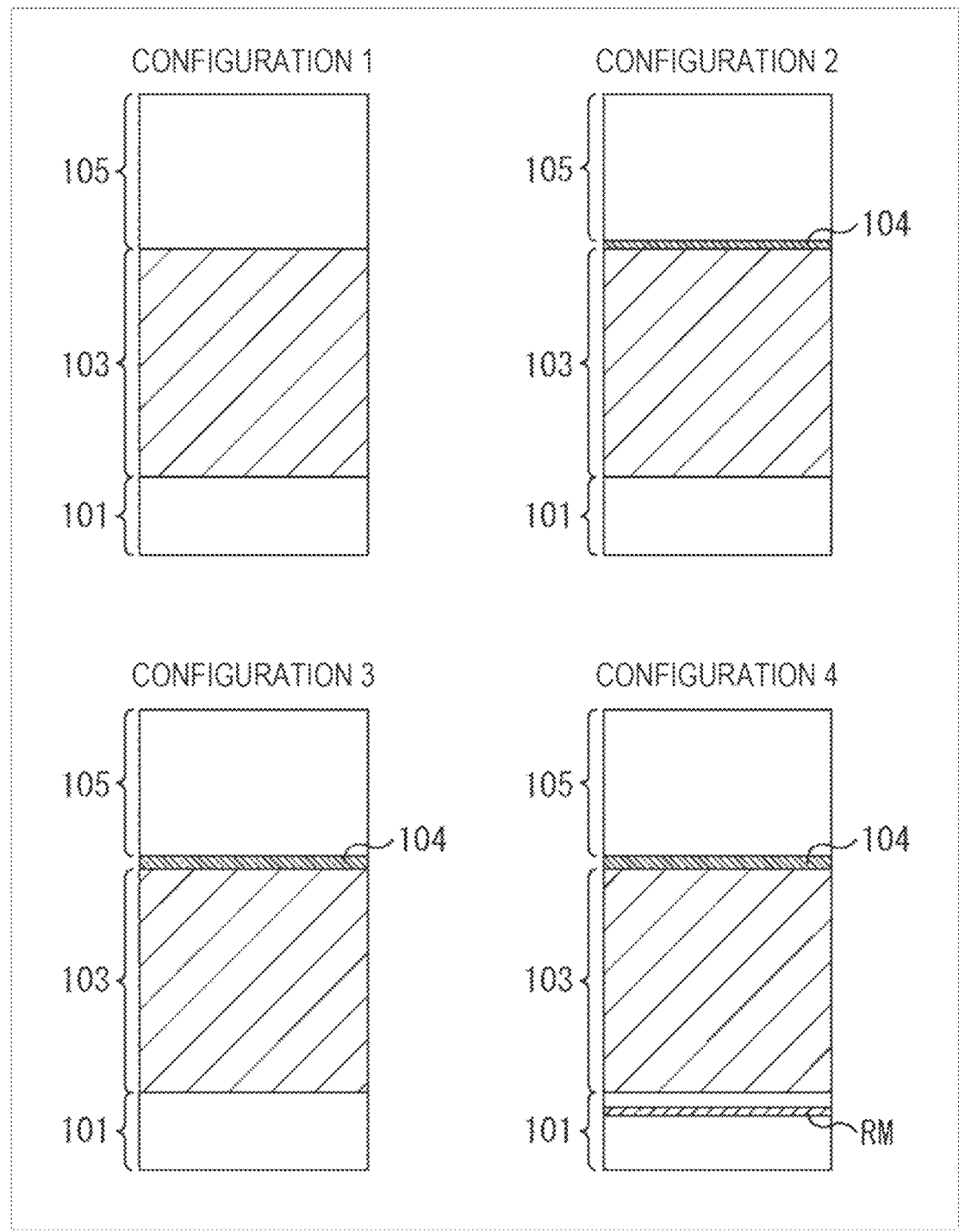
FIG. 18 is a view illustrating a condition of the graph of the light absorbing characteristic in FIG. 17.

FIG. 17 is a graph illustrating a result of simulating a light absorbing characteristic of the light absorbing layer 103 by a finite-difference time-domain (FDTD) method in configurations 1 to 4 in FIG. 18. In FIG. 17, the wavelength (nm) is plotted along an abscissa axis and a relative absorption rate (arbitrary unit) is plotted along an ordinate axis. Note that the relative absorption rate is a total absorption rate of the light absorbed when this is incident on the light absorbing layer 103 and the light absorbed when this is reflected by the wiring layer 101 after passing through the light absorbing layer 103 to be incident again thereon.

In the configurations 1 to 4, the light absorbing layer 103 includes silicon having a thickness of 3 µm, and the wiring layer 101 and the interlayer insulating film 105 include silicon oxide. In the configuration 1, the antireflective film 104 and the reflective film RM are not provided. In the configuration 2, the antireflective film 104 having a thickness of 60 nm is provided, and the reflective film RM is not provided. In the configuration 3, the antireflective film 104 having a thickness of 90 nm is provided, and the reflective film RM is not provided. In the configuration 4, the antireflective film 104 having a thickness of 90 nm and the reflective film RM having a thickness of 50 nm are provided. Furthermore, the thickness of the spacer between the reflective film RM and the light absorbing layer 103 is set to 150 nm.

Furthermore, lines L11 to L14 in FIG. 17 indicate approximate curves of relative absorption rates with respect to the respective wavelengths in a case of the configurations 1 to 4.

As illustrated in this example, in the wavelength band of the infrared light of 700 nm to 1000 nm, the absorption rate of the configuration 4 is the highest, the absorption rate of the configuration 3 is the second highest, then the absorption rate of the configuration 2 is the second lowest, and the absorption rate of configuration 1 is the lowest.

Therefore, by providing the antireflective film 104 and the reflective film RM and appropriately setting the thickness of the antireflective film 104, the sensitivity to the infrared light is improved.

<Variation Regarding Reflective Film>

Next, with reference to FIGS. 19 to 24, a variation regarding the reflective film RM of the CMOS image sensor 10b is described.

Figure 9:
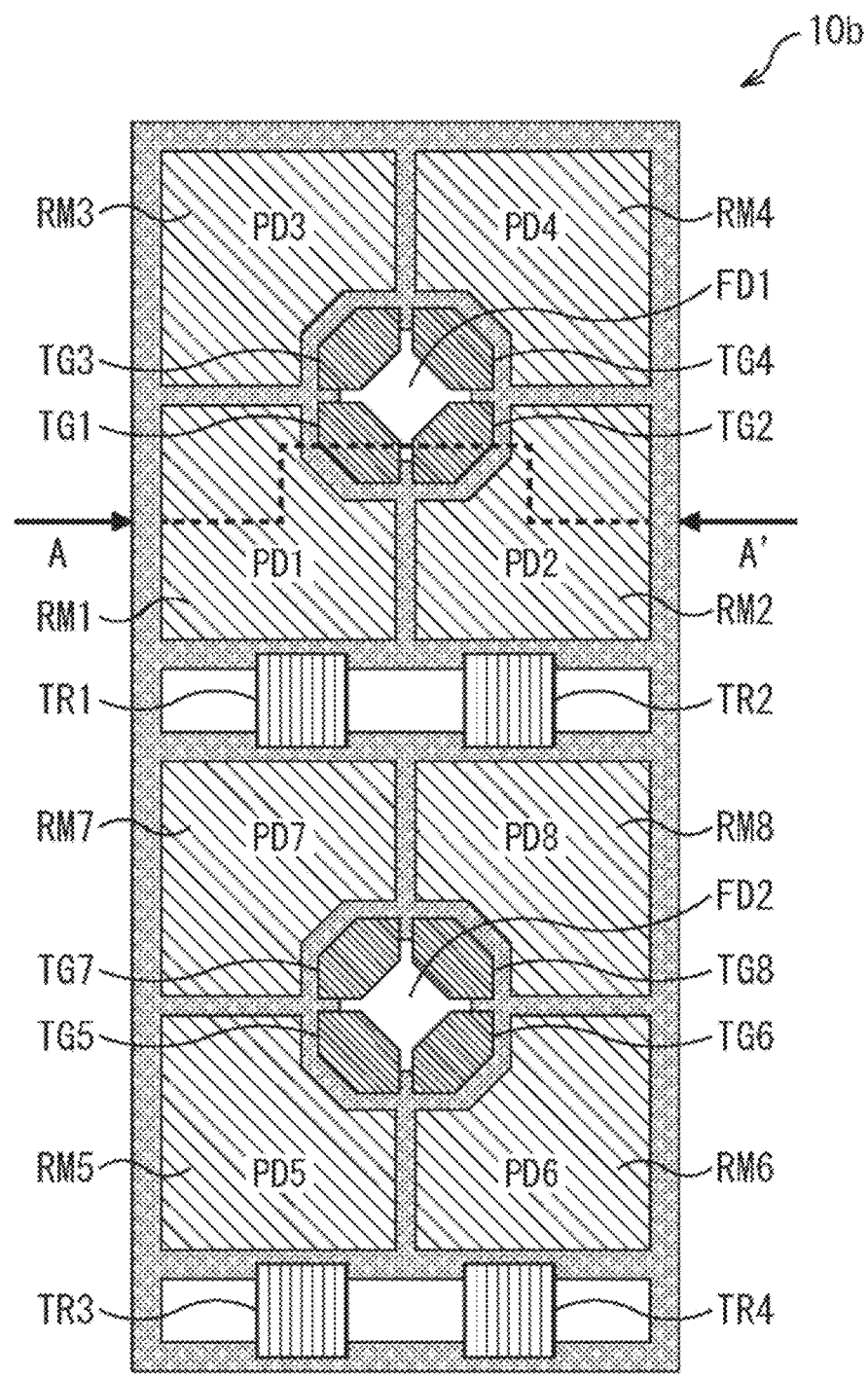
FIG. 9 is a plan view schematically illustrating an arrangement example of pixels of a second embodiment of the CMOS image sensor in FIG. 1.

In the example in FIG. 9, the size of the respective reflective films RM is the same, but it is not always necessary that the size is the same.

Figure 19:
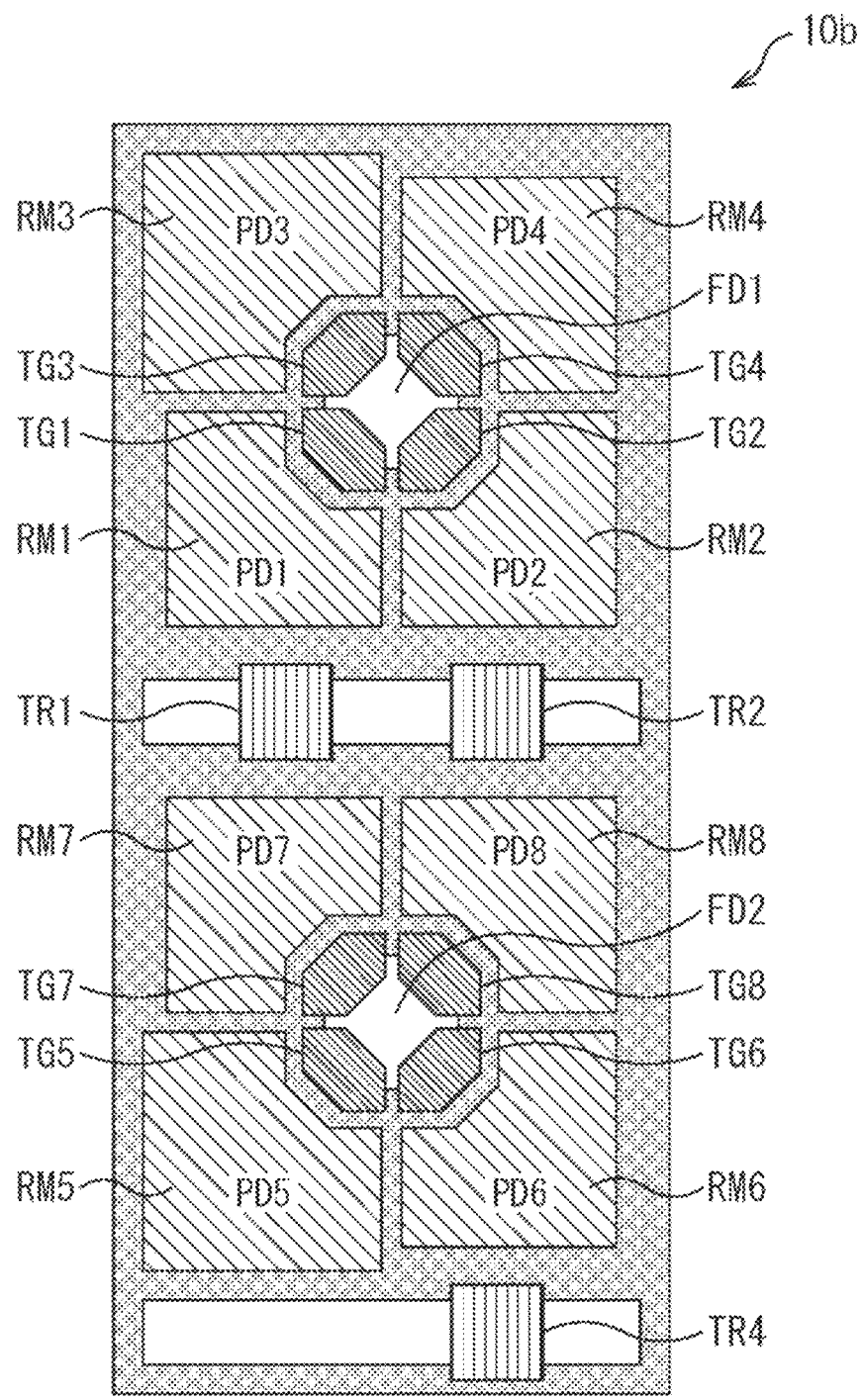
FIG. 19 is a plan view schematically illustrating a first variation of the reflective film.

For example, as illustrated in FIG. 19, the size of the reflective film RM may be changed according to arrangement of pixel transistors TR. Specifically, an arrangement example in FIG. 19 is different from the arrangement example in FIG. 9 in that the pixel transistor TR3 is deleted.

Transmitted light passing through a light absorbing layer 103 is reflected not only by the reflective film RM but also by a gate electrode of the pixel transistor TR in a wiring layer 101 and is incident on the light absorbing layer 103 again. Accordingly, since the pixel transistor TR3 is deleted, the reflected light incident on a photodiode PD5 again reduces by an amount of the reflected light by the gate electrode of the pixel transistor TR3. For this, by increasing an area of a reflective film RM5 corresponding to the photodiode PD5, the decrease in the reflected light is compensated. With this arrangement, variation in reflected light incident on each photodiode PD is suppressed, and variation in sensitivity among pixels 70 is suppressed.

Note that, in FIG. 19, an area of a reflective film RM3 is also increased as the reflective film RM5; this is because the pixel transistor is not arranged in an upper direction in the drawing of the reflective film RM3.

Furthermore, in the CMOS image sensor 10b, pupil correction is performed as necessary, for example, in a case where this is thinned for use in a mobile camera module and the like, for example.

Figure 20:
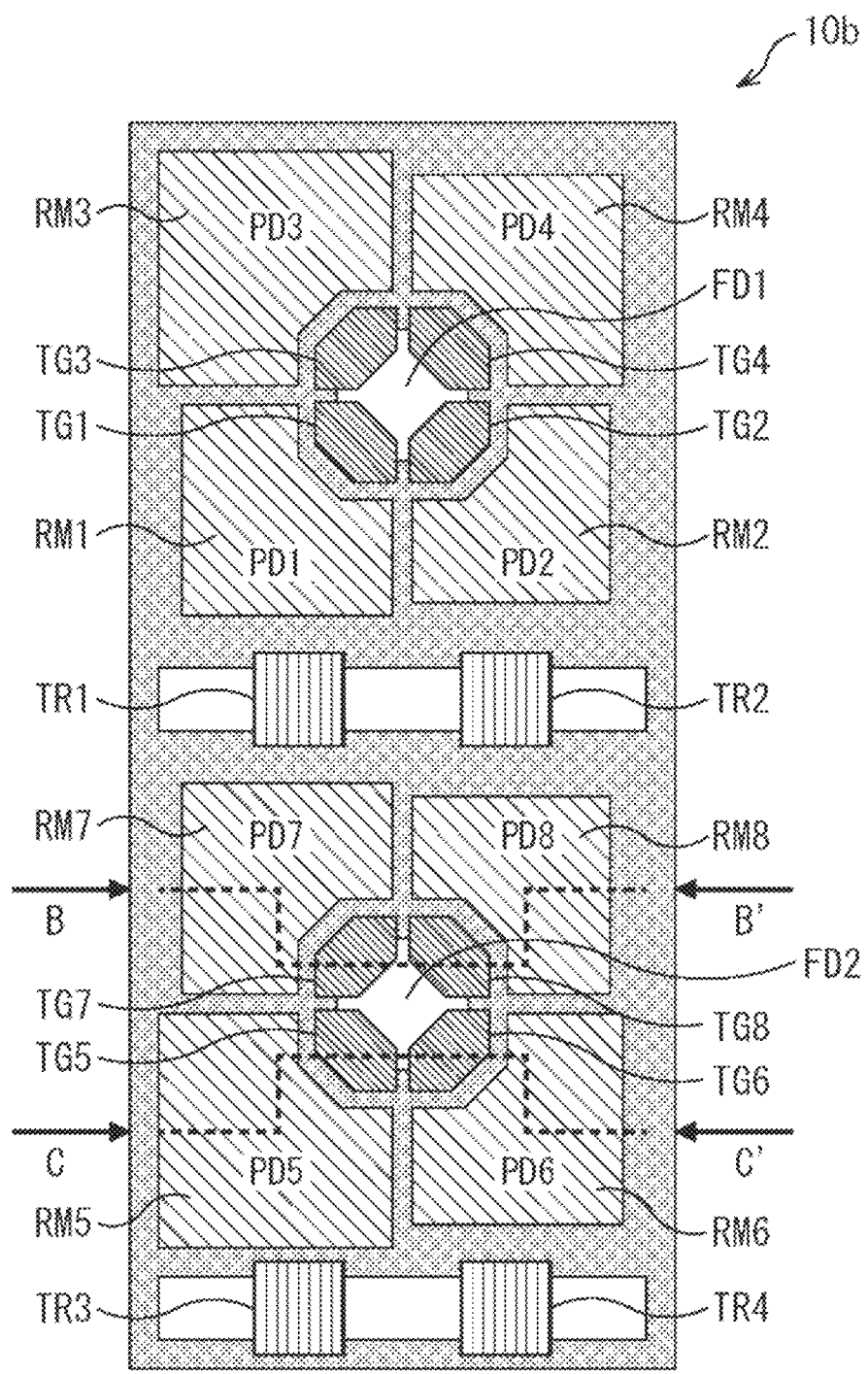
FIG. 20 is a plan view schematically illustrating a second variation of the reflective film.
Figure 21:
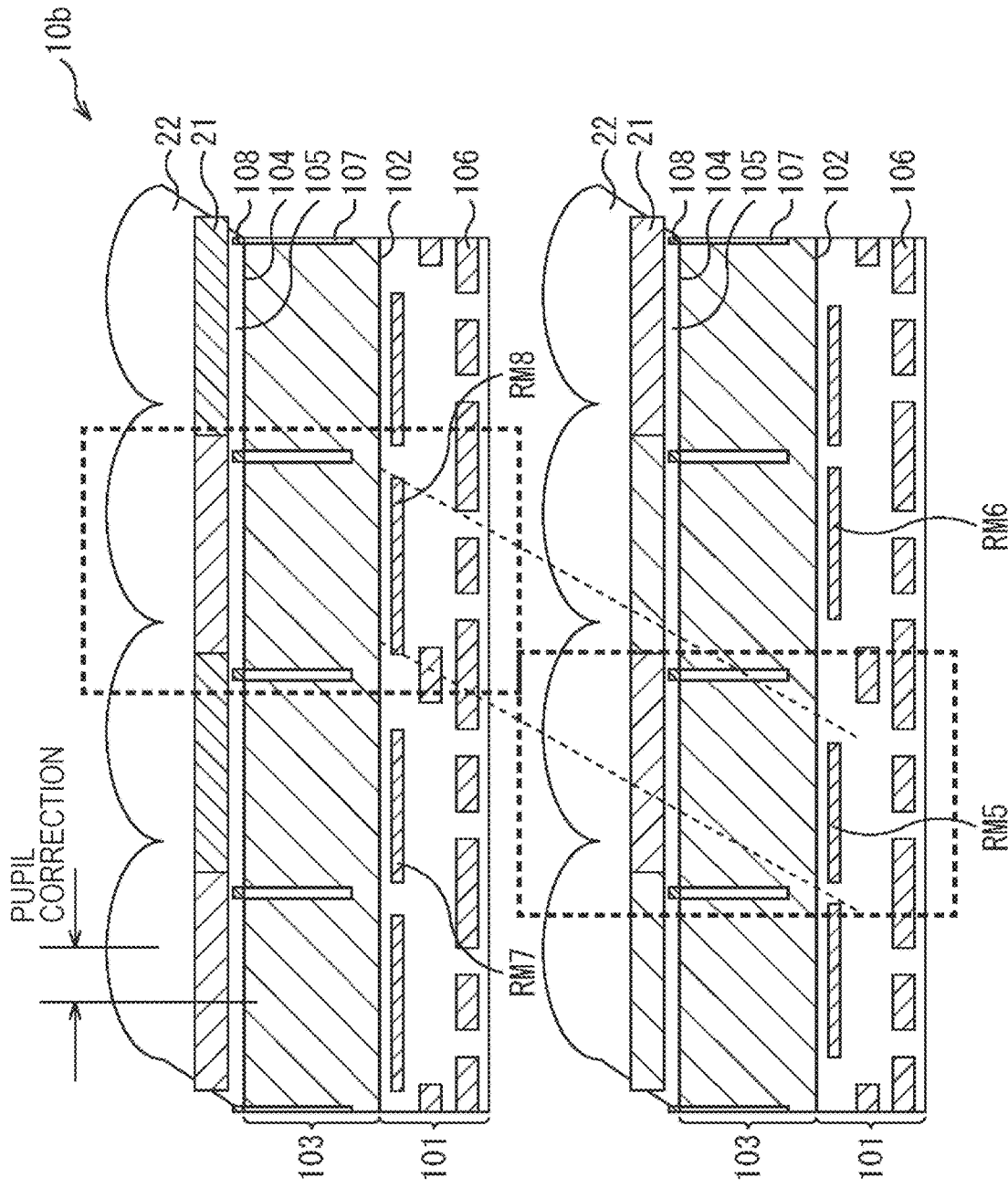
FIG. 21 is a view schematically illustrating an example of pupil correction.

For example, FIG. 21 illustrates a cross-sectional view (A-A' cross-sectional view) of the CMOS image sensor 10b taken along dotted line B-B' and dotted line C-C' in FIG. 20. In this example, for each pixel 70, an incident angle of a principal ray is designed to have a different value according to an image height, and depending on the incident angle of the principal ray, positions of micro lenses of an on-chip lens array 22, filters of a color filter array 21, and an element separating unit 107 are offset in a horizontal direction. That is to say, the pupil correction is performed.

Then, for each pixel 70, a shape, the size, and a position of the reflective film RM are adjusted on the basis of a correction amount, a correction direction and the like of the pupil correction. For example, in the example in FIG. 20, the reflective films RM3 and RM5 are larger than other reflective films RM. Furthermore, for example, in the example in FIG. 21, positions of the centers in the horizontal direction of the reflective films RM5 and RM7 are offset to the left in the drawing from the center of an opening of the light absorbing layer 103. With this arrangement, for example, a difference in sensitivity among the pixels 70 due to the difference in incident angle of the principal ray to each pixel 70 is suppressed. Especially, it is possible to suppress a difference in sensitivity between adjacent pixels 70 of the same color or among the pixels 70 of the same color in the vicinity.

Furthermore, the reflective film RM is not always necessarily provided for each pixel 70 (photodiode PD), and the reflective film RM may be shared by a plurality of pixels 70 (photodiodes PD).

Figure 22:
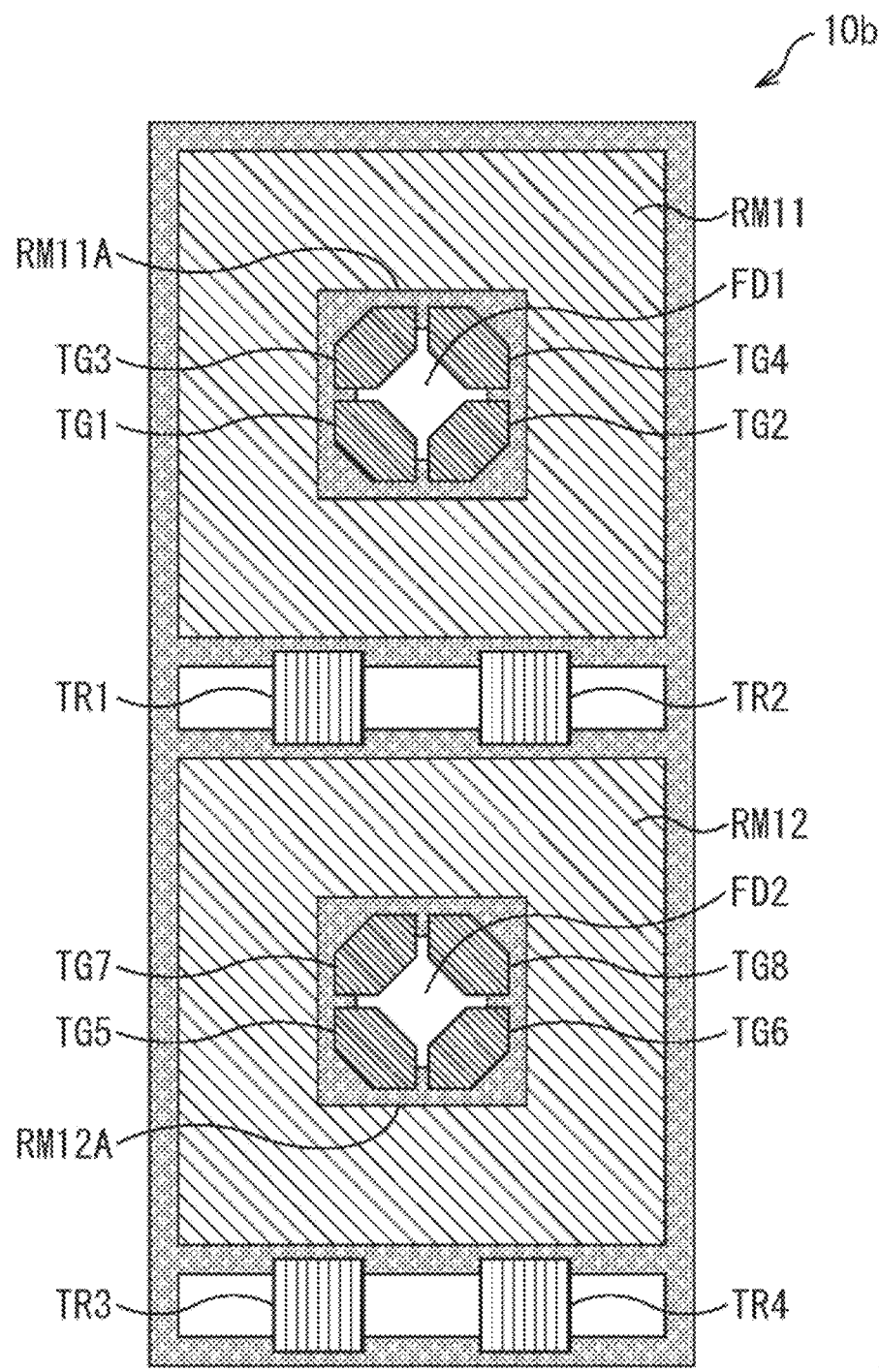
FIG. 22 is a plan view schematically illustrating a third variation of the reflective film.

In the example in FIG. 22, a reflective film RM11 has a rectangular frame shape surrounding gate electrodes of transfer transistors TG1 to TG4 and covers bottom surfaces of photodiodes PD1 to PD4. In the reflective film RM11, a rectangular openings RM11A is formed at a position corresponding to the gate electrodes of the transfer transistors TG1 to TG4. Similarly, a reflective film RM12 has a rectangular frame shape surrounding gate electrodes of transfer transistors TG5 to TG8 and covers bottom surfaces of photodiodes PD5 to PD8. In the reflective film RM12, a rectangular openings RM12A is formed at a position corresponding to the gate electrodes of the transfer transistors TG5 to TG8.

Figure 23:
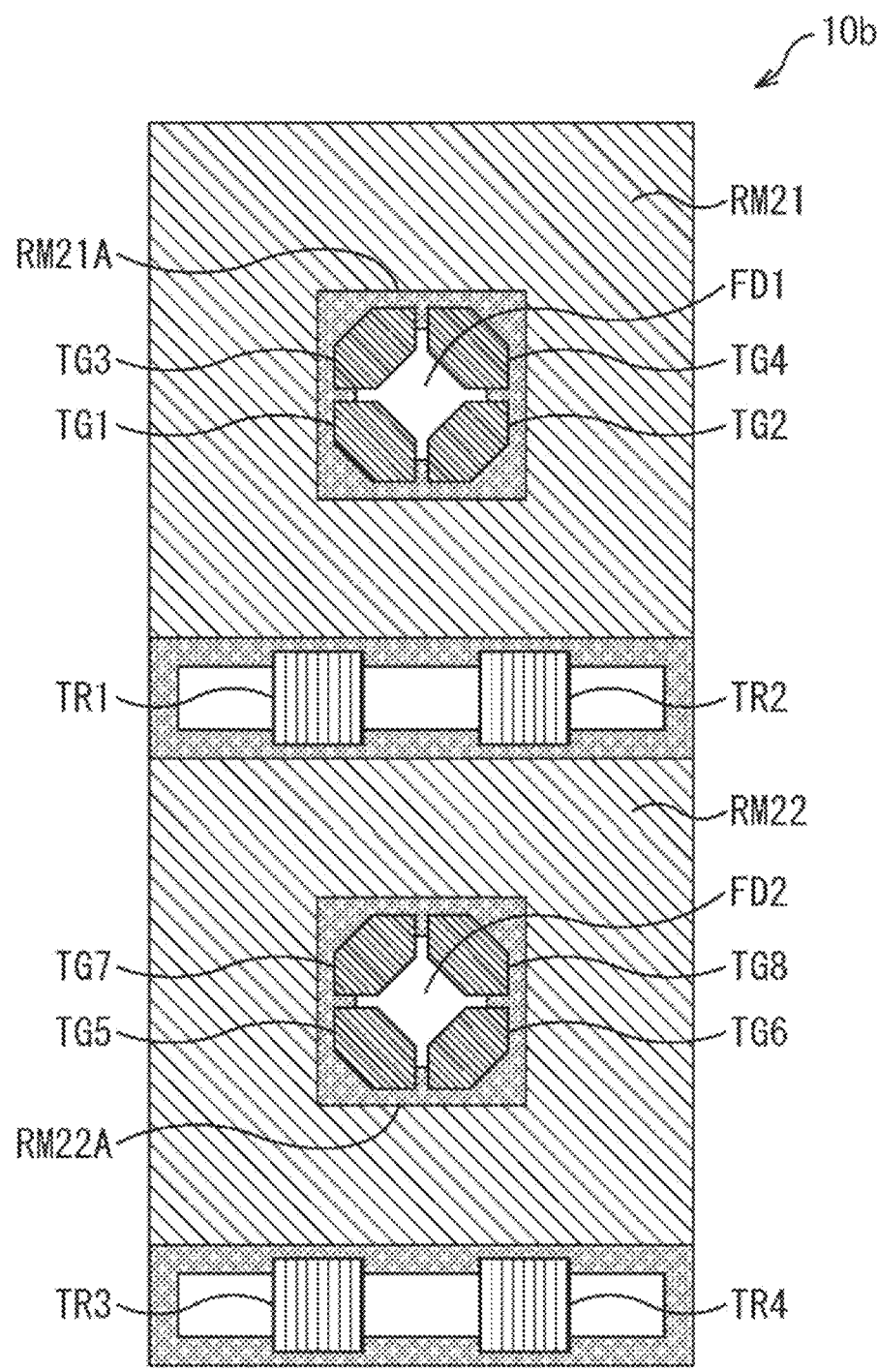
FIG. 23 is a plan view schematically illustrating a fourth variation of the reflective film.

In the example in FIG. 23, the reflective film RM is further shared by adjacent 2×4 pixel units. Specifically, a reflective film RM21 is connected between the 2×4 pixel units adjacent in a lateral direction, and a rectangular opening RM21A is formed at a position corresponding to the gate electrodes of the transfer transistors TG1 to TG4. Similarly, a reflective film RM22 is connected between the 2×4 pixel units adjacent in the lateral direction, and a rectangular opening RM22A is formed at a position corresponding to the gate electrodes of the transfer transistors TG5 to TG7.

Figure 24:
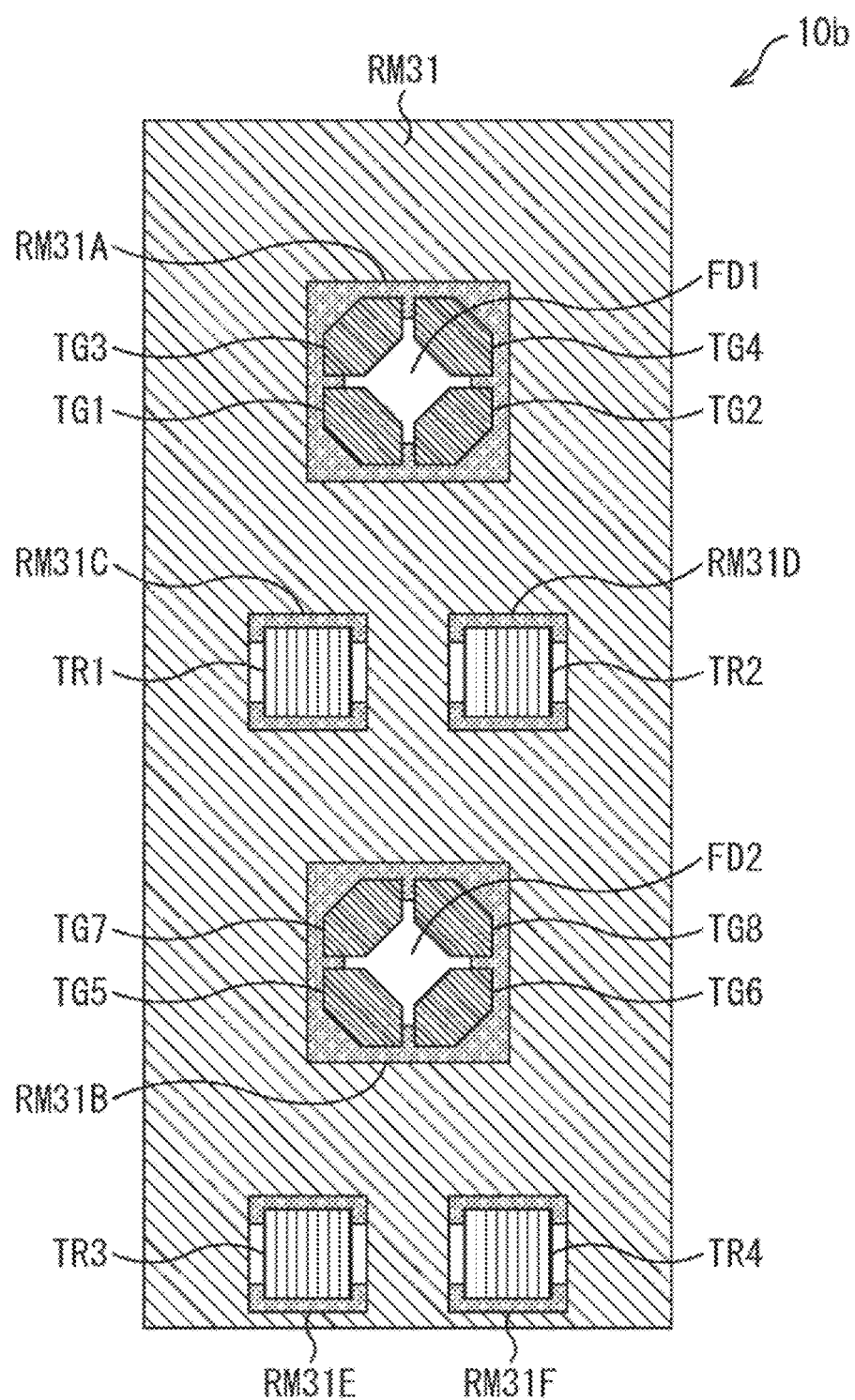
FIG. 24 is a plan view schematically illustrating a fifth variation of the reflective film.

In the example in FIG. 24, the reflective film RM is further shared by the 2×4 pixel units adjacent not only in the lateral direction but also in a longitudinal direction. Specifically, a reflective film RM31 is connected among all the pixels 70, and an opening is formed depending on the position of the gate electrode of each transistor. For example, in the example in FIG. 24, a rectangular opening RM31A is formed at a position corresponding to the gate electrodes of the transfer transistors TG1 to TG4 and a rectangular opening RM31B is formed at a position corresponding to the gate electrodes of the transfer transistors TG5 to TG7. Furthermore, rectangular openings RM31C to RM31F are formed at positions corresponding to the gate electrodes of the pixel transistors TR1 to TR4, respectively.

4. Third Embodiment

Figure 25:
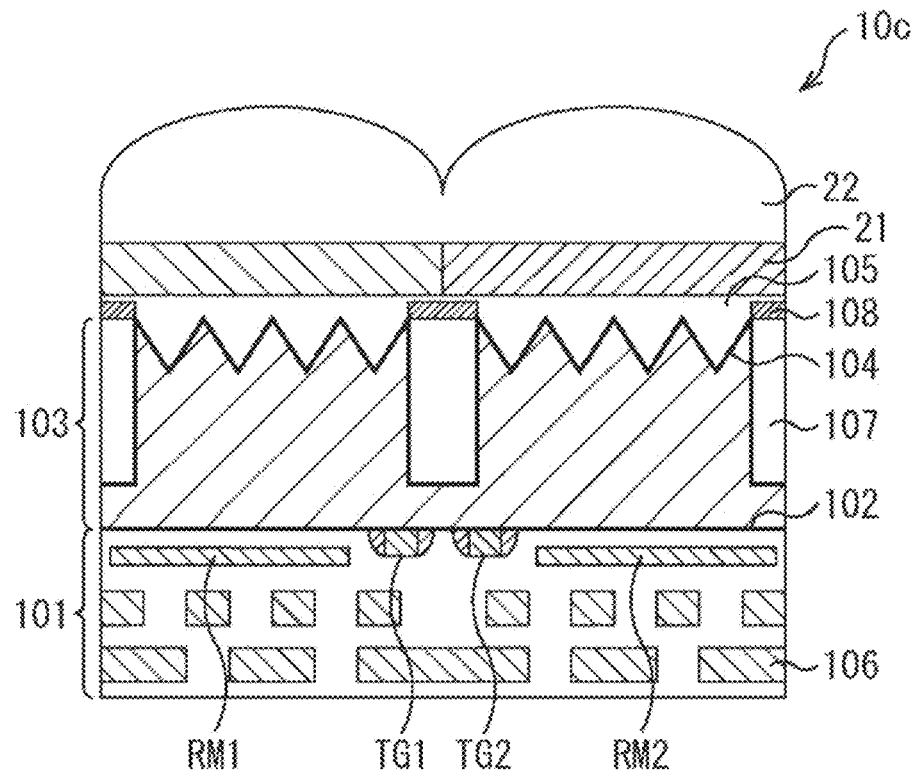
FIG. 25 is a cross-sectional view schematically illustrating a configuration example of a third embodiment of the CMOS image sensor in FIG. 1.

FIG. 25 schematically illustrates a cross-section of a CMOS image sensor 10c being a third embodiment of the CMOS image sensor 10. Note that, in the drawing, a portion corresponding to that in FIG. 10 is assigned with the same reference sign, and the description thereof is omitted as appropriate.

Figure 10:
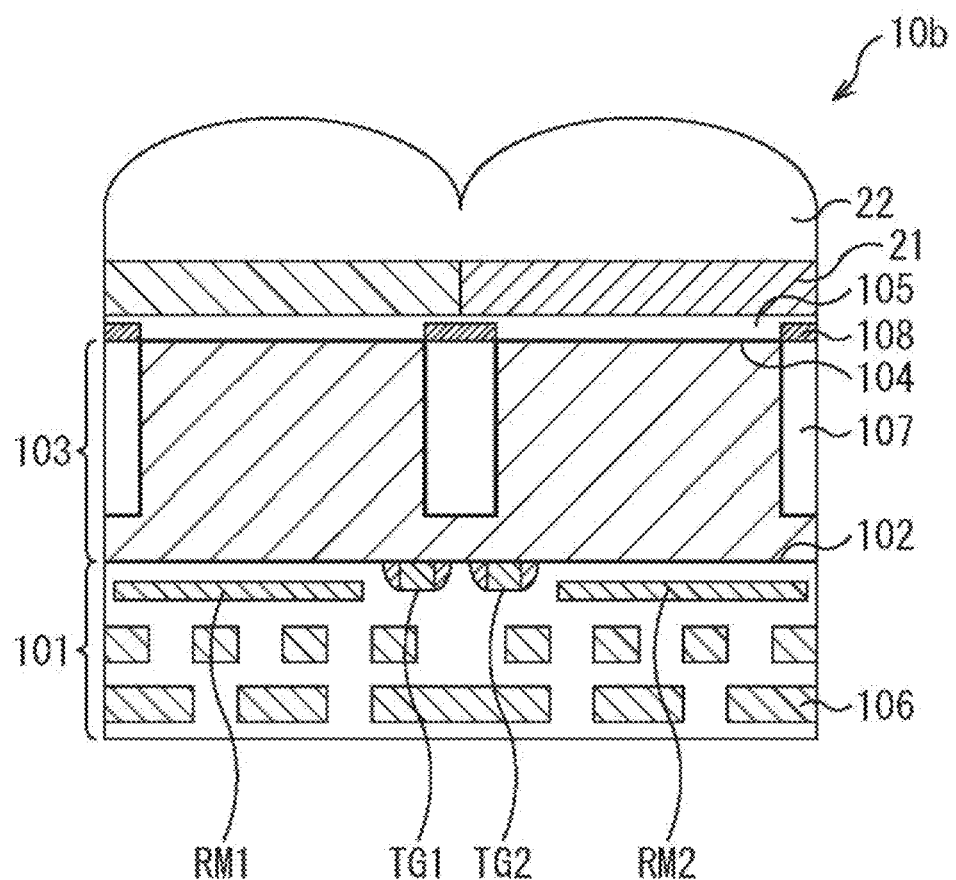
FIG. 10 is a cross-sectional view schematically illustrating a configuration example of the second embodiment of the CMOS image sensor in FIG. 1.

The CMOS image sensor 10c is different from the CMOS image sensor 10b in FIG. 10 in that a diffraction structure including periodic irregularities are formed on a light receiving surface of a light absorbing layer 103. Specifically, inverted pyramidal grooves each having a rectangular upper surface are periodically formed on the light receiving surface of the light absorbing layer 103. The grooves formed by, for example, a silicon crystal plane (111) or a silicon crystal plane (110) are arranged in a lattice pattern without gaps on the light receiving surface of the light absorbing layer 103. In addition, a length (size pitch) of one side of the upper surface of the groove on the light receiving surface is set within a range of 200 nm to 1000 nm, for example.

Due to the diffraction structure of the light receiving surface of the light absorbing layer 103, an incident angle of light incident on the light absorbing layer 103 increases, and an optical path in the light absorbing layer 103 becomes long. With this arrangement, an infrared light component contained in the incident light is more easily absorbed by the light absorbing layer 103, and sensitivity to the infrared light is improved.

5. Fourth Embodiment

Figure 26:
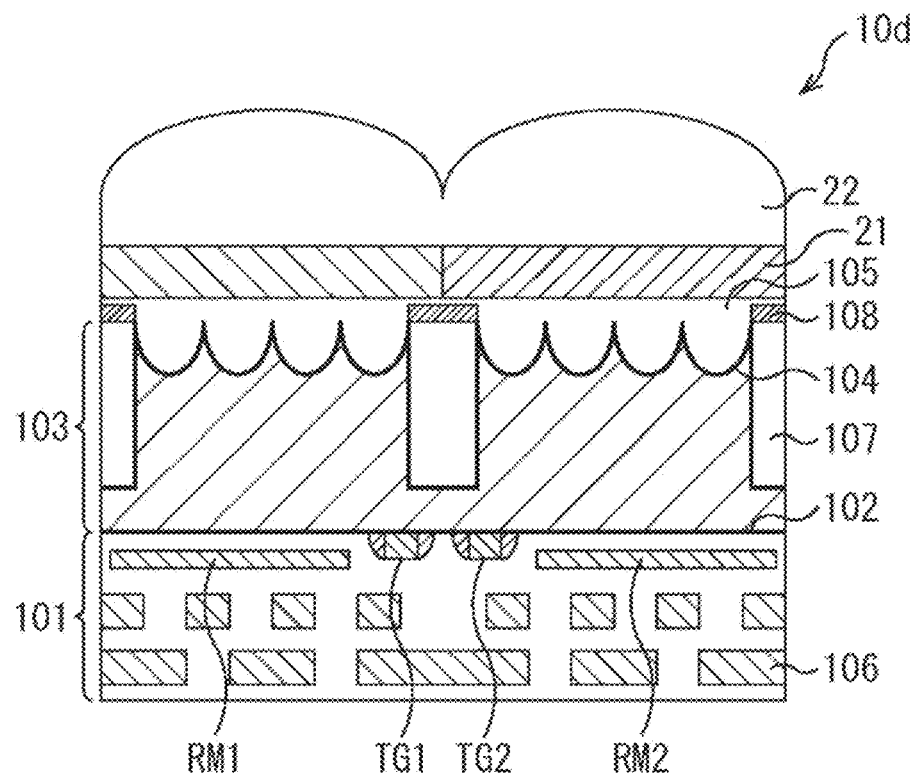
FIG. 26 is a cross-sectional view schematically illustrating a configuration example of a fourth embodiment of the CMOS image sensor in FIG. 1.

FIG. 26 schematically illustrates a cross-section of a CMOS image sensor 10d being a fourth embodiment of the CMOS image sensor 10. Note that, in the drawing, a portion corresponding to that in FIG. 25 is assigned with the same reference sign, and the description thereof is omitted as appropriate.

The CMOS image sensor 10d differs from the CMOS image sensor 10c in FIG. 25 in a shape of a diffraction structure of a light receiving surface of a light absorbing layer 103. Specifically, on the light receiving surface of the light absorbing layer 103, grooves of which opening diameter is the largest on an upper surface and decreases in a direction downward are periodically formed. A cross-section in a depth direction of this groove is parabolic. The grooves are, for example, arranged in a lattice pattern without gaps on the light receiving surface of the light absorbing layer 103. In addition, a length (size pitch) of one side of the upper surface of the groove on the light receiving surface is set within a range of 200 nm to 1000 nm, for example.

Due to the diffraction structure of the light receiving surface of the light absorbing layer 103, the sensitivity to the infrared light is improved for a reason similar to that of the CMOS image sensor 10c in FIG. 25.

6. Fifth Embodiment

Figure 27:
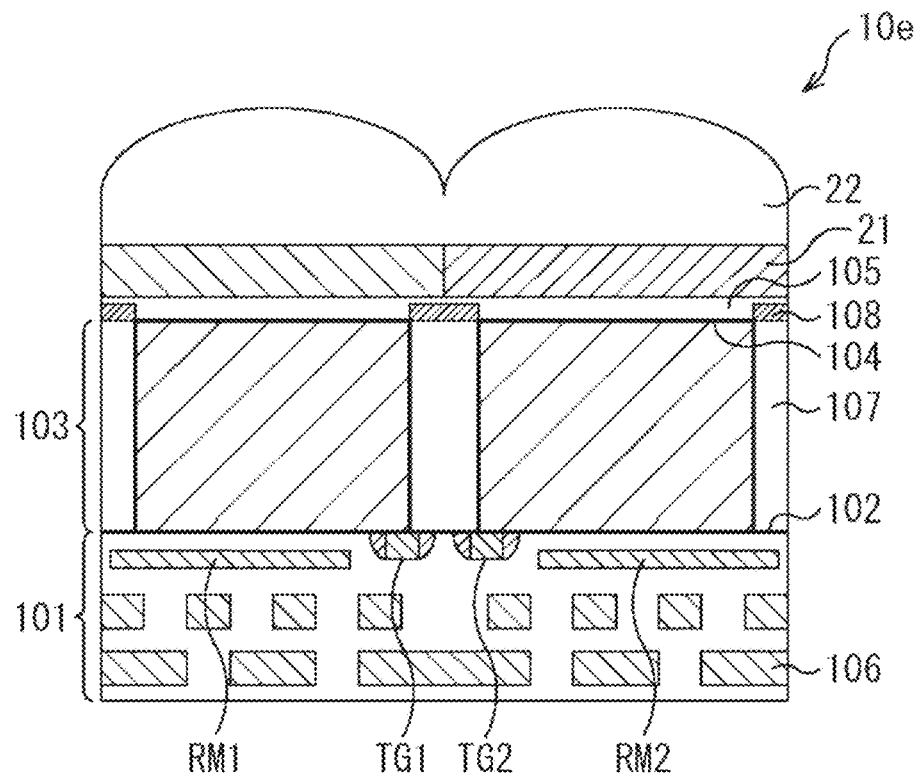
FIG. 27 is a cross-sectional view schematically illustrating a configuration example of a fifth embodiment of the CMOS image sensor in FIG. 1.

FIG. 27 schematically illustrates a cross-section of a CMOS image sensor 10e being a fifth embodiment of the CMOS image sensor 10. Note that, in the drawing, a portion corresponding to that in FIG. 10 is assigned with the same reference sign, and the description thereof is omitted as appropriate.

The CMOS image sensor 10e is different from the CMOS image sensor 10b in FIG. 10 in that an element separating unit 107 penetrates a light absorbing layer 103 and reaches a bottom surface of the light absorbing layer 103. In this manner, since the element separating unit 107 penetrates the light absorbing layer 103, leakage of light between pixels 70 is further suppressed, thereby suppressing occurrence of color mixing and a decrease in spatial resolution. However, since the element separating unit 107 penetrates the light absorbing layer 103, a degree of freedom of layout on a bottom surface of the element separating unit 107 is reduced.

7. Sixth Embodiment

Figure 28:
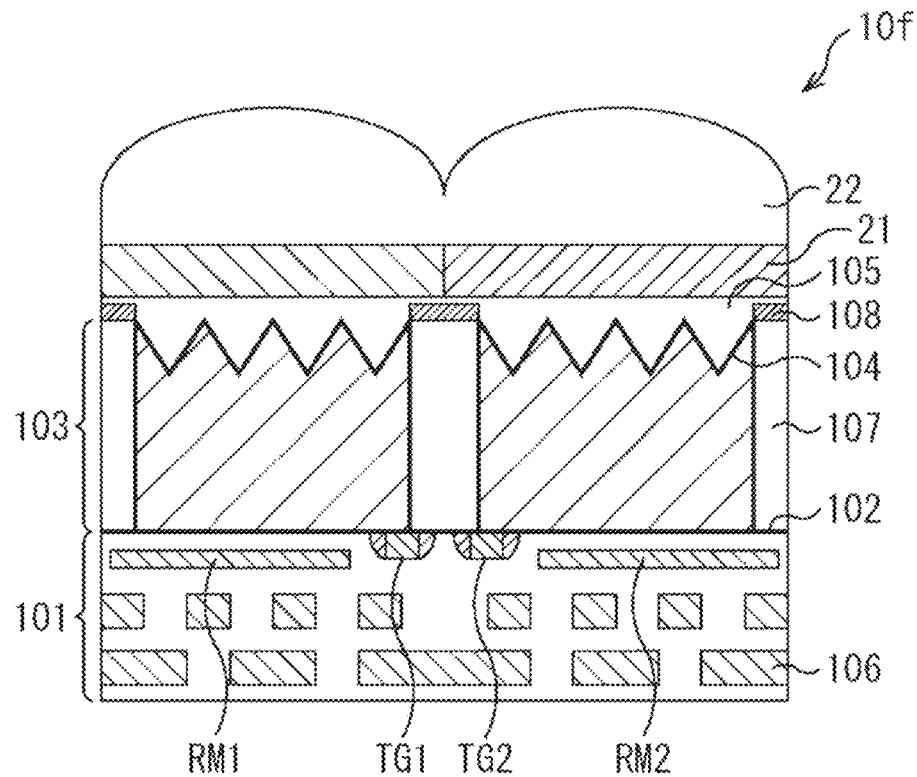
FIG. 28 is a cross-sectional view schematically illustrating a configuration example of a sixth embodiment of the CMOS image sensor in FIG. 1.

FIG. 28 schematically illustrates a cross-section of a CMOS image sensor 10f being a sixth embodiment of the CMOS image sensor 10. Note that, in the drawing, a portion corresponding to that in FIG. 25 is assigned with the same reference sign, and the description thereof is omitted as appropriate.

The CMOS image sensor 10f is different from the CMOS image sensor 10c in FIG. 25 in that an element separating unit 107 penetrates a light absorbing layer 103 and reaches a bottom surface of the light absorbing layer 103. Therefore, as is the case with the CMOS image sensor 10e in FIG. 27, leakage of light between pixels is further suppressed.

8. Seventh Embodiment

Figure 29:
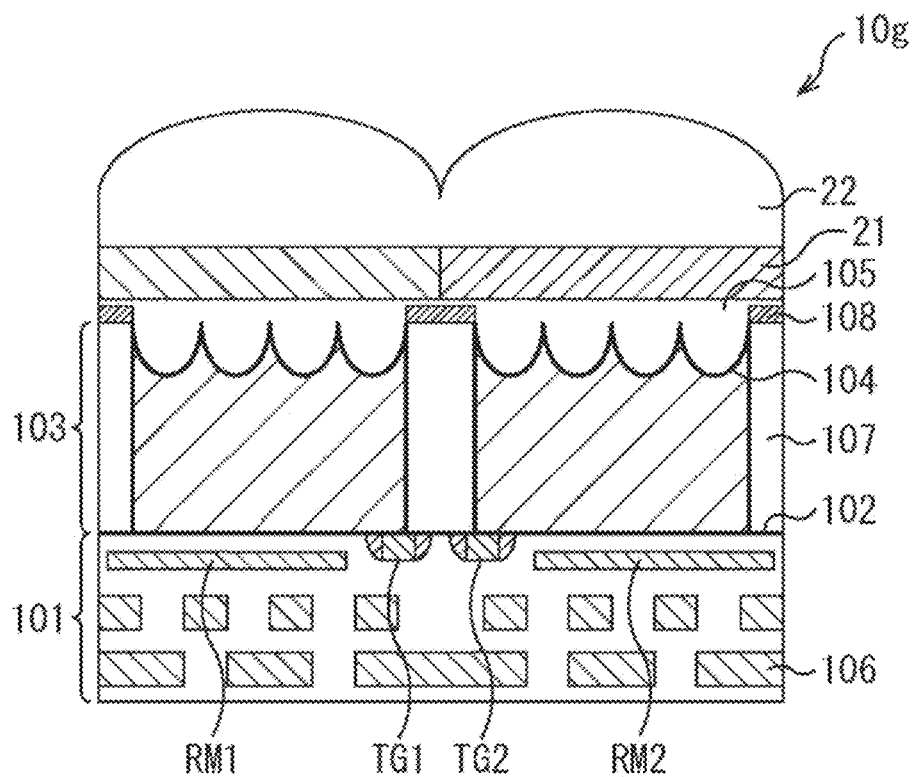
FIG. 29 is a cross-sectional view schematically illustrating a configuration example of a seventh embodiment of the CMOS image sensor in FIG. 1.

FIG. 29 schematically illustrates a cross-section of a CMOS image sensor 10g being a seventh embodiment of the CMOS image sensor 10. Note that, in the drawing, a portion corresponding to that in FIG. 26 is assigned with the same reference sign, and the description thereof is omitted as appropriate.

The CMOS image sensor 10g is different from the CMOS image sensor 10d in FIG. 26 in that an element separating unit 107 penetrates a light absorbing layer 103 and reaches a bottom surface of the light absorbing layer 103. Therefore, as is the case with the CMOS image sensor 10e in FIG. 27, leakage of light between pixels is further suppressed.

9. Eighth Embodiment

Figure 30:
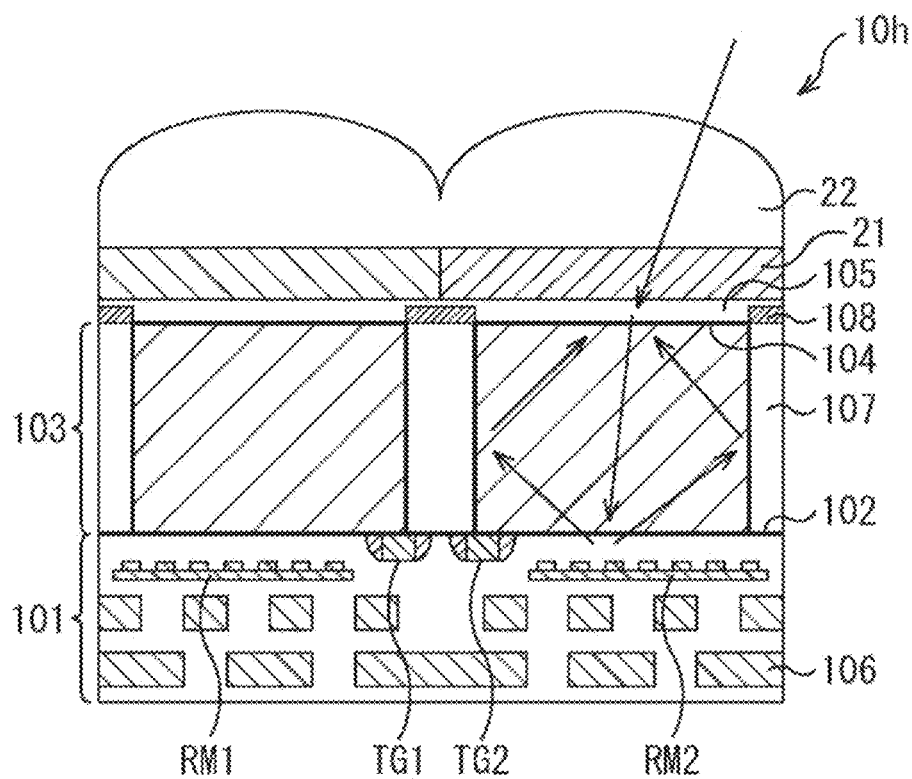
FIG. 30 is a cross-sectional view schematically illustrating a configuration example of an eighth embodiment of the CMOS image sensor in FIG. 1.

FIG. 30 schematically illustrates a cross-section of a CMOS image sensor 10h being an eighth embodiment of the CMOS image sensor 10. Note that, in the drawing, a portion corresponding to that in FIG. 27 is assigned with the same reference sign, and the description thereof is omitted as appropriate.

The CMOS image sensor 10h differs from the CMOS image sensor 10d in FIG. 27 in that irregularities are formed on a surface of a reflective film RM. Due to the irregularities of the reflective film RM, light transmitted through a light absorbing layer 103 is irregularly reflected, and an incident angle at the time of incidence again on the light absorbing layer 103 increases on average. Therefore, an optical path in the light absorbing layer 103 of the light incident again on the light absorbing layer 103 becomes longer, and an absorption rate increases. As a result, the sensitivity to the infrared light is improved.

10. Ninth Embodiment

Figure 31:
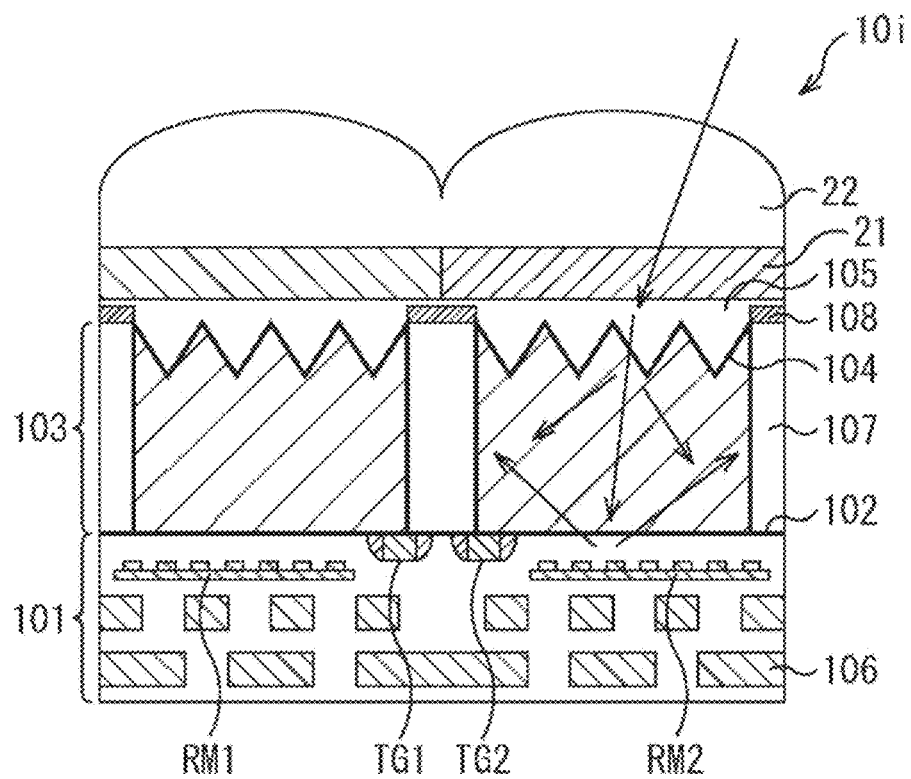
FIG. 31 is a cross-sectional view schematically illustrating a configuration example of a ninth embodiment of the CMOS image sensor in FIG. 1.

FIG. 31 schematically illustrates a cross-section of a CMOS image sensor 10i being a ninth embodiment of the CMOS image sensor 10. Note that, in the drawing, a portion corresponding to that in FIG. 28 is assigned with the same reference sign, and the description thereof is omitted as appropriate.

The CMOS image sensor 10i differs from the CMOS image sensor 10f in FIG. 28 in that irregularities are formed on a surface of a reflective film RM as is the case with the CMOS image sensor 10h in FIG. 30. Therefore, for a reason similar to that for the CMOS image sensor 10h, the sensitivity to the infrared light is improved.

11. Tenth Embodiment

Figure 32:
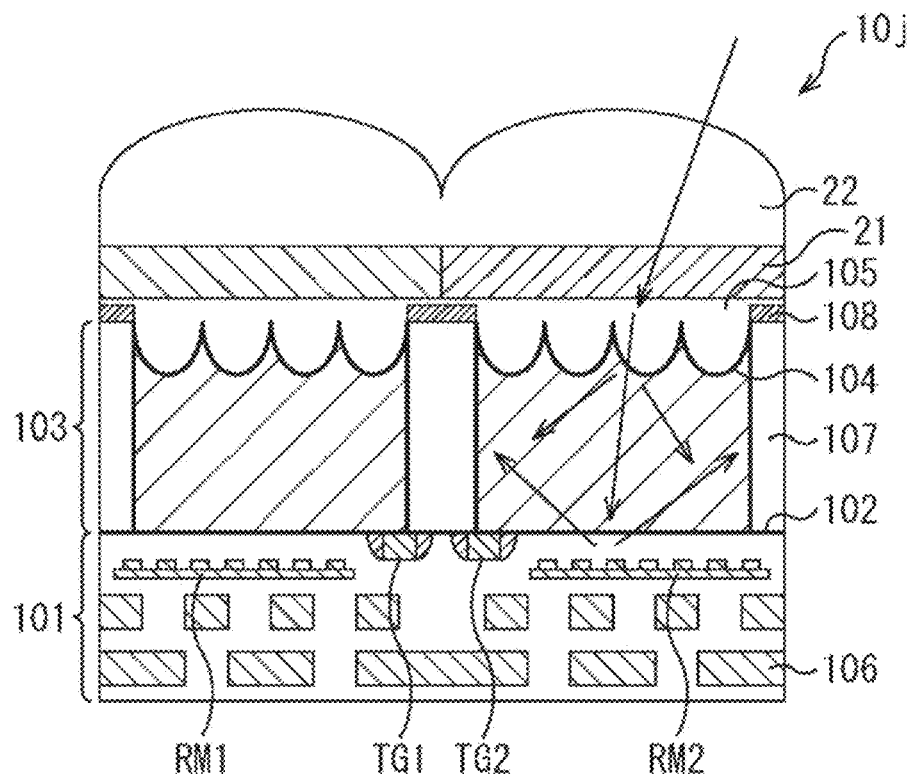
FIG. 32 is a cross-sectional view schematically illustrating a configuration example of a tenth embodiment of the CMOS image sensor in FIG. 1.

FIG. 32 schematically illustrates a cross-section of a CMOS image sensor 10j being a tenth embodiment of the CMOS image sensor 10. Note that, in the drawing, a portion corresponding to that in FIG. 29 is assigned with the same reference sign, and the description thereof is omitted as appropriate.

The CMOS image sensor 10j differs from the CMOS image sensor 10g in FIG. 29 in that irregularities are formed on a surface of a reflective film RM as is the case with the CMOS image sensor 10h in FIG. 30. Therefore, for a reason similar to that for the CMOS image sensor 10h, the sensitivity to the infrared light is improved.

12. Eleventh Embodiment

Figure 33:
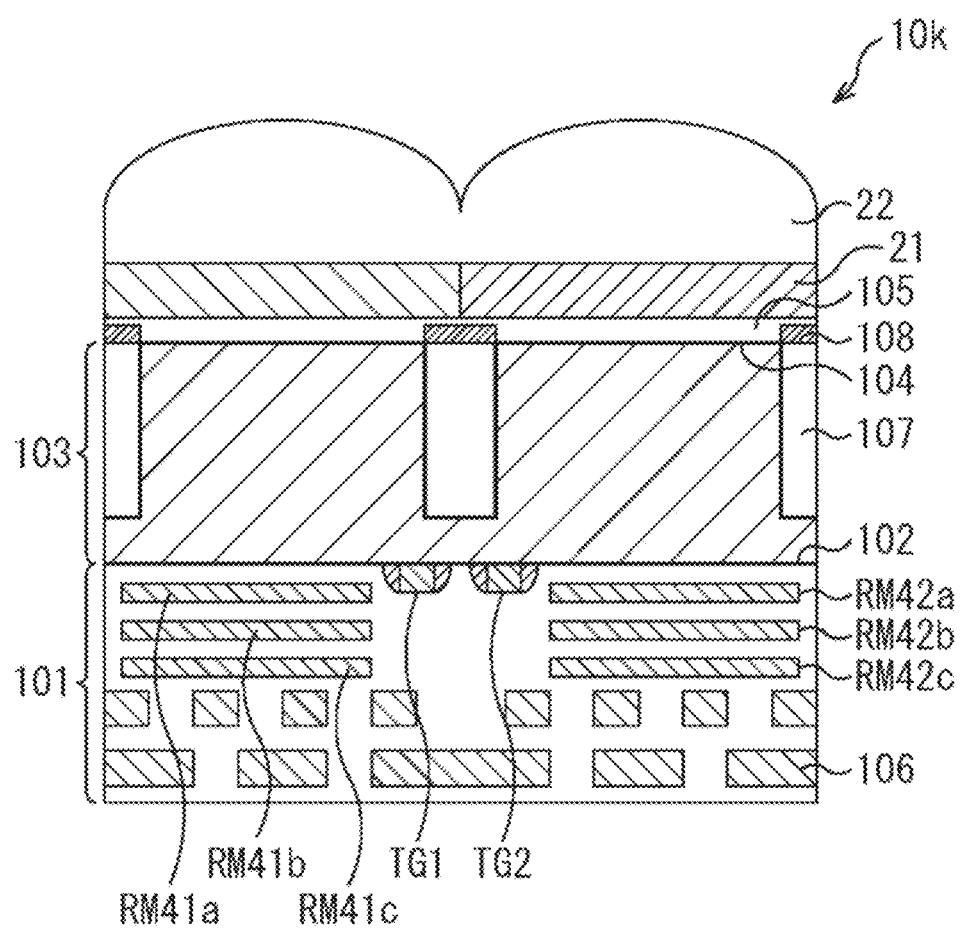
FIG. 33 is a cross-sectional view schematically illustrating a configuration example of an eleventh embodiment of the CMOS image sensor in FIG. 1.

FIG. 33 schematically illustrates a cross-section of a CMOS image sensor 10k being an eleventh embodiment of the CMOS image sensor 10. Note that, in the drawing, a portion corresponding to that in FIG. 10 is assigned with the same reference sign, and the description thereof is omitted as appropriate.

The CMOS image sensor 10k is different from the CMOS image sensor 10b in FIG. 10 in that a reflective film RM is a multilayer film. Specifically, in comparison with the CMOS image sensor 10b, the CMOS image sensor 10k is provided with three-layer reflective films of reflective films RM41a to RM41c in place of the reflective film RM1. Similarly, in place of the reflective film RM2, three-layer reflective films of reflective films RM42a to RM42c are provided.

The reflective films RM41a to RM42c include a dielectric material having a high refractive index such as silicon such as polysilicon, amorphous silicon, or single crystal silicon, TaO, TfO, SiNx (silicon nitride), Ge, SiC, TiN, Ti, TiO2, and NgF2, for example.

Note that, hereinafter, in a case where it is not necessary to distinguish the reflective films RM41a to RM42c from one another, they are simply referred to as the reflective films RM.

Furthermore, in addition to an insulating film containing silicon oxide or silicon nitride as a main component, an optically transparent member in a visible to near infrared wavelength band such as TiO2 or HfO2 may be used as an interlayer film of a wiring layer 101.

Note that a thickness TA2 of the interlayer film between a bottom surface of a light absorbing layer 103 (more strictly, gate insulating film 102) and each reflective film RM, a thickness TA2 of the interlayer film between the reflective films RM, and a thickness TB2 of each reflective film RM are set according to, for example, following equations (3) and (4).

$$TA2 = (\lambda \times i)/4n_{A2} \quad (3)$$

$$TB2 = (\lambda \times j)/4n_{B2} \quad (4)$$

i and j represent integers not smaller than one.

$\lambda$ represents a center wavelength of the light (electromagnetic wave) reflected by the reflective film RM. In other words, the center of a wavelength band of the light the sensitivity of which is desired to be improved by the reflective film RM is the center wavelength $\lambda$. Therefore, the reflective film RM improves the sensitivity to the light having the wavelength in the vicinity of the center wavelength $\lambda$. For example, the center wavelength $\lambda$ is set to 700 nm or longer. Alternatively, for example, the center wavelength $\lambda$ is set within a range of 700 nm to 1100 nm. Alternatively, for example, the center wavelength $\lambda$ is set within a range of 800 nm to 950 nm.

$n_{A2}$ represents a real part of a complex refractive index of the interlayer film of the light absorbing layer 103. For example, in a case where the interlayer film includes a dielectric material containing silicon oxide as a main component, the refractive index $n_{A2}$ is approximately 1.35 to 1.5. Then, for example, in a case where i=1 is satisfied in equation (3), the thickness TA2 of the spacer is approximately 100 nm to 200 nm within the range of the center wavelength $\lambda$ of 700 nm to 1100 nm.

$n_{B2}$ represents a real part of a complex refractive index of the reflective film RM. For example, in a case where the reflective film RM includes a dielectric material having a high refractive index such as TaO, TfO, SiNx (silicon nitride), Ge, SiC, TiN, Ti, TiO2, and NgF2, the refractive index $n_{B2}$ is approximately 1.9 to 2.5. Then, for example, in a case where j=1 is satisfied in equation (4), the thickness TB2 of the reflective film RM is approximately 80 nm to 100 nm within the range of the center wavelength λ of 700 nm to 1100 nm.

Figure 34:
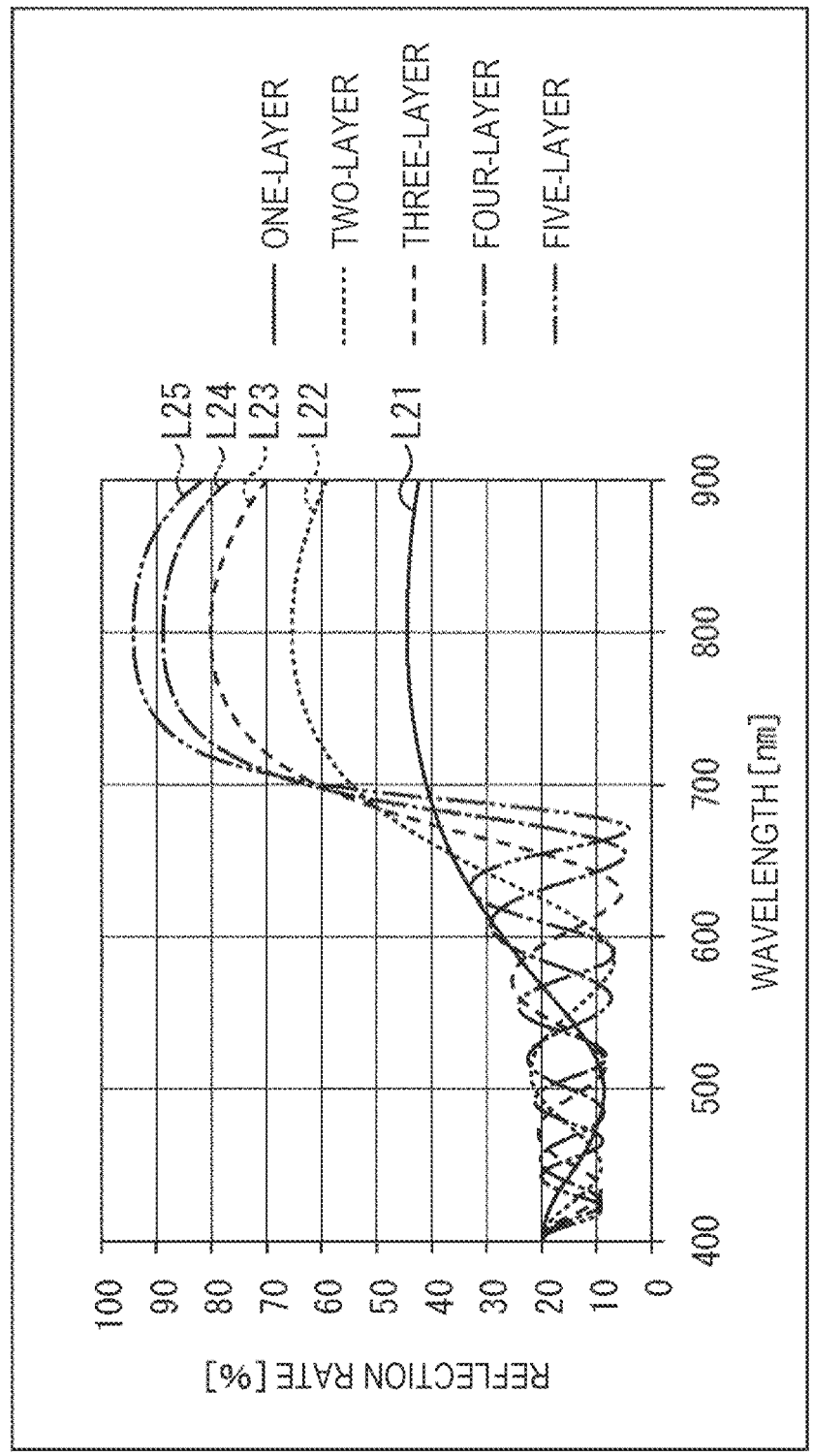
FIG. 34 is a graph illustrating a relationship between the number of layers of a multilayer-structure reflective film and a reflection rate.

FIG. 34 illustrates a relationship between the number of layers of the multilayer-structure reflective film RM and a reflection rate. Note that, the interlayer film of the wiring layer 101 includes silicon oxide, the light absorbing layer 103 includes silicon, and the reflective film RM includes silicon nitride. Furthermore, an example of a case where the reflective film RM is designed such that the reflection rate for light having a wavelength in the vicinity of 800 nm is maximized is herein illustrated.

In FIG. 34, the wavelength (nm) of the light is plotted along an abscissa axis and the reflection rate (%) is plotted along an ordinate axis. Furthermore, lines L21 to L25 indicate the reflection rates in cases where the reflective film RM is of one to five-layer, respectively.

As illustrated in this example, in the range of the wavelength of 700 nm or shorter, the reflection rate of the reflective film RM of each number of layers varies depending on the wavelength, and a magnitude relationship changes. On the other hand, in a range of the wavelength of 700 nm or longer, the reflection rate increases as the number of layers of the reflective film RM increases. Therefore, as the number of layers of the reflective film RM is increased, the sensitivity to infrared light of 700 nm or longer is improved.

Note that although an example of counting the number of layers of the reflective film only by the number of reflective films RM is illustrated in FIG. 34, it is also possible to count the number of layers by summing an interlayer film between the gate insulating film 102 and the reflective film RM, an interlayer film between adjacent reflective films RM, and an interlayer film between the lowermost reflective film RM and a metal wire 106. In this case, for example, the number of layers of the reflective film of the CMOS image sensor 10k in FIG. 33 is seven obtained by summing the reflective film RM of three layers and the interlayer film of four layers.

13. Twelfth Embodiment

Figure 35:
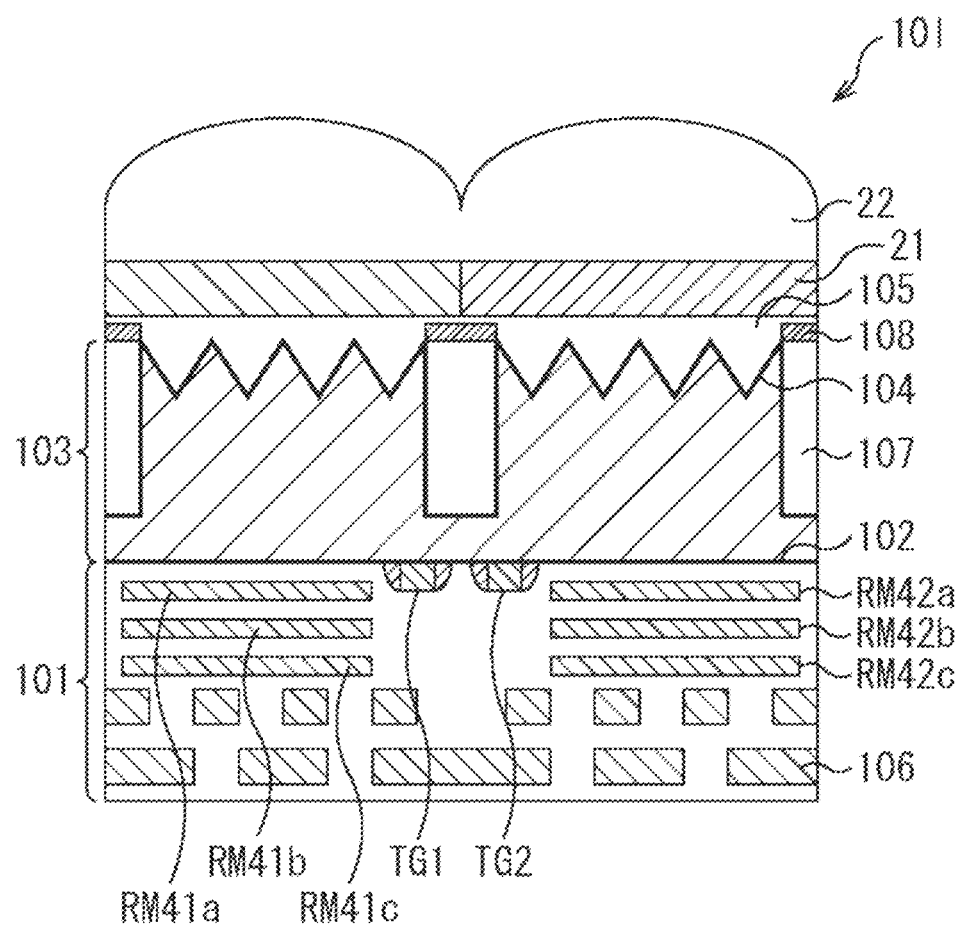
FIG. 35 is a cross-sectional view schematically illustrating a configuration example of a twelfth embodiment of the CMOS image sensor in FIG. 1.

FIG. 35 schematically illustrates a cross-section of a CMOS image sensor 10l being a twelfth embodiment of the CMOS image sensor 10. Note that, in the drawing, a portion corresponding to that in FIG. 33 is assigned with the same reference sign, and the description thereof is omitted as appropriate.

The CMOS image sensor 10l is different from the CMOS image sensor 10k in FIG. 33 in that a diffraction structure is formed on a light receiving surface of a light absorbing layer 103 as is the case with the CMOS image sensor 10c in FIG. 25. Therefore, the sensitivity of the CMOS image sensor 10l to the infrared light is improved more than that of the CMOS image sensor 10k.

14. Thirteenth Embodiment

Figure 36:
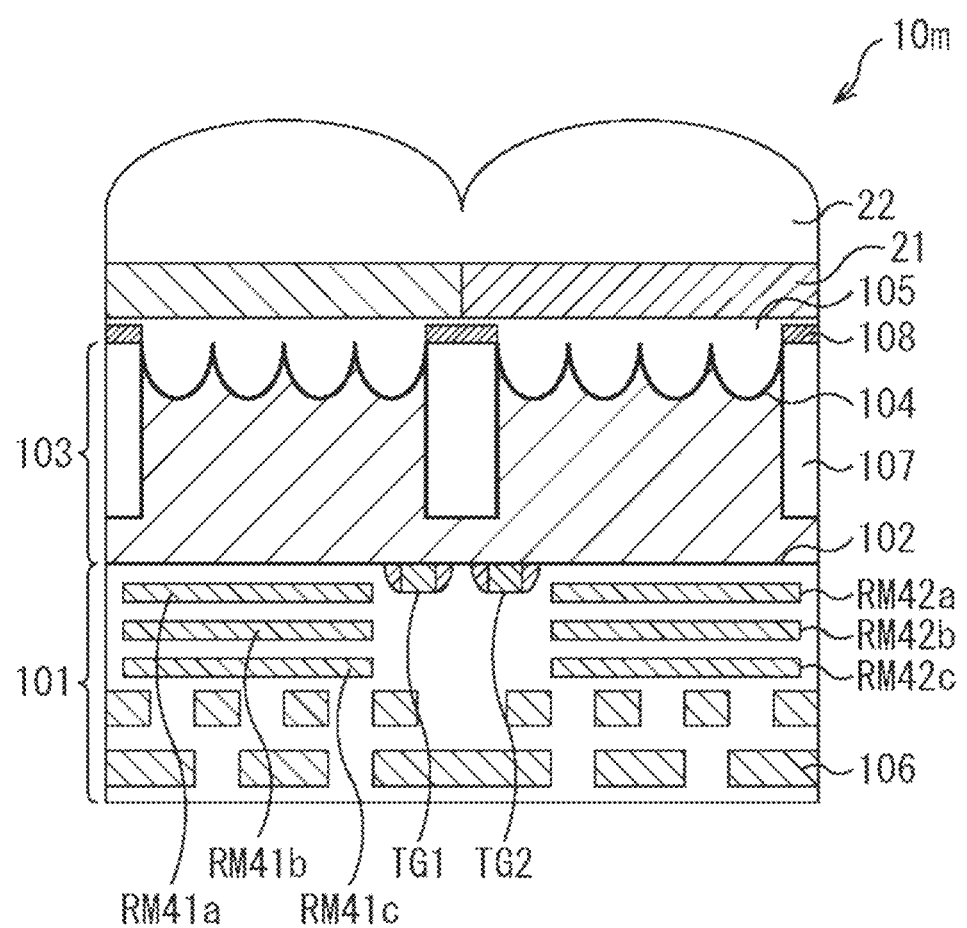
FIG. 36 is a cross-sectional view schematically illustrating a configuration example of a thirteenth embodiment of the CMOS image sensor in FIG. 1.

FIG. 36 schematically illustrates a cross-section of a CMOS image sensor 10m being a thirteenth embodiment of the CMOS image sensor 10. Note that, in the drawing, a portion corresponding to that in FIG. 33 is assigned with the same reference sign, and the description thereof is omitted as appropriate.

The CMOS image sensor 10m differs from the CMOS image sensor 10k in FIG. 33 in that a diffraction structure is formed on a light receiving surface of a light absorbing layer 103 as is the case with the CMOS image sensor 10d in FIG. 26. Therefore, the sensitivity of the CMOS image sensor 10m to the infrared light is improved more than that of the CMOS image sensor 10k.

15. Fourteenth Embodiment

Figure 37:
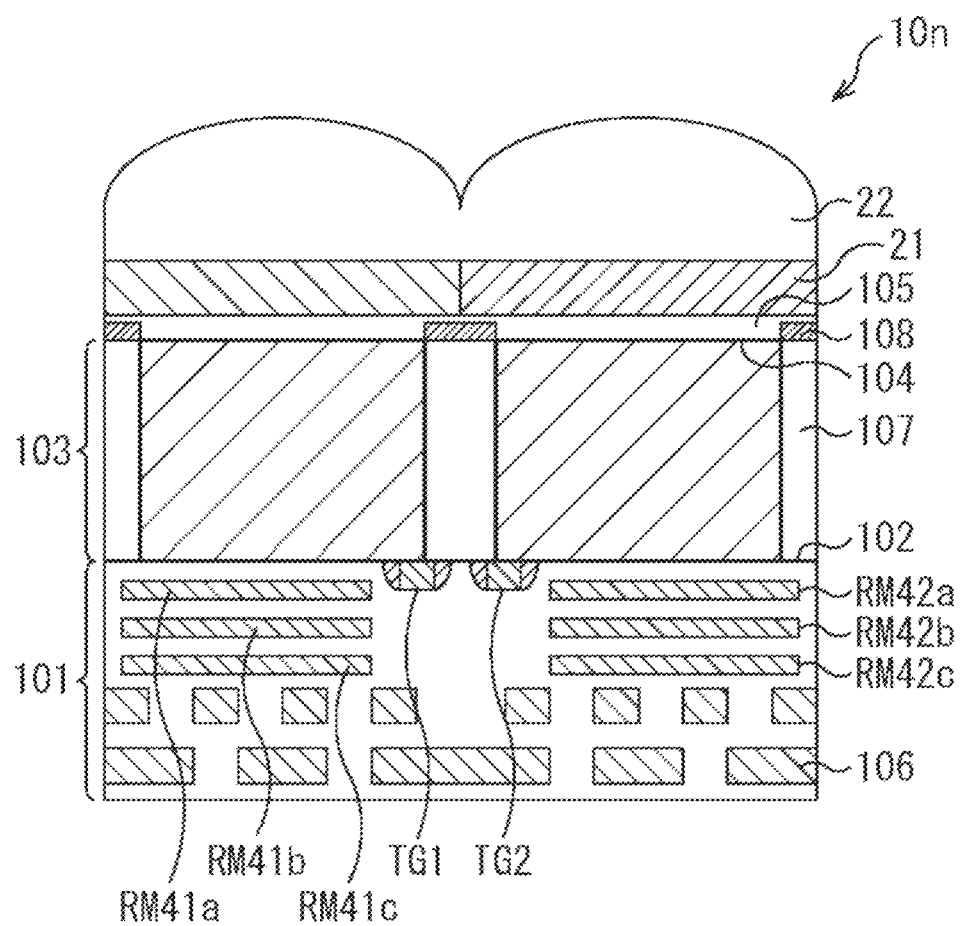
FIG. 37 is a cross-sectional view schematically illustrating a configuration example of a fourteenth embodiment of the CMOS image sensor in FIG. 1.

FIG. 37 schematically illustrates a cross-section of a CMOS image sensor 10n being a fourteenth embodiment of the CMOS image sensor 10. Note that, in the drawing, a portion corresponding to that in FIG. 33 is assigned with the same reference sign, and the description thereof is omitted as appropriate.

The CMOS image sensor 10n is different from the CMOS image sensor 10k in FIG. 33 in that an element separating unit 107 penetrates a light absorbing layer 103 as is the case with the CMOS image sensor 10e in FIG. 27. Therefore, leakage of light between pixels is suppressed in the CMOS image sensor 10n as compared with the CMOS image sensor 10k.

16. Fifteenth Embodiment

Figure 38:
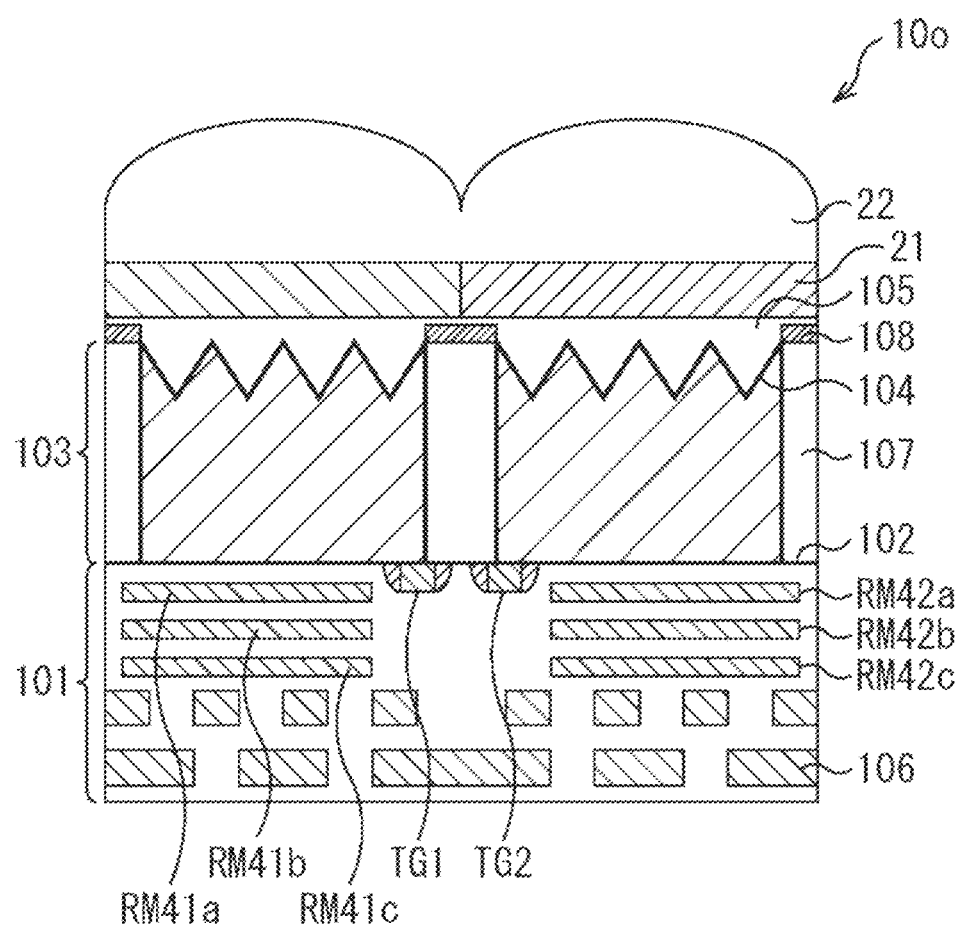
FIG. 38 is a cross-sectional view schematically illustrating a configuration example of a fifteenth embodiment of the CMOS image sensor in FIG. 1.

FIG. 38 schematically illustrates a cross-section of a CMOS image sensor 10o being a fifteenth embodiment of the CMOS image sensor 10. Note that, in the drawing, a portion corresponding to that in FIG. 35 is assigned with the same reference sign, and the description thereof is omitted as appropriate.

The CMOS image sensor 10o is different from the CMOS image sensor 10l in FIG. 35 in that an element separating unit 107 penetrates a light absorbing layer 103 as is the case with the CMOS image sensor 10f in FIG. 28. Therefore, leakage of light between pixels is suppressed in the CMOS image sensor 10o as compared with the CMOS image sensor 10l.

17. Sixteenth Embodiment

Figure 39:
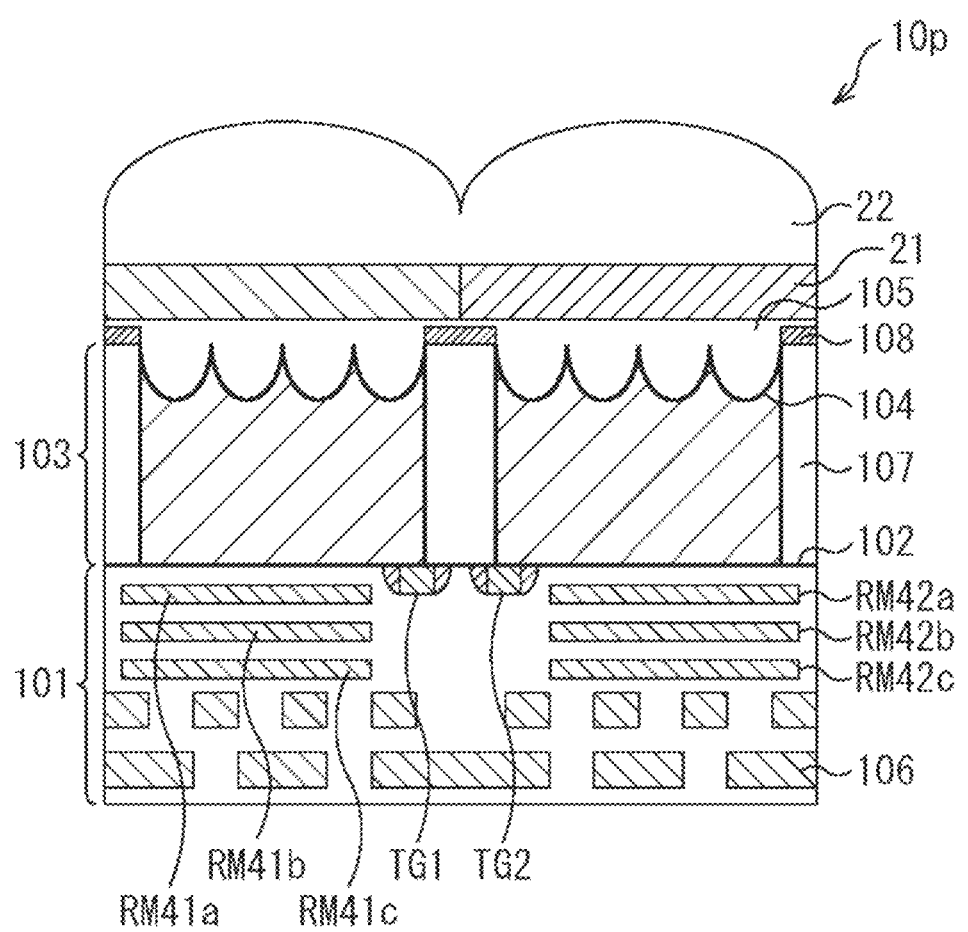
FIG. 39 is a cross-sectional view schematically illustrating a configuration example of a sixteenth embodiment of the CMOS image sensor in FIG. 1.

FIG. 39 schematically illustrates a cross-section of a CMOS image sensor 10p being a sixteenth embodiment of the CMOS image sensor 10. Note that, in the drawing, a portion corresponding to that in FIG. 36 is assigned with the same reference sign, and the description thereof is omitted as appropriate.

A CMOS image sensor 10p is different from the CMOS image sensor 10m in FIG. 36 in that an element separating unit 107 penetrates a light absorbing layer 103 as is the case with the CMOS image sensor 10g in FIG. 29. Therefore, leakage of light between pixels is suppressed in the CMOS image sensor 10p as compared with the CMOS image sensor 10m.

18. Seventeenth Embodiment

Figure 40:
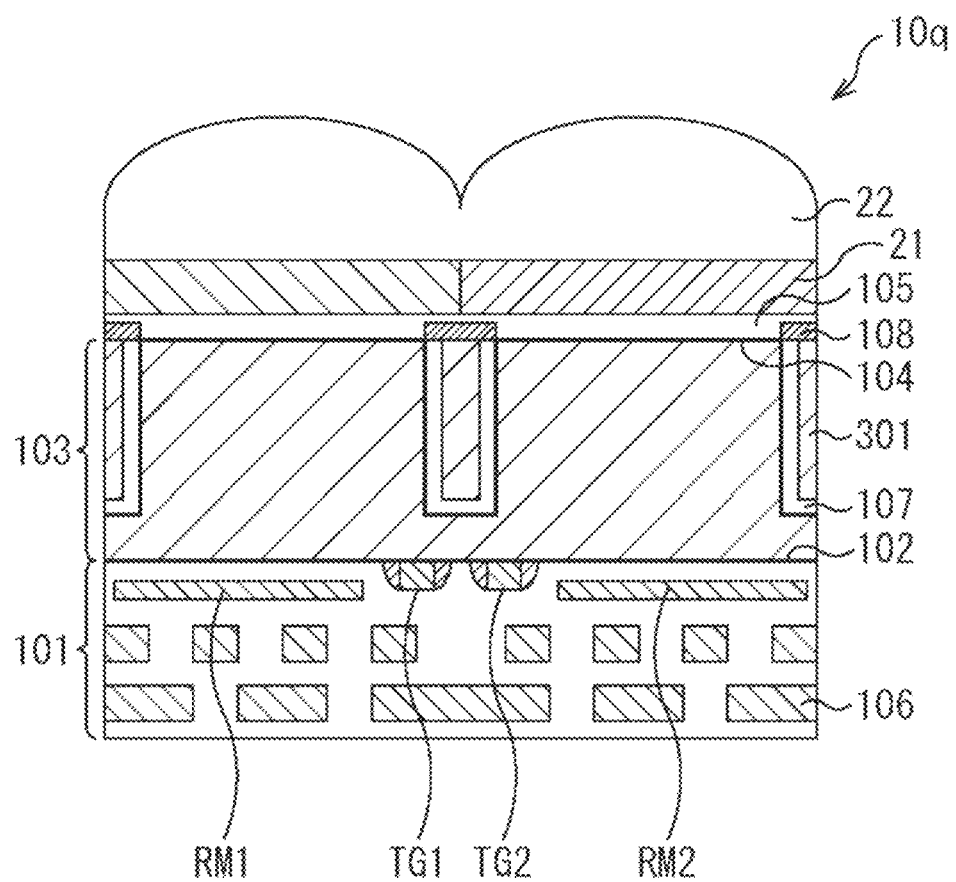
FIG. 40 is a cross-sectional view schematically illustrating a configuration example of a seventeenth embodiment of the CMOS image sensor in FIG. 1.

FIG. 40 schematically illustrates a cross-section of a CMOS image sensor 10q being a seventeenth embodiment of the CMOS image sensor 10. Note that, in the drawing, a portion corresponding to that in FIG. 10 is assigned with the same reference sign, and the description thereof is omitted as appropriate.

The CMOS image sensor 10q is different from the CMOS image sensor 10b in FIG. 10 in that a core 301 is formed in an element separating unit 107.

Figure 41:
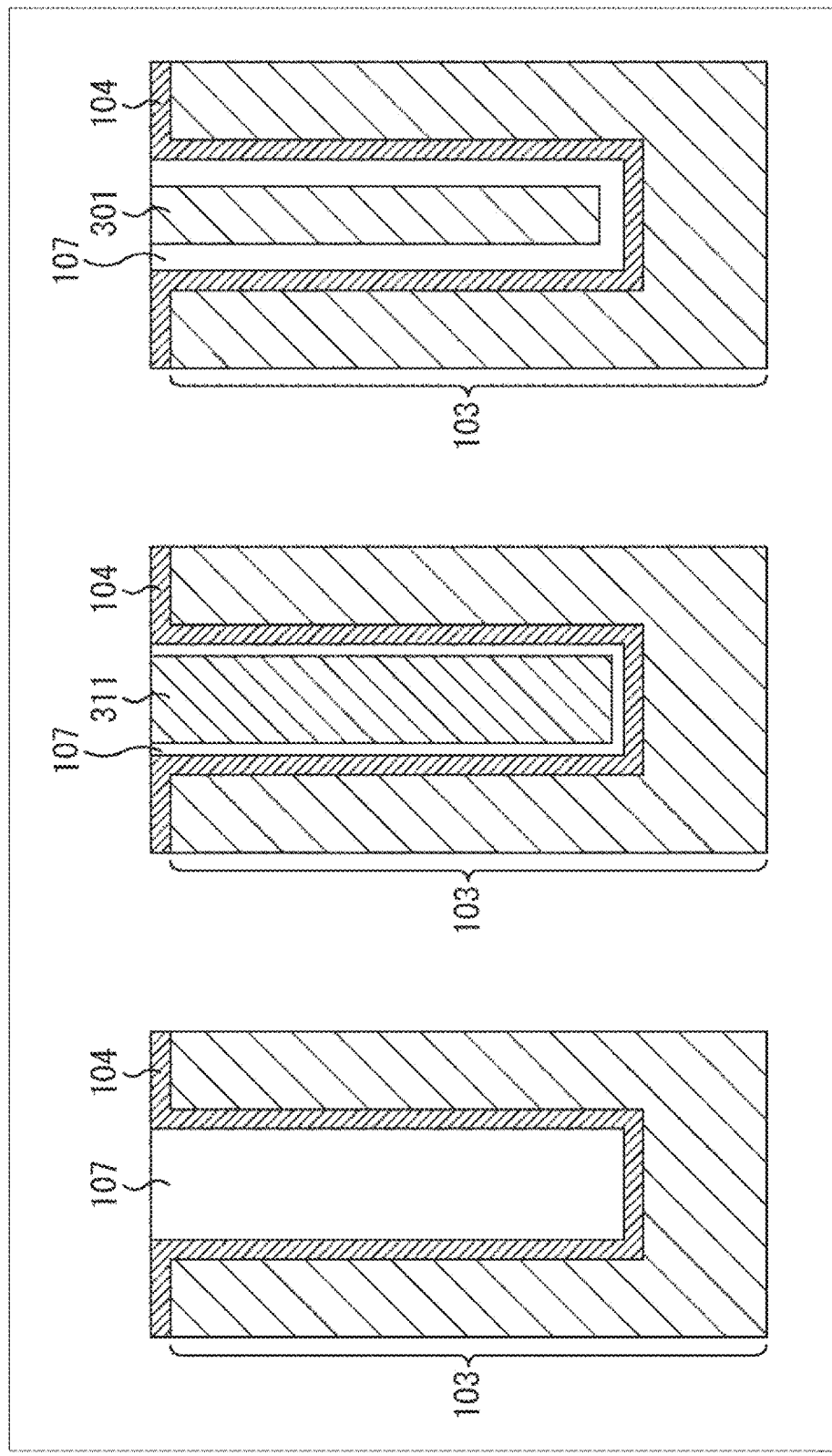
FIG. 41 is a view schematically illustrating a specific configuration example of an element separating unit.

FIG. 41 schematically illustrates a specific configuration example of the element separating unit 107.

A view on a left end illustrates an example in which the element separating unit 107 is filled only with a dielectric material as is the case with the CMOS image sensor 10b and the like in FIG. 10.

In an example of a view in the center, the element separating unit 107 is filled with a metal core 311. The core 311 includes, for example, a member containing as a main component metal which does not transmit visible light and near infrared light such as tungsten, tantalum, copper, aluminum, silver and the like. A periphery of the core 311 is thinly covered with a dielectric material containing silicon oxide or silicon nitride as a main component. In this case, a part of the visible light and near infrared light is absorbed by physical properties of the metal forming the core 311, so that the sensitivity is lowered correspondingly.

A view on a right end illustrates an example in which the core 301 including silicon is provided in the element separating unit 107 as is the case with the CMOS image sensor 10q in FIG. 40. The core 301 includes amorphous silicon, polysilicon, or single crystal silicon as a main component, for example. Then, the periphery of the core 301 is covered with a dielectric material containing silicon oxide or silicon nitride as a main component (hereinafter also referred to as cladding).

Here, with reference to FIGS. 42 to 48, a reflection characteristic of the element separating unit 107 in a case where the core 301 is provided is compared with a case where this is not provided. Note that, in examples in FIGS. 42 to 48, the light absorbing layer 103 and the core 301 include silicon and the element separating unit 107 is filled with the dielectric material including silicon oxide.

Figure 42:
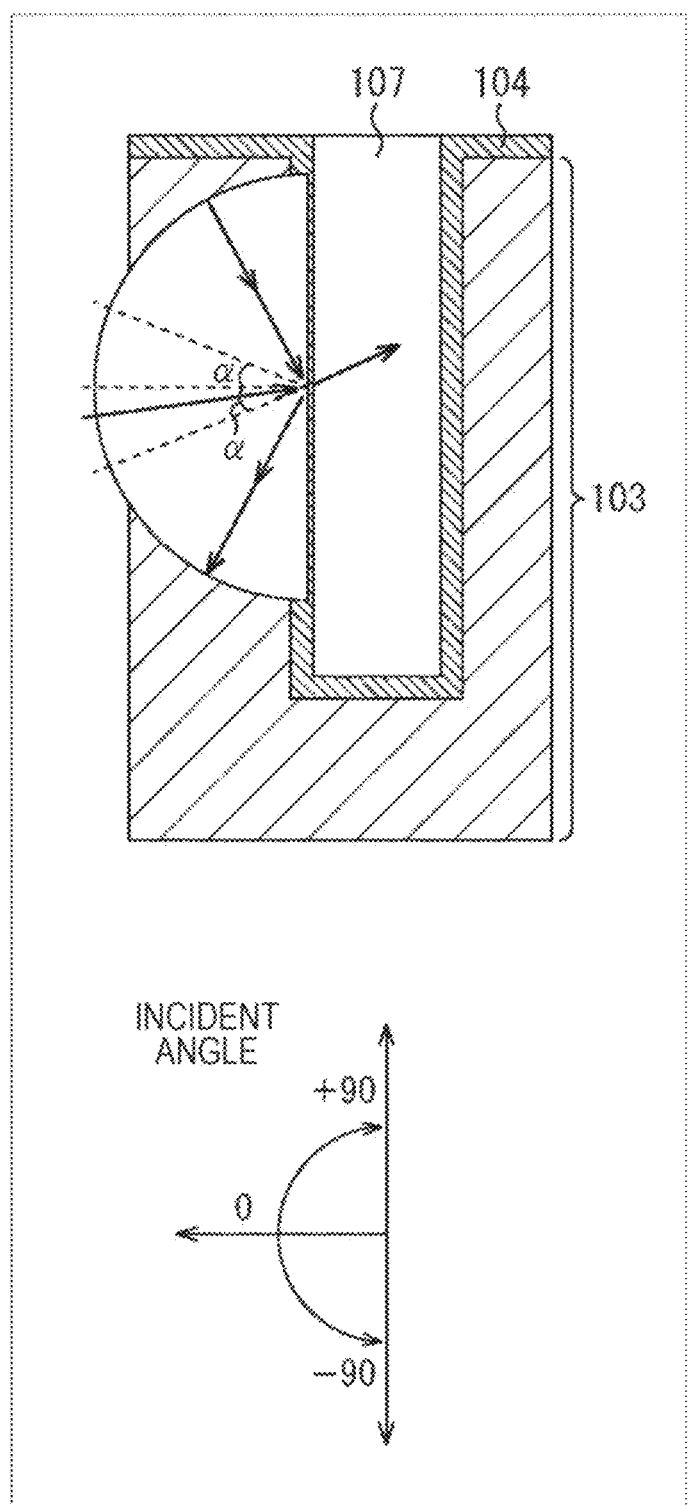
FIG. 42 is a view schematically illustrating an optical path of incident light to a side surface of the element separating unit in a case where no core is provided.

FIG. 42 schematically illustrates an optical path of light incident on a side surface of the element separating unit 107 in a case where the core 301 is not provided in the element separating unit 107. Note that, hereinafter, as illustrated in a lower part in FIG. 42, an incident angle of the light incident on the side surface of the element separating unit 107 is positive above a reference direction and negative below the same while setting a direction perpendicular to the side surface of the element separating unit 107 as reference (0°).

The incident light of which absolute value of an incident angle is not smaller than a critical angle α is totally reflected at a boundary surface between the light absorbing layer 103 and the element separating unit 107 (more strictly, the boundary surface between an antireflective film 104 and the element separating unit 107) to be confined within the same pixel 70. On the other hand, the incident light the absolute value of the incident angle of which is smaller than the critical angle α passes through the side surface of the element separating unit 107 and leaks out of the pixel 70.

Figure 43:
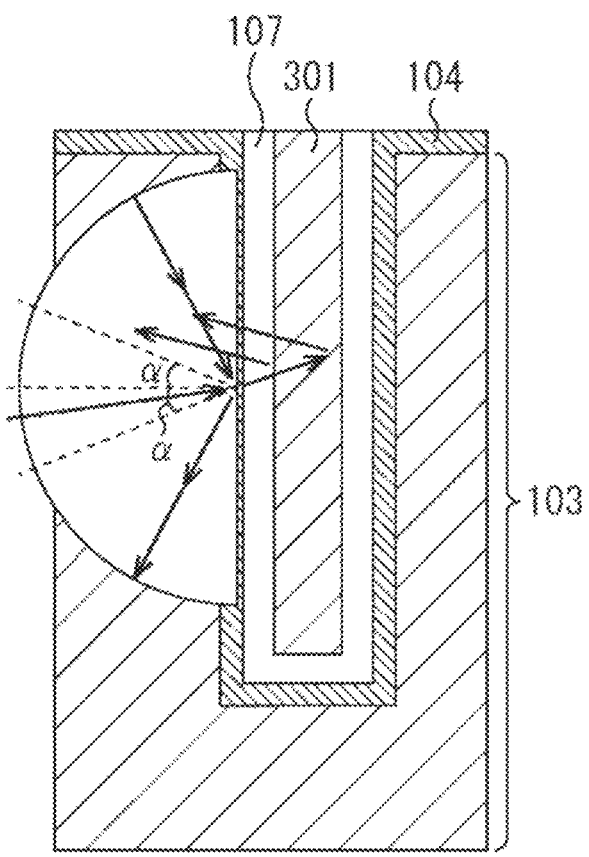
FIG. 43 is a view schematically illustrating the optical path of the incident light to the side surface of the element separating unit in a case where the core is provided.

On the other hand, FIG. 43 schematically illustrates an optical path of the light incident on the side surface of the element separating unit 107 in a case where the core 301 is provided in the element separating unit 107.

The incident light of which absolute value of the incident angle is not smaller than the critical angle α is totally reflected at the boundary surface between the light absorbing layer 103 and the element separating unit 107 (more strictly, the boundary surface between the antireflective film 104 and the element separating unit 107) to be confined within the same pixel 70 as is the case where the core 301 is not provided in FIG. 42. On the other hand, the incident light the absolute value of the incident angle of which is smaller than the critical angle α passes through the side surface of the element separating unit 107.

Here, the silicon oxide forming the cladding around the core 301 and the silicon forming the core 301 have different refractive indices. In other words, silicon has a larger refractive index than silicon oxide. Therefore, a part of the transmitted light transmitted through the side surface of the element separating unit 107 is reflected at the boundary surface between the cladding and the core 301, and is incident again on the light absorbing layer 103. Furthermore, a part of the light which passes through the boundary surface between the cladding and the core 301 and enters the core 301 is reflected at the boundary surface between the core 301 and the cladding and is incident again on the light absorbing layer 103.

In this manner, by providing the core 301, the reflection rate for the incident light on the side surface of the element separating unit 107 increases, and as a result, the sensitivity of the pixel 70 is improved.

Figure 44:
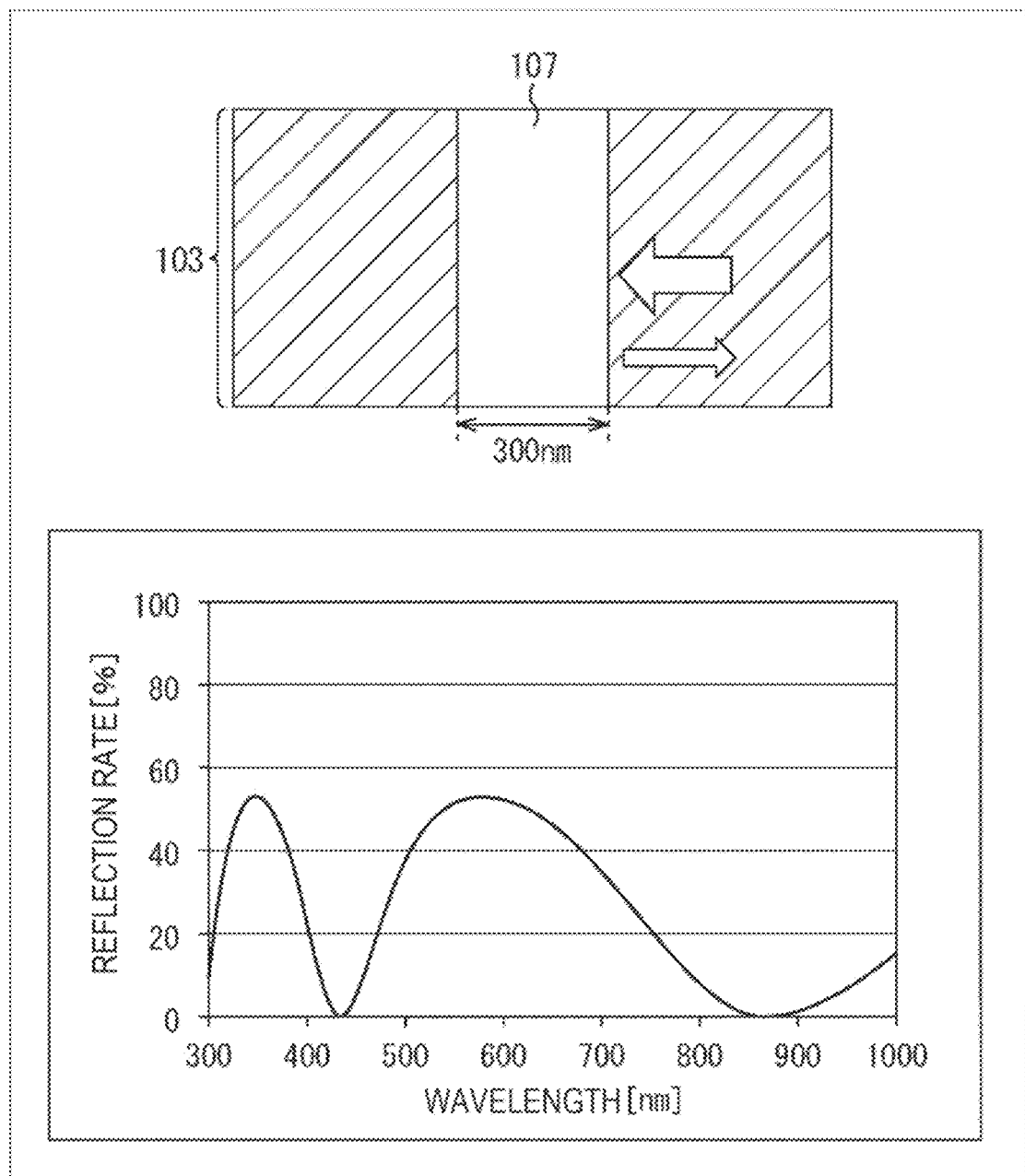
FIG. 44 is a graph illustrating an example of a reflection characteristic of the element separating unit in a case where no core is provided.

FIG. 44 illustrates an example of the reflection characteristic of the element separating unit 107 with respect to the incident light the incident angle of which is 0° in a case where the core 301 is not provided. In this example, a thickness of the element separating unit 107 (width in a direction in which the pixels 70 are adjacent) is set to 300 nm.

Figure 45:
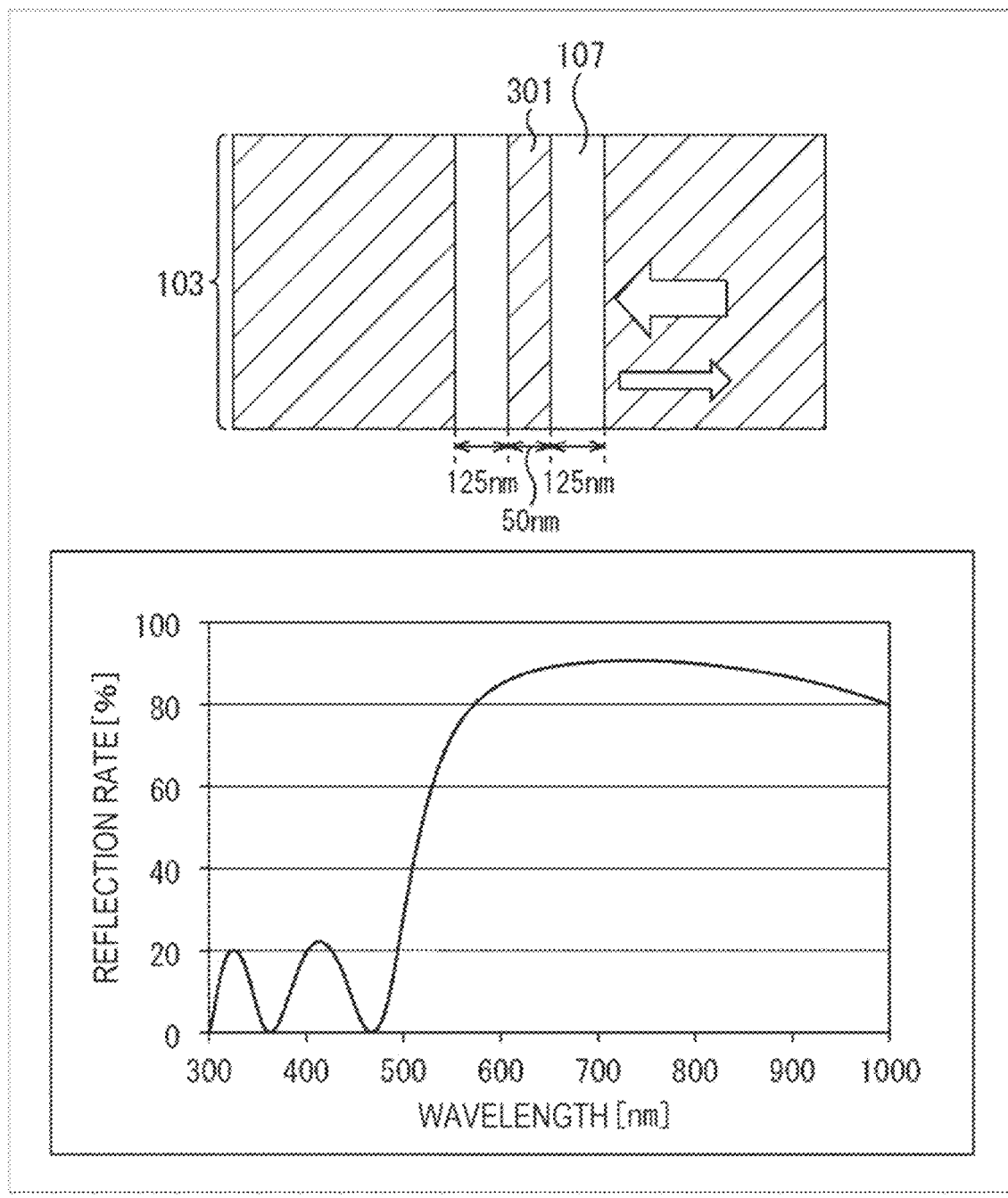
FIG. 45 is a graph illustrating an example of the reflection characteristic of the element separating unit in a case where the core is provided.

On the other hand, FIG. 45 illustrates an example of the reflection characteristic of the element separating unit 107 with respect to the incident light the incident angle of which is 0° in a case where the core 301 is provided on the element separating unit 107. In this example, the thickness of the element separating unit 107 is set to 300 nm, a thickness of the core 301 (the width in the direction in which the pixels 70 are adjacent) is set to 50 nm, an interval between the core 301 and the side surface of the element separating unit 107 (width of the cladding) is set to 125 nm.

Furthermore, a wavelength (nm) of the incident light is plotted along an abscissa axis of a graph on a lower side of FIGS. 44 and 45, and a reflection rate (%) is plotted along an ordinate axis.

In a case where the core 301 is provided, the reflection rate for the light having the wavelength of about 500 nm or longer is higher than in a case where the core 301 is not provided. For example, for the light having the wavelength of about 570 nm or longer, the reflection rate is 80% or larger. Furthermore, the reflection rate is high such as from 80% to 90% for the light having the wavelength in the vicinity of about 700 nm. On the other hand, in a case where the core 301 is not provided, the reflection rate is about 50% at the maximum in all the wavelength bands.

Note that in a case where the core 301 is provided, the reflection rate for the light having the wavelength of about 500 nm or shorter is lower on average than in a case where the core 301 is not provided.

FIGS. 46 to 48 illustrates an example of comparing the reflection characteristic with respect to the light of each wavelength between the case where the core 301 is not provided as illustrated in FIG. 44 and the case where the core 301 is provided as illustrated in FIG. 45. Note that, in the examples in FIGS. 46 to 48, the thicknesses of the element separating unit 107 and the core 301 are similar to those in the examples illustrated in FIGS. 44 and 45.

The incident angle (°) is plotted along an abscissa axis and the reflection rate (%) is plotted along an ordinate axis in each graph in FIGS. 46 to 48. Furthermore, a graph in an upper portion in FIG. 46 illustrates the reflection characteristic in a case where the wavelength λ of the incident light is 450 nm and a graph in a lower portion illustrates the reflection characteristic in a case where the wavelength λ is 550 nm. A graph in an upper portion in FIG. 47 illustrates the reflection characteristic in a case where the wavelength λ is 650 nm and a graph in a lower portion illustrates the reflection characteristic in a case where the wavelength λ is 750 nm. A graph in an upper portion in FIG. 48 illustrates the reflection characteristic in a case where the wavelength λ is 850 nm and a graph in a lower portion illustrates the reflection characteristic in a case where the wavelength λ is 950 nm. Furthermore, in each graph, a solid curve indicates the reflection characteristic in a case where the core 301 is provided, and a dotted curve indicates the reflection characteristic in a case where the core 301 is not provided.

Note that, a critical angle of a boundary surface between silicon forming the light absorbing layer 103 and silicon oxide filled in the element separating unit 107 is about 24°. Accordingly, in the graphs in FIGS. 46 to 48, in a range where the incident angle is about −24° or smaller and about 24° or larger, the reflection rate is substantially 100% and is equal in a case where the core 301 is provided and in a case where this is not provided. Therefore, hereinafter, the case where the absolute value of the incident angle is smaller than the critical angle is mainly described.

In a case where the wavelength λ is 450 nm, the reflection rate becomes higher when the core 301 is not provided than when the core 301 is provided in an incident angle range of about −15° to about 15°. On the other hand, the reflection rate is higher when the core 301 is provided than when the core 301 is not provided in the incident angle range of about −24° to about −15° and in the incident angle range of about −15° to about −24°.

In a case where the wavelength λ is 550 nm, 650 nm, 750 nm, and 850 nm, the reflection rate becomes higher when the core 301 is provided than when the core 301 is not provided within a range in which the absolute value of the incident is smaller than the critical angle.

In a case where the wavelength λ is 950 nm, the reflection rate becomes higher when the core 301 is provided than when the core 301 is not provided within the incident angle range of about −18° to about 18°. On the other hand, the reflection rate is higher when the core 301 is not provided than when the core 301 is provided in the incident angle range of about −24° to about −18° and about 18° to about 24°.

As described above, in a case where the core 301 is provided, the reflection rate of the element separating unit 107 for the infrared light is higher at most incident angles than in a case where the core 301 is not provided. As a result, the sensitivity to the infrared light is improved when the core 301 is provided.

Figure 49:
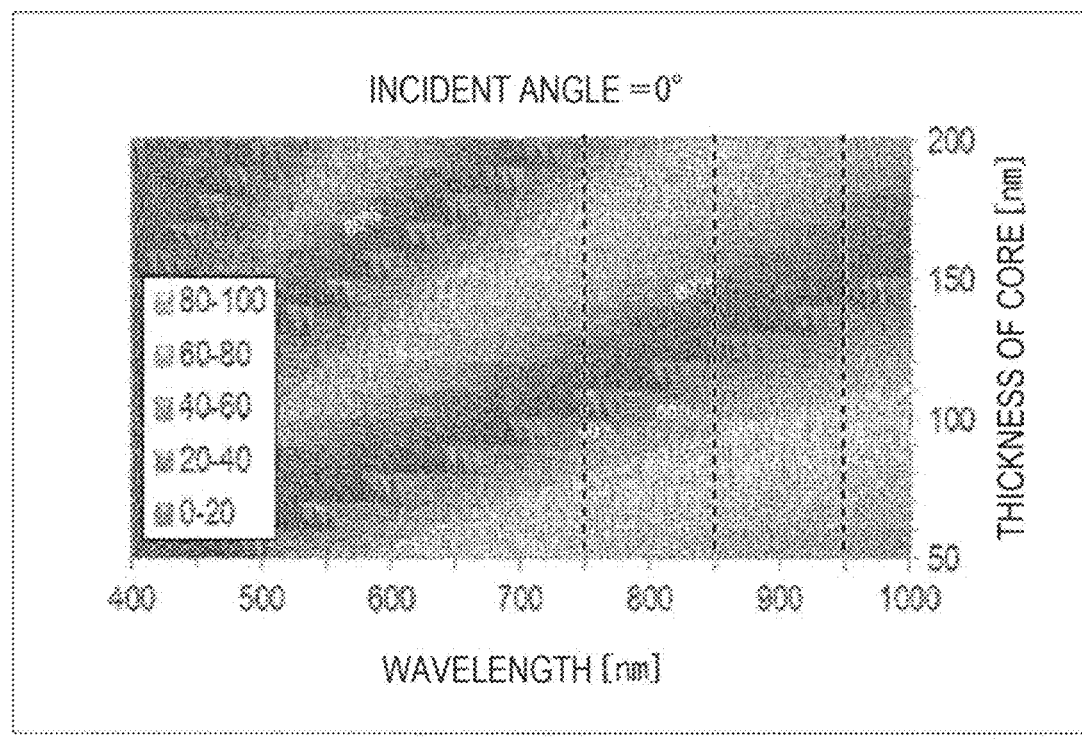
FIG. 49 is a graph illustrating an example of the reflection characteristic of the element separating unit with respect to a thickness of the core.
Figure 50:
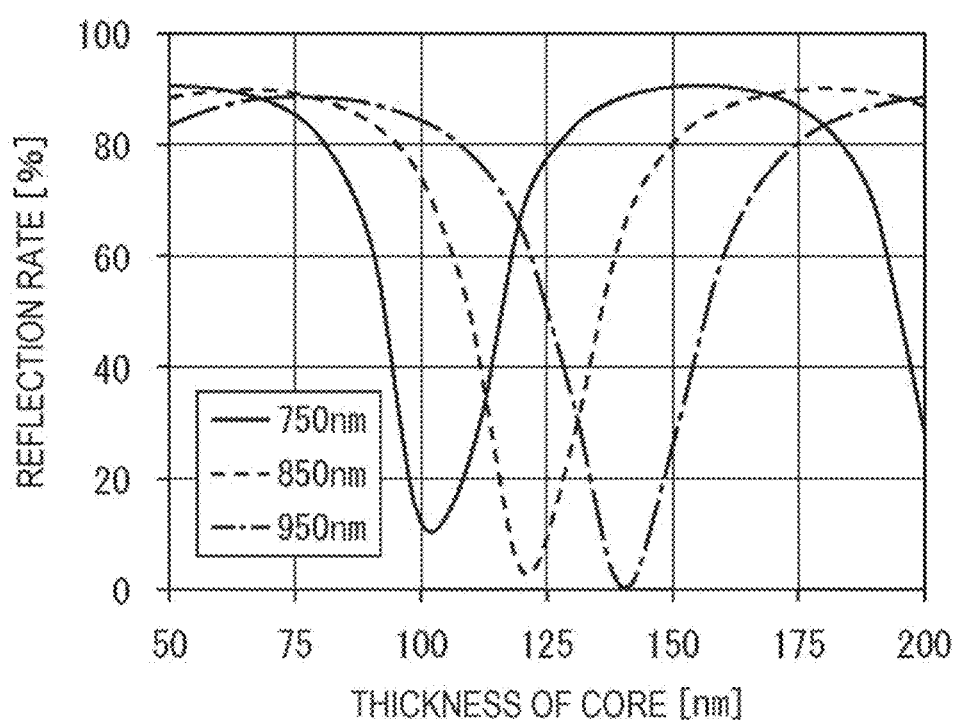
FIG. 50 is a graph illustrating an example of the reflection characteristic of the element separating unit with respect to the thickness of the core.

Next, with reference to FIGS. 49 and 50, the reflection characteristic of the element separating unit 107 with respect to the thickness of the core 301 is described.

FIG. 49 illustrates an example of the reflection characteristic of the element separating unit 107 with respect to the incident light the incident angle of which is 0°. In FIG. 49, the wavelength (nm) of the incident light is plotted along an abscissa axis and the thickness (nm) of the core 301 is plotted along an ordinate axis. Furthermore, in FIG. 49, the reflection rate is divided into regions of 0 to 20%, 20 to 40%, 40 to 60%, 60 to 80%, and 80 to 100%, and the regions are distinguished from one another by shade of color. Specifically, the color becomes darker as the reflection rate is lower, and the color becomes thinner as the reflection rate is higher.

FIG. 50 is a graph of a change in reflection rate with respect to the thickness of the core 301 in a case where the wavelength is 750 nm, a case where the wavelength is 850 nm, and a case where the wavelength is 950 nm indicated by a dotted supplementary line in the graph in FIG. 49. In FIG. 50, the thickness (nm) of the core is plotted along an abscissa axis and the reflection rate (%) is plotted along an ordinate axis. A solid curve indicates the reflection rate in a case where the thickness of the core 301 is 750 nm, a dotted curve indicates the reflection rate in a case where the thickness of the core 301 is 850 nm, and a dashed-dotted curve indicates the reflection rate in a case where the thickness of the core 301 is 950 nm.

As illustrated in FIGS. 49 and 50, the reflection rate of the element separating unit 107 changes depending on the thickness of the core 301 and the wavelength of the incident light. Furthermore, the reflection characteristic of the element separating unit 107 with respect to the wavelength of the incident light exhibits different changes as the thickness of the core 301 is different, and in a case where the thickness of the core 301 is the same, the reflection rate of the element separating unit 107 periodically changes non linearly with respect to the wavelength of the incident light. On the other hand, the reflection characteristic of the element separating unit 107 with respect to the thickness of the core 301 exhibits different changes as the wavelength of the incident light is different, and in a case where the wavelength of the incident light is the same, the reflection rate of the element separating unit 107 periodically changes non linearly with respect to the thickness of the core 301.

Therefore, for example, by adjusting the thickness of the core 301 and the thickness of the dielectric material (cladding) around the core 301 on the basis of the reflection characteristic illustrated in FIGS. 49 and 50, the reflection rate for the incident light having a desired wavelength may be increased.

For example, in a case of increasing the reflection rate for the infrared light, the thickness of the core 301 is set within a range of 50 nm to 200 nm, and the thickness of the cladding around the core 301 is set within a range of 50 nm to 200 nm. Especially, by making the core 301 thin (for example, set within the range of 50 nm to 100 nm) on the basis of the reflection characteristic in FIG. 49, a high reflection rate may be obtained for the light in a wide wavelength band from 700 nm to 1000 nm.

19. Eighteenth Embodiment

Figure 51:
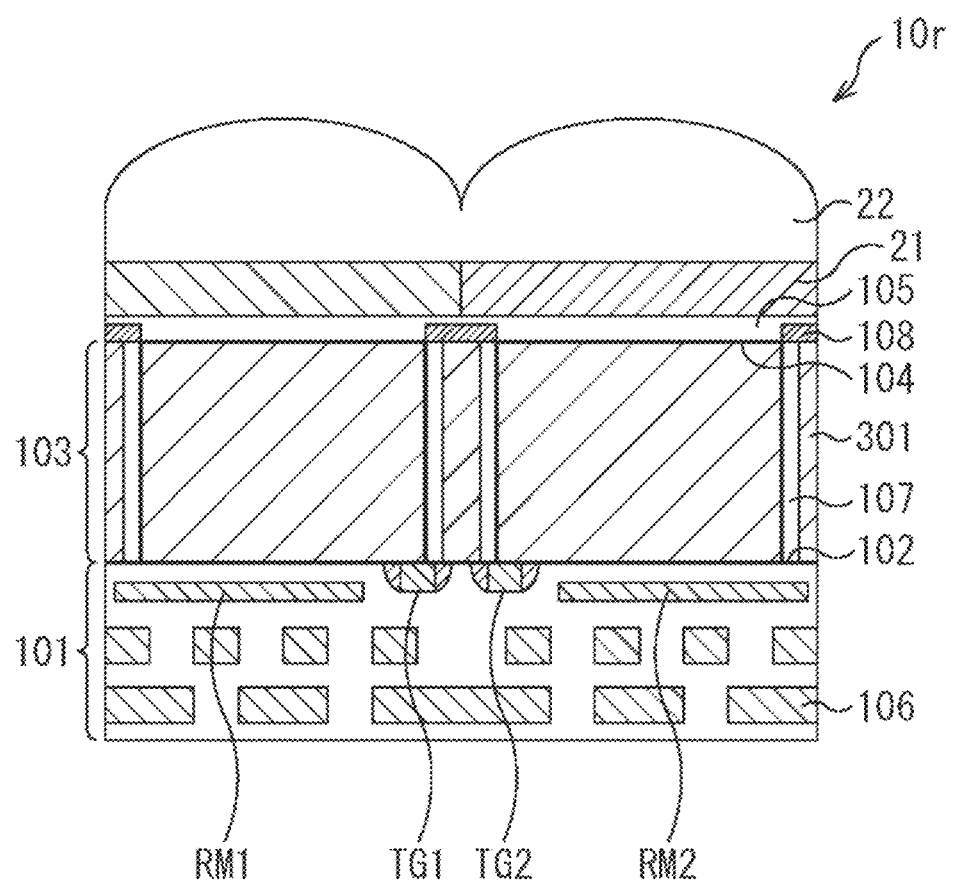
FIG. 51 is a cross-sectional view schematically illustrating a configuration example of an eighteenth embodiment of the CMOS image sensor in FIG. 1.

FIG. 51 schematically illustrates a cross-section of a CMOS image sensor 10r being an eighteenth embodiment of the CMOS image sensor 10. Note that, in the drawing, a portion corresponding to that in FIG. 40 is assigned with the same reference sign, and the description thereof is omitted as appropriate.

The CMOS image sensor 10r differs from the CMOS image sensor 10q in FIG. 40 in that an element separating unit 107 and a core 301 pass through a light absorbing layer 103 and reach a bottom surface of the light absorbing layer 103.

Therefore, light leakage between pixels is suppressed. Furthermore, the reflection rate of the element separating unit 107 increases and the sensitivity of the pixel 70 is improved.

20. Variation

Hereinafter, a variation of the embodiments of the present technology described above is described.

The embodiments of the present technology described above and the variation may be combined with each other as much as possible.

For example, the variation of the reflective film RM described above with reference to FIGS. 19 to 24 may be applied to the CMOS image sensor 10c to the CMOS image sensor 10r.

For example, in a case where the reflective film RM has the stacked structure as in the CMOS image sensor 10k in FIG. 33, it is possible to provide irregularities on the surface of the reflective film RM the closest to the light absorbing layer 103, for example, as is the case with the CMOS image sensor 10h in FIG. 30.

For example, in a case where the core 301 is provided in the element separating unit 107 as is the case with the CMOS image sensor 10q in FIG. 40 and the CMOS image sensor 10r in FIG. 51, the diffraction structure may be formed on the light receiving surface of the light absorbing layer 103 as is the case with the CMOS image sensor 10c in FIG. 25 or the CMOS image sensor 10d in FIG. 26. Furthermore, for example, in a case where the core 301 is provided in the element separating unit 107 as is the case with the CMOS image sensor 10q in FIG. 40 and the CMOS image sensor 10r in FIG. 51, the reflective film RM may have the stacked structure as is the case with the CMOS image sensor 10k in FIG. 33.

Furthermore, in the present technology, the configuration of the unit pixel is not limited to the configuration in FIG. 3, and may be arbitrarily changed. For example, a charge holding unit or the like for realizing a global shutter may be provided within a unit pixel.

Moreover, in the present technology, the configuration of sharing by pixels is not limited to the configuration in FIG. 4 and the like, and may be arbitrarily changed. Furthermore, the sharing by pixels is not always necessary.

Furthermore, the present technology may be applied to a back side irradiation imaging element other than the CMOS image sensor.

21. Application Example

<Application Example of Present Technology>

Figure 52:
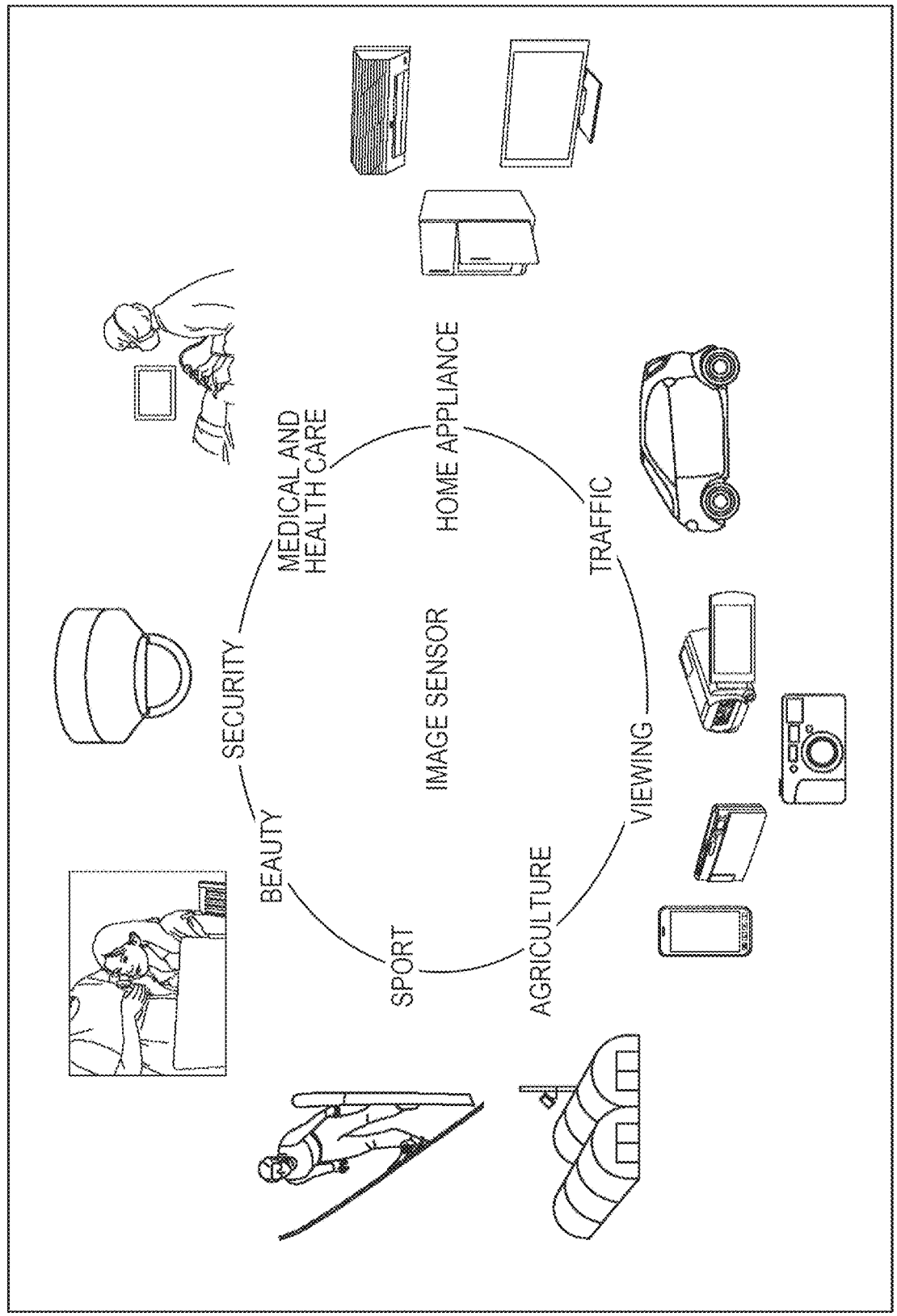
FIG. 52 is a view illustrating an application example of an imaging element.

For example, as illustrated in FIG. 52, the present technology is applicable to various cases of sensing light such as visible light, infrared light, ultraviolet light, and X-ray.

A device which takes an image to be used for viewing such as a digital camera and a portable device with a camera function A device for traffic purpose such as an in-vehicle sensor which takes images of the front, rear, surroundings, interior and the like of an automobile, a surveillance camera for monitoring traveling vehicles and roads, and a ranging sensor which measures a distance between vehicles and the like for safe driving such as automatic stop, recognition of a driver's condition, and the like A device for home appliance such as a television, a refrigerator, and an air conditioner which takes an image of a user gesture and performs device operation according to the gesture A device for medical and health care use such as an endoscope and a device which performs angiography by receiving infrared light A device for security use such as a security monitoring camera and an individual certification camera A device for beauty care such as a skin condition measuring device which takes an image of skin and a microscope which takes an image of scalp A device for sporting use such as an action camera and a wearable camera for sporting use and the like A device for agricultural use such as a camera for monitoring land and crop states A more specific application example is described below.

<Application Example to Electronic Device>

Figure 53:
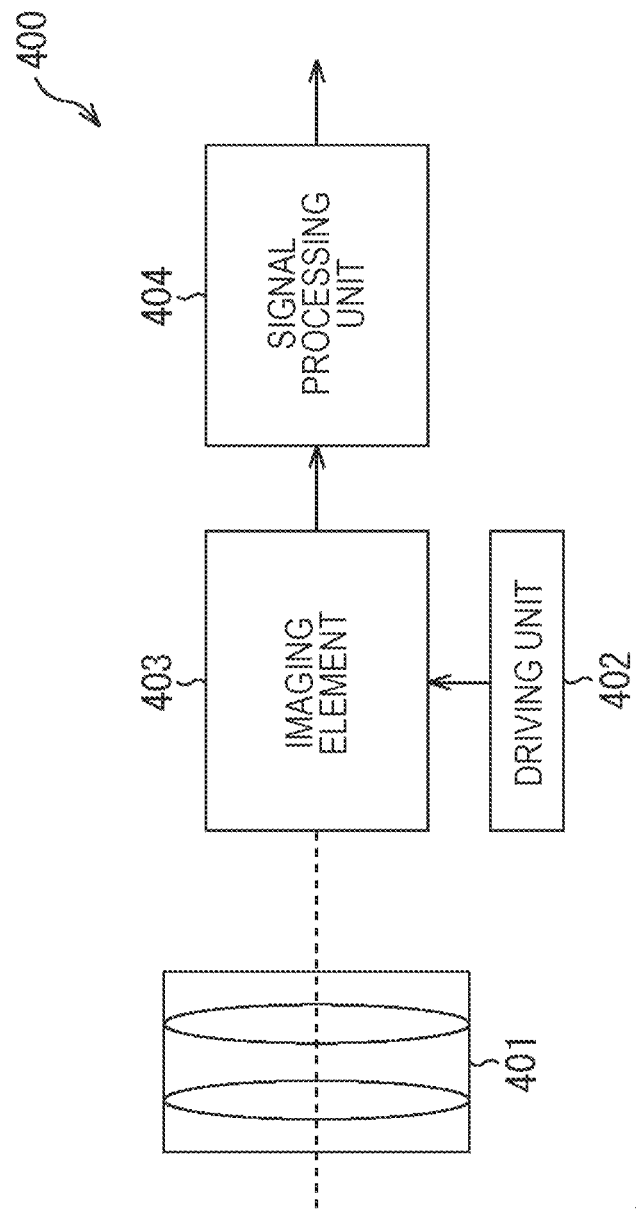
FIG. 53 is a block diagram illustrating a configuration example of an electronic device.

FIG. 53 illustrates a configuration example of an electronic device to which the present technology is applied.

An electronic device 400 is provided with an optical system configuring unit 401, a driving unit 402, an imaging element 403, and a signal processing unit 404.

The optical system configuring unit 401 configured by an optical lens or the like allows an optical image of a subject to be incident on the imaging element 403. The driving unit 402 controls driving of the imaging element 403 by generating and outputting various timing signals regarding driving of an interior of the imaging element 403. The signal processing unit 404 performs predetermined signal processing on an image signal output from the imaging element 403 and executes processing according to a signal processing result. Furthermore, the signal processing unit 404 outputs the image signal of the signal processing result to a subsequent stage, and records the same in a recording medium such as a solid-state memory, for example, or transfers the same to a predetermined server via a predetermined network.

Here, by using the above-described CMOS image sensors 10b to 10r as the imaging element 403, improvement in sensitivity to the infrared light and suppression of the variation in sensitivity may be realized.

Figure 54:
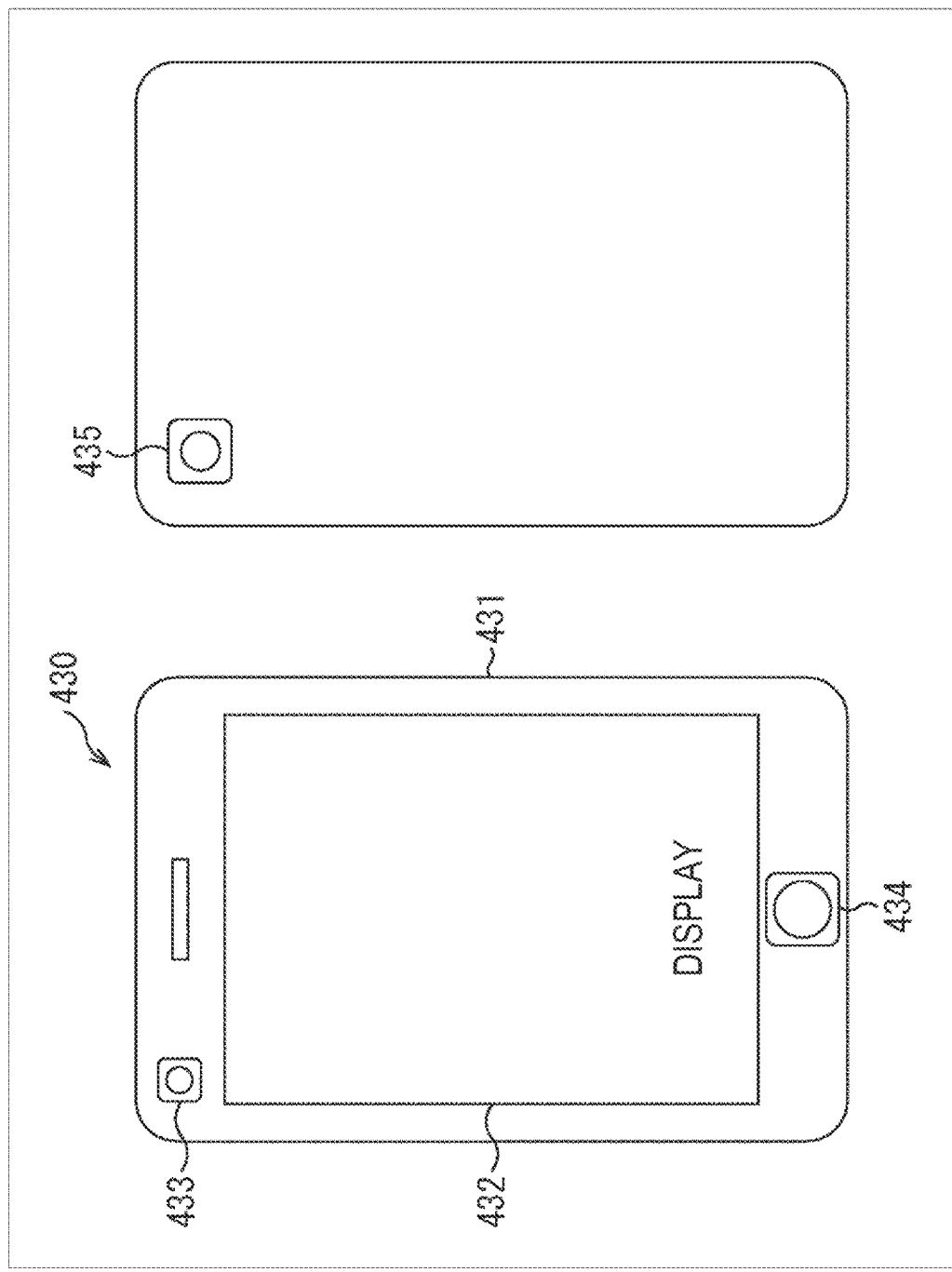
FIG. 54 is a block diagram illustrating a configuration example of a portable information terminal.

FIG. 54 illustrates a configuration example of a portable information terminal which is a specific example of the electronic device 400 in FIG. 53.

A portable information terminal 430 in FIG. 54 is a smartphone. A display 432, a camera 433, and an operating unit 434 are provided on a front face of a housing 431 of the portable information terminal 430. On a back face of the housing 431, a camera 435 is provided.

Here, by using the above-described CMOS image sensors 10b to 10r as the cameras 433 and 435, improvement in sensitivity to the infrared light and suppression of the variation in sensitivity may be realized.

<Application Example to Mobile Body>

Furthermore, for example, the technology according to the present disclosure (present technology) may be realized as a device mounted on any type of mobile body such as an automobile, an electric automobile, a hybrid electric automobile, a motorcycle, a bicycle, a personal mobility, an airplane, a drone, a ship, and a robot.

Figure 55:
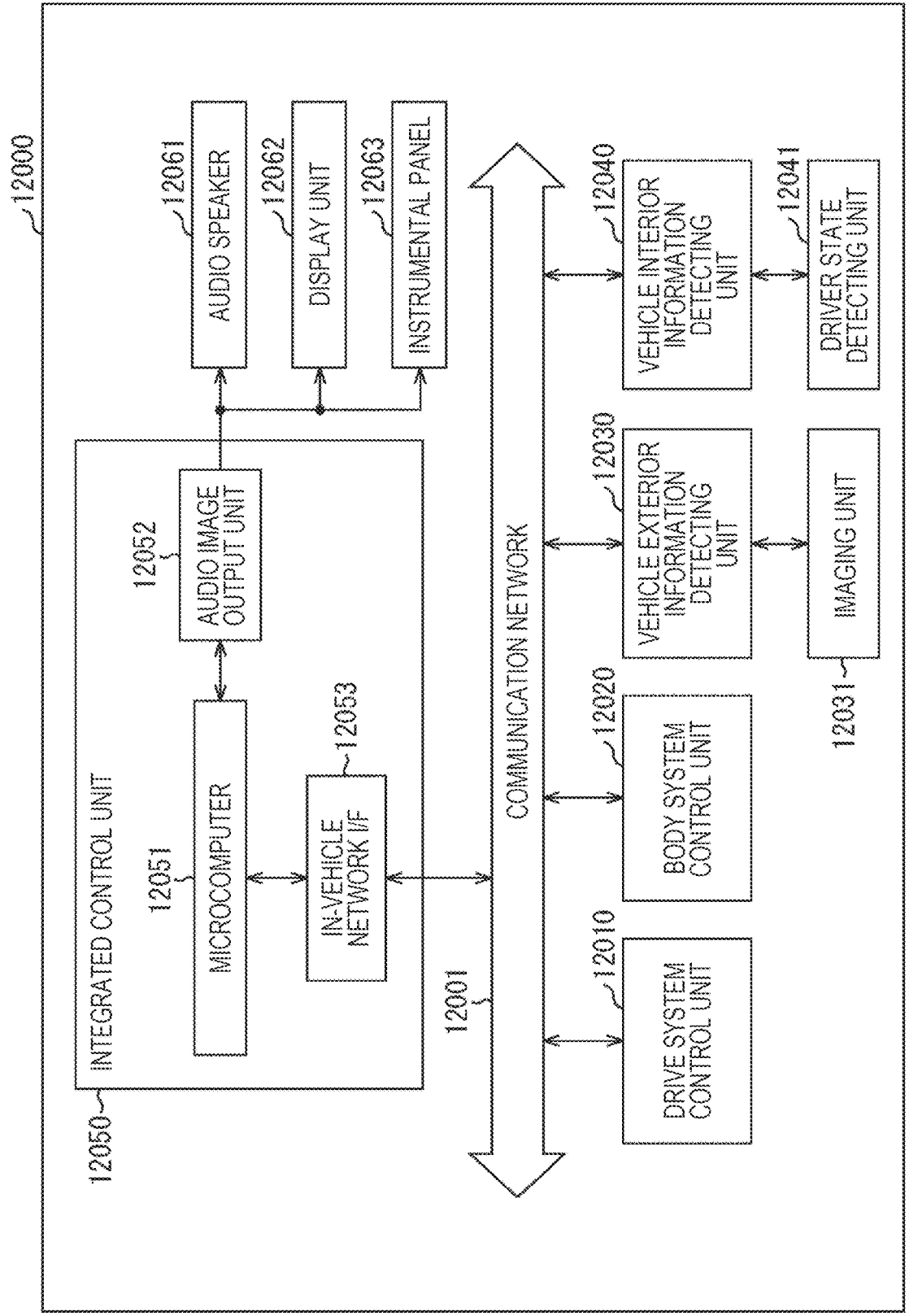
FIG. 55 is a block diagram illustrating an example of a schematic configuration of a vehicle control system.

FIG. 55 is a block diagram illustrating a schematic configuration example of a vehicle control system which is an example of a mobile body control system to which the technology according to the present disclosure may be applied.

A vehicle control system 12000 is provided with a plurality of electronic control units connected to one another via a communication network 12001. In the example illustrated in FIG. 55, the vehicle control system 12000 is provided with a drive system control unit 12010, a body system control unit 12020, a vehicle exterior information detecting unit 12030, a vehicle interior information detecting unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices regarding a drive system of a vehicle according to various programs. For example, the drive system control unit 12010 serves as a control device of a driving force generating device for generating driving force of the vehicle such as an internal combustion engine and a driving motor, a driving force transmitting mechanism for transmitting the driving force to wheels, a steering mechanism for adjusting a rudder angle of the vehicle, a braking device for generating braking force of the vehicle and the like.

The body system control unit 12020 controls operation of various devices mounted on a vehicle body according to the various programs. For example, the body system control unit 12020 serves as a control device of a keyless entry system, a smart key system, a power window device, or various types of lights such as a head light, a backing light, a brake light, a blinker, or a fog light. In this case, a radio wave transmitted from a portable device that substitutes for a key or signals of various switches may be input to the body system control unit 12020. The body system control unit 12020 receives an input of the radio wave or signals and controls a door lock device, the power window device, the lights and the like of the vehicle.

The vehicle exterior information detecting unit 12030 detects information outside the vehicle on which the vehicle control system 12000 is mounted. For example, an imaging unit 12031 is connected to the vehicle exterior information detecting unit 12030. The vehicle exterior information detecting unit 12030 allows the imaging unit 12031 to take an image of the exterior of the vehicle and receives the taken image. The vehicle exterior information detecting unit 12030 may perform detection processing of objects such as a person, a vehicle, an obstacle, a sign, and a character on a road surface or distance detection processing on the basis of the received image.

The imaging unit 12031 is an optical sensor that receives light and outputs an electric signal corresponding to an amount of the received light. The imaging unit 12031 may output the electric signal as the image or output the same as ranging information. Furthermore, the light received by the imaging unit 12031 may be visible light or invisible light such as infrared light.

The vehicle interior information detecting unit 12040 detects information in the vehicle. The vehicle interior information detecting unit 12040 is connected to, for example, a driver state detecting unit 12041 for detecting a state of a driver. The driver state detecting unit 12041 includes, for example, a camera that images the driver, and the vehicle interior information detecting unit 12040 may calculate a driver's fatigue level or concentration level or may determine whether the driver is not dozing on the basis of detection information input from the driver state detecting unit 12041.

The microcomputer 12051 may calculate a control target value of the driving force generating device, the steering mechanism or the braking device on the basis of the information inside and outside the vehicle obtained by the vehicle exterior information detecting unit 12030 or the vehicle interior information detecting unit 12040, and output a control instruction to the drive system control unit 12010. For example, the microcomputer 12051 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning or the like.

Furthermore, the microcomputer 12051 may perform the cooperative control for realizing automatic driving and the like to autonomously travel independent from the operation of the driver by controlling the driving force generating device, the steering mechanism, the braking device or the like on the basis of the information around the vehicle obtained by the vehicle exterior information detecting unit 12030 or the vehicle interior information detecting unit 12040.

Furthermore, the microcomputer 12051 may output the control instruction to the body system control unit 12030 on the basis of the information outside the vehicle obtained by the vehicle exterior information detecting unit 12030. For example, the microcomputer 12051 may perform the cooperative control to realize glare protection such as controlling the head light according to a position of a preceding vehicle or an oncoming vehicle detected by the vehicle exterior information detecting unit 12030 to switch a high beam to a low beam.

The audio image output unit 12052 transmits at least one of audio or image output signal to an output device capable of visually or audibly notifying an occupant of the vehicle or the outside the vehicle of the information. In the example in FIG. 55, as the output device, an audio speaker 12061, a display unit 12062, and an instrument panel 12063 are illustrated. The display unit 12062 may include at least one of an on-board display or a head-up display, for example.

Figure 56:
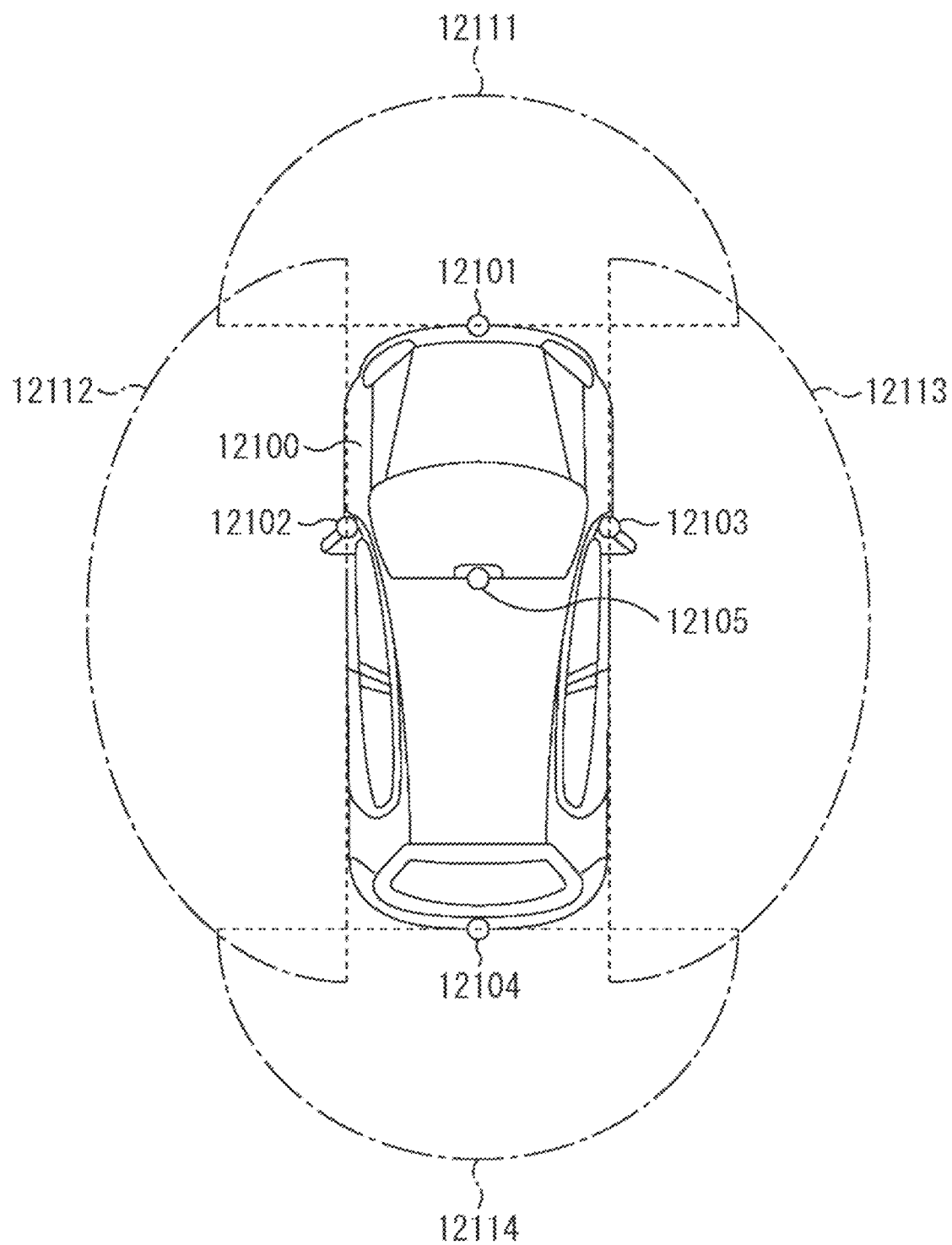
FIG. 56 is an illustrative view illustrating an example of installation positions of a vehicle exterior information detecting unit and an imaging unit.

FIG. 56 is a view illustrating an example of an installation position of the imaging unit 12031.

In FIG. 56, imaging units 12101, 12102, 12103, 12104, and 12105 are included as the imaging unit 12031.

The imaging units 12101, 12102, 12103, 12104, and 12105 are provided in positions such as, for example, a front nose, a side mirror, a rear bumper, a rear door, and an upper portion of a front windshield in a vehicle interior of the vehicle 12100. The imaging unit 12101 provided on the front nose and the imaging unit 12105 provided in the upper portion of the front windshield in the vehicle interior principally obtain images in front of the vehicle 12100. The imaging units 12102 and 12103 provided on the side mirrors principally obtain images of the sides of the vehicle 12100. The imaging unit 12104 provided on the rear bumper or the rear door principally obtains an image behind the vehicle 12100. The imaging unit 12105 provided on the upper portion of the front windshield in the vehicle interior is mainly used for detecting the preceding vehicle, a pedestrian, an obstacle, a traffic signal, a traffic sign, a lane or the like.

Note that, in FIG. 56, an example of imaging ranges of the imaging units 12101 to 12104 is illustrated. An imaging range 12111 indicates the imaging range of the imaging unit 12101 provided on the front nose, imaging ranges 12112 and 12113 indicate the imaging ranges of the imaging units 12102 and 12103 provided on the side mirrors, and an imaging range 12114 indicates the imaging range of the imaging unit 12104 provided on the rear bumper or the rear door. For example, image data taken by the imaging units 12101 to 12104 are superimposed, so that an overlooking image of the vehicle 12100 as seen from above is obtained.

At least one of the imaging units 12101 to 12104 may have a function of obtaining distance information. For example, at least one of the imaging units 12101 to 12104 may be a stereo camera including a plurality of imaging elements, or may be an imaging element including pixels for phase difference detection.

For example, the microcomputer 12051 may extract especially a closest solid object on a traveling path of the vehicle 12100, the solid object traveling at a predetermined speed (for example, 0 km/h or higher) in a direction substantially the same as that of the vehicle 12100 as the preceding vehicle by obtaining a distance to each solid object in the imaging ranges 12111 to 12114 and change in time of the distance (relative speed relative to the vehicle 12100) on the basis of the distance information obtained from the imaging units 12101 to 12104. Moreover, the microcomputer 12051 may set the distance between the vehicles to be secured in advance from the preceding vehicle, and may perform automatic brake control (including following stop control), automatic acceleration control (including following start control) and the like. In this manner, it is possible to perform the cooperative control for realizing the automatic driving or the like to autonomously travel independent from the operation of the driver.

For example, the microcomputer 12051 may extract solid object data regarding the solid object while sorting the same into a motorcycle, a standard vehicle, a large-sized vehicle, a pedestrian, and other solid objects such as a utility pole on the basis of the distance information obtained from the imaging units 12101 to 12104 and use for automatically avoiding obstacles. For example, the microcomputer 12051 discriminates the obstacles around the vehicle 12100 into an obstacle visible to a driver of the vehicle 12100 and an obstacle difficult to see. Then, the microcomputer 12051 determines a collision risk indicating a degree of risk of collision with each obstacle, and when the collision risk is equal to or higher than a set value and there is a possibility of collision, this may perform driving assistance for avoiding the collision by outputting an alarm to the driver via the audio speaker 12061 and the display unit 12062 or performing forced deceleration or avoidance steering via the drive system control unit 12010.

At least one of the imaging units 12101 to 12104 may be an infrared camera for detecting infrared rays. For example, the microcomputer 12051 may recognize a pedestrian by determining whether or not there is a pedestrian in the images taken by the imaging units 12101 to 12104. Such pedestrian recognition is carried out, for example, by a procedure of extracting feature points in the images taken by the imaging units 12101 to 12104 as the infrared cameras and a procedure of performing pattern matching processing on a series of feature points indicating an outline of an object to discriminate whether or not this is a pedestrian. When the microcomputer 12051 determines that there is a pedestrian in the images taken by the imaging units 12101 to 12104 and recognizes the pedestrian, the audio image output unit 12052 controls the display unit 12062 to superimpose a rectangular contour for emphasis on the recognized pedestrian. Furthermore, the audio image output unit 12052 may control the display unit 12062 to display an icon or the like indicating the pedestrian at a desired position.

An example of the vehicle control system to which the technology according to the present disclosure may be applied is described above. Among the configurations described above, the CMOS image sensors 10b to 10r of the technology according to the present disclosure may be applied to the imaging unit 12031 in FIG. 55. With this arrangement, for example, in a case where at least one of the imaging units 12101, 12102, 120103, or 12104 in FIG. 56 is the infrared camera, the sensitivity of the infrared camera is improved, and detection accuracy of pedestrians and the like may be improved.

Note that, the embodiments of the present technology are not limited to the above-described embodiments and various modifications may be made without departing from the scope of the present technology.

<Combination Example of Configurations>

Furthermore, the present technology may also have following configurations, for example.

(1)

An imaging element provided with:

a semiconductor substrate on which a photoelectric converting unit is formed;

a wiring layer arranged on a side opposite to a light receiving surface of the semiconductor substrate, and provided with a wire and a reflective film; and an insulating film stacked between the semiconductor substrate and the wiring layer, in which the reflective film is arranged between the insulating film and the wire and overlaps with at least a part of the photoelectric converting unit of each pixel in a first direction in which the semiconductor substrate and the wiring layer are stacked, and a first interlayer film between the insulating film and the reflective film is thicker than the insulating film.

(2)

The imaging element according to (1) described above, in which a thickness of the first interlayer film is in a range of 80 nm to 200 nm, and a thickness of the reflective film is in a range of 40 nm to 80 nm.

(3)

The imaging element according to (1) or (2) described above, in which, when a center wavelength of light reflected by the reflective film is set to $\lambda$, a refractive index of the first interlayer film is set to $n_A$, a refractive index of the reflective film is set to $n_B$, and i and j are integers of 0 or larger, the thickness of the first interlayer film is set in the vicinity of $(2i+1)\lambda/4n_A$, and the thickness of the reflective film is set in the vicinity of $(2j+1)\lambda/4n_B$.

(4)

The imaging element according to any one of (1) to (3) described above, in which the first interlayer film includes a silicon oxide film or a silicon nitride film as a main component, and the reflective film includes polysilicon, amorphous silicon, or single crystal silicon as a main component.

(5)

The imaging element according to (1) described above, in which two or more reflective films are stacked through a second interlayer film.

(6)

The imaging element according to (5) described above, in which a thickness of the first and second interlayer films is in a range of 100 nm to 200 nm, and a thickness of the reflective film is in a range of 80 nm to 100 nm.

(7)

The imaging element according to (5) or (6) described above, in which, when a center wavelength of light reflected by the reflective film is set to $\lambda$, a refractive index of the first interlayer film and the second interlayer film is set to $n_A$, a refractive index of the reflective film is set to $n_B$, and i and j are integers of 1 or larger, the thickness of the first and second interlayer films is set in the vicinity of $(\lambda \times i)/4n_A$, and the thickness of the reflective film is set in the vicinity of $(\lambda \times j)/4n_B$.

(8)

The imaging element according to any one of (5) to (7) described above, in which the first and second interlayer films include silicon oxide, silicon nitride, TiO2, or HfO2 as a main component, and the reflective film includes polysilicon, amorphous silicon, single crystal silicon, TaO, TfO, silicon nitride, Ge, SiC, TiN, Ti, TiO2, or NgF2 as a main component.

(9)

The imaging element according to any one of (1) to (8) described above, in which the reflective film is arranged in a position not overlapping with a gate electrode of a transistor formed on a surface on a side opposite to the light receiving surface of the semiconductor substrate in the first direction.

(10)

The imaging element according to any one of (1) to (9) described above, in which at least one of a shape, a size, or a position of the reflective film is different for each pixel.

(11)

The imaging element according to (10) described above, in which at least one of the shape, the size, or the position of the reflective film is adjusted corresponding to pupil correction.

(12)

The imaging element according to any one of (1) to (11) described above, in which the reflective film is shared by a plurality of pixels.

(13)

The imaging element according to any one of (1) to (12) described above, in which irregularities are formed on a surface of the reflective film.

(14)

The imaging element according to any one of (1) to (13) described above, in which a trench-shaped pixel separating unit is formed between pixels on the semiconductor substrate, and a core is formed at a center of the pixel separating unit.

(15)

The imaging element according to (14) described above, in which the core includes polysilicon, amorphous silicon, or single crystal silicon as a main component, and the core is covered with a dielectric material including silicon oxide or silicon nitride as a main component.

(16)

The imaging element according to (15) described above, in which a thickness of the core in a second direction in which the pixels are adjacent is in a range of 50 nm to 200 nm, and a thickness of the dielectric material around the core in the second direction is in a range of 50 nm to 200 nm.

(17)

The imaging element according to any one of (1) to (16) described above, in which an antireflective film is stacked on the light receiving surface of the semiconductor substrate, and when a center wavelength of light for which a reflection rate of the antireflective film is lowered is set to $\lambda$ and a refractive index of the antireflective film is set to n, a thickness of the antireflective film is set in the vicinity of $\lambda/4n$.

(18)

The imaging element according to any one of (1) to (17) described above, in which a diffraction structure is formed on the light receiving surface of the semiconductor substrate.

(19)

The imaging element according to any one of (1) to (18) described above, in which a center wavelength of light reflected by the reflective film is 700 nm or longer.

(20)

An electronic device, provided with:

an imaging element; and a signal processing unit which processes a signal output from the imaging element, the imaging element including:

a semiconductor substrate on which a photoelectric converting unit is formed;

a wiring layer arranged on a side opposite to a light receiving surface of the semiconductor substrate, and provided with a wire and a reflective film; and an insulating film stacked between the semiconductor substrate and the wiring layer, in which the reflective film is arranged between the insulating film and the wire and overlaps with at least a part of the photoelectric converting unit of each pixel in a first direction in which the semiconductor substrate and the wiring layer are stacked, and a first interlayer film between the insulating film and the reflective film is thicker than the insulating film.

REFERENCE SIGNS LIST

10, 10a to 10r CMOS image sensor
12 Pixel array unit
21 Color filter array
22 On-chip lens array
70 Unit pixel
71 Photodiode
72 Transfer transistor
73 Reset transistor
74 Amplification transistor
75 Selection transistor
76 FD unit
101 Wiring layer
102 Gate insulating film
103 Light absorbing layer
104 Antireflective film
105 Interlayer insulating film
106 Metal wire
107 Element separating unit
108 Light shielding film
301 Core
400 Electronic device
403 Imaging element
404 Signal processing unit
430 Portable information terminal
433, 435 Camera
2000 Vehicle control system
2410, 2910, 2912, 2914, 2916, 2918 Imaging unit
PD1 to PD8 Photodiode
TR1 to TR4 Pixel transistor
TG1 to TG8 Transfer transistor
RM1 to RM8, RM11, RM12, RM21, RM22, RM31, RM41a to RM42c Reflective film

The invention claimed is:

1. An imaging element comprising:
   a semiconductor substrate on which a photoelectric converting unit is formed;
   a wiring layer arranged on a side opposite to a light receiving surface of the semiconductor substrate, and provided with a wire and a reflective film; and
   an insulating film stacked between the semiconductor substrate and the wiring layer,
   wherein the reflective film is arranged between the insulating film and the wire and overlaps with at least a part of the photoelectric converting unit of each pixel in a first direction in which the semiconductor substrate and the wiring layer are stacked,
   wherein a first interlayer film between the insulating film and the reflective film is thicker than the insulating film, and
   wherein, when a center wavelength of light reflected by the reflective film is set to $\lambda$, a refractive index of the first interlayer film is set to $n_A$, a refractive index of the reflective film is set to $n_B$, and i and j are integers of 0 or larger, a thickness of the first interlayer film is set in a vicinity of $(2i+1)\lambda/4n_A$, and a thickness of the reflective film is set in a vicinity of $(2j+1)\lambda/4n_B$.

2. The imaging element according to claim 1,
   wherein a thickness of the first interlayer film is in a range of 80 nm to 200 nm, and
   a thickness of the reflective film is in a range of 40 nm to 80 nm.

3. The imaging element according to claim 1,
   wherein the first interlayer film includes a silicon oxide film or a silicon nitride film as a main component, and
   the reflective film includes polysilicon, amorphous silicon, or single crystal silicon as a main component.

4. The imaging element according to claim 1,
   wherein two or more reflective films are stacked through a second interlayer film.

5. The imaging element according to claim 4,
   wherein a thickness of the first and second interlayer films is in a range of 100 nm to 200 nm, and
   a thickness of at least one of the two or more reflective films is in a range of 80 nm to 100 nm.

6. The imaging element according to claim 4,
   wherein the first and second interlayer films include silicon oxide, silicon nitride, or $TiO_2$ as a main component, and
   at least one of the reflective films includes polysilicon, amorphous silicon, single crystal silicon, TaO, silicon nitride, Ge, SiC, TiN, Ti, or $TiO_2$ as a main component.

7. The imaging element according to claim 1,
   wherein the reflective film is arranged in a position not overlapping with a gate electrode of a transistor formed on a surface on a side opposite to the light receiving surface of the semiconductor substrate in the first direction.

8. The imaging element according to claim 1,
   wherein at least one of a shape, a size, or a position of the reflective film is different for each pixel.

9. The imaging element according to claim 8,
   wherein at least one of the shape, the size, or the position of the reflective film is adjusted corresponding to pupil correction.

10. The imaging element according to claim 1,
    wherein the reflective film is shared by a plurality of pixels.

11. The imaging element according to claim 1,
    wherein irregularities are formed on a surface of the reflective film.

12. The imaging element according to claim 1,
    wherein a trench-shaped pixel separating unit is formed between pixels on the semiconductor substrate, and
    a core is formed at a center of the trench-shaped pixel separating unit.

13. The imaging element according to claim 12,
    wherein the core includes polysilicon, amorphous silicon, or single crystal silicon as a main component, and
    the core is covered with a dielectric material including silicon oxide or silicon nitride as a main component.

14. The imaging element according to claim 13,
    wherein a thickness of the core in a second direction in which the pixels are adjacent is in a range of 50 nm to 200 nm, and
    a thickness of the dielectric material around the core in the second direction is in a range of 50 nm to 200 nm.

15. The imaging element according to claim 1,
    wherein an antireflective film is stacked on the light receiving surface of the semiconductor substrate, and
    when a second center wavelength of light for which a reflection rate of the antireflective film is lowered is set to $\lambda$ and a refractive index of the antireflective film is set to n, a thickness of the antireflective film is set in a vicinity of $\lambda/4n$.

16. The imaging element according to claim 1,
    wherein a diffraction structure is formed on the light receiving surface of the semiconductor substrate.

17. The imaging element according to claim 1,
    wherein the center wavelength of light reflected by the reflective film is 700 nm or longer.

18. An electronic device, comprising:
    an imaging element; and
    a signal processing unit which processes a signal output from the imaging element, the imaging element including:
       a semiconductor substrate on which a photoelectric converting unit is formed;
       a wiring layer arranged on a side opposite to a light receiving surface of the semiconductor substrate, and provided with a wire and a reflective film; and
       an insulating film stacked between the semiconductor substrate and the wiring layer,
       wherein the reflective film is arranged between the insulating film and the wire and overlaps with at least a part of the photoelectric converting unit of each pixel in a first direction in which the semiconductor substrate and the wiring layer are stacked, and
       a first interlayer film between the insulating film and the reflective film is thicker than the insulating film,
       wherein, when a center wavelength of light reflected by the reflective film is set to $\lambda$, a refractive index of the first interlayer film is set to $n_A$, a refractive index of the reflective film is set to $n_B$, and i and j are integers of 0 or larger, a thickness of the first interlayer film is set in a vicinity of $(2i+1)\lambda/4n_A$, and a thickness of the reflective film is set in a vicinity of $(2j+1)\lambda/4n_B$.

* * * * *